US012813142B2

(12) United States Patent
Park et al.

(10) Patent No.: US 12,813,142 B2
(45) Date of Patent: Nov. 24, 2026

(54) DISPLAY DEVICE

(71) Applicant: Samsung Display Co., LTD., Yongin-si (KR)

(72) Inventors: Keun Woo Park, Yongin-si (KR); Joung Keun Park, Yongin-si (KR); Joo Hwan Park, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 455 days.

(21) Appl. No.: 18/496,271

(22) Filed: Oct. 27, 2023

(65) Prior Publication Data

US 2024/0244934 A1 Jul. 18, 2024

(30) Foreign Application Priority Data

Jan. 16, 2023 (KR) ........................ 10-2023-0005932

(51) Int. Cl.
*H10K 59/80* (2023.01)
*H10K 59/122* (2023.01)
*H10K 59/35* (2023.01)

(52) U.S. Cl.
CPC ......... *H10K 59/875* (2023.02); *H10K 59/122* (2023.02); *H10K 59/35* (2023.02); *H10K 59/873* (2023.02)

(58) Field of Classification Search
CPC .... H10K 59/875; H10K 59/122; H10K 59/35; H10K 59/873
USPC .......................................................... 313/500
See application file for complete search history.

(56) References Cited

U.S. PATENT DOCUMENTS 10,466,530 B2 11/2019 Lee et al.
10,942,389 B2 3/2021 Lee et al.
11,177,418 B2 11/2021 Kim et al.
11,355,558 B2 6/2022 Park et al.
11,910,685 B2 2/2024 Lee
(Continued)

FOREIGN PATENT DOCUMENTS

KR 20190016631 A 2/2019
KR 20200042058 A 4/2020
(Continued)

OTHER PUBLICATIONS

Espacenet Patent Search Complete (Global Dossier) (Year: 2019).*

*Primary Examiner* — Elmito Breval
*Assistant Examiner* — Hana S Featherly
(74) *Attorney, Agent, or Firm* — CANTOR COLBURN LLP

(57) ABSTRACT

A display device includes a first base portion including a first emission area and a non-emission area, a first light emitting element on the first base portion, a thin film encapsulation layer on the first light emitting element, a filler on the thin film encapsulation layer, a second base portion on the filler, a first color filter on the second base portion, a bank pattern layer on the first color filter and a first wavelength conversion pattern layer on the first color filter. The bank pattern layer includes a first portion and a second portion, the first wavelength conversion pattern layer is between the first portion and the second portion of the bank pattern layer, the first wavelength conversion pattern layer and the bank pattern layer are spaced apart from each other with a separation space therebetween, and the filler is in the separation space.

20 Claims, 29 Drawing Sheets

(56) References Cited

U.S. PATENT DOCUMENTS

| | | | | |
|---|---|---|---|---|
| 12,089,467 | B2 | 9/2024 | Kim et al. | |
| 12,575,283 | B2 | 3/2026 | Park et al. | |
| 2008/0055515 | A1 | 3/2008 | Ha et al. | |
| 2019/0025634 | A1* | 1/2019 | Park | G02F 1/133377 |
| 2020/0135811 | A1* | 4/2020 | Jung | G02B 1/10 |
| 2021/0341653 | A1 | 11/2021 | Wang et al. | |
| 2022/0285447 | A1 | 9/2022 | Park et al. | |

FOREIGN PATENT DOCUMENTS

| | | | |
|---|---|---|---|
| KR | 20210142038 | A | 11/2021 |
| KR | 10-2022-0010681 | | 1/2022 |
| KR | 10-2022-0021067 | | 2/2022 |
| KR | 20220060067 | A | 5/2022 |
| KR | 20220110409 | A | 8/2022 |

* cited by examiner

DISPLAY DEVICE

CROSS-REFERENCE TO RELATED APPLICATION(S)

This application claims priority to and benefits of Korean Patent Application No. 10-2023-0005932 under 35 U.S.C. § 119, filed on Jan. 16, 2023, the entire contents of which are incorporated herein by reference.

BACKGROUND

1. Technical Field

Embodiments relate to a display device.

2. Description of the Related Art

The importance of display devices has steadily increased with the development of multimedia technology. Accordingly, various types of display devices such as a liquid crystal display (LCD) device, an organic light emitting diode (OLED) display device and the like have been developed.

Among the display devices, a self-light emitting display device includes a self-light emitting element such as an organic light emitting element. The self-light emitting element may include two opposite electrodes and a light emitting layer interposed therebetween. In the case of using the organic light emitting element as the self-light emitting element, the electrons and holes from the two electrodes are recombined in the light emitting layer to emit light by producing excitons, which transition from the excited state to the ground state.

The self-light emitting display device is attracting attention as a next-generation display device because of being able to meet the high display quality requirements such as wide viewing angle, high brightness and contrast, and quick response speed as well as being able to be made having a low power consumption, lightweight, and thin due to no necessity of a power source such as a backlight unit.

As a method for allowing each pixel of a display device to uniquely display a basic color, each pixel may be separated by a light blocking pattern layer, and a color conversion pattern layer or a wavelength conversion pattern layer may be arranged for each pixel on an optical path from a blue light source to a viewer.

However, since a higher resolution product has a smaller pixel size, light loss due to the light blocking pattern layer increases. In case that light from a blue light source of a lower substrate passes through a wavelength conversion pattern layer of an upper substrate to be converted into red and green colors, light loss occurs.

SUMMARY

Embodiments provide a display device capable of improving light efficiency.

However, aspects of the disclosure are not restricted to the one set forth herein. The above and other aspects of the disclosure will become more apparent to one of ordinary skill in the art to which the disclosure pertains by referencing the detailed description of the disclosure given below.

In an embodiment, a display device may include: a first base portion including a first emission area and a non-emission area, a first light emitting element disposed on the first base portion and overlapping the first emission area, a thin film encapsulation layer disposed on the first light emitting element, a filler disposed on the thin film encapsulation layer, a second base portion disposed on the filler, a first color filter disposed on a surface of the second base portion facing the first base portion and overlapping the first emission area, a bank pattern layer disposed on the first color filter and overlapping the non-emission area and a first wavelength conversion pattern layer disposed on the first color filter and overlapping the first emission area, wherein the bank pattern layer may include a first portion and a second portion facing each other along a first direction, the first wavelength conversion pattern layer may be disposed between the first portion and the second portion of the bank pattern layer, a side surface of the first wavelength conversion pattern layer and a side surface of the bank pattern layer may be spaced apart from each other along the first direction with a separation space between the first wavelength conversion pattern layer and the bank pattern layer, and the filler may be disposed in the separation space.

A height of the bank pattern layer measured with respect to the surface of the second base portion may be greater than a height of the first wavelength conversion pattern layer measured with respect to the surface of the second base portion, a first width of the first wavelength conversion pattern layer measured along the first direction may be smaller than a width of the first emission area measured along the first direction, and the first width of the first wavelength conversion pattern layer may be smaller than a width of the first color filter measured along the first direction.

The display device may further include a capping layer covering the first wavelength conversion pattern layer and the bank pattern layer, wherein the filler may be disposed between the capping layer covering the side surface of the first wavelength conversion pattern layer and the capping layer covering the side surface of the bank pattern layer.

The second base portion may include a low refractive layer disposed on the first color filter and a low refractive capping layer disposed on the low refractive layer.

The first wavelength conversion pattern layer and the bank pattern layer may be disposed directly on the low refractive capping layer, and the low refractive capping layer and the capping layer may be in direct contact with each other in the separation space.

The separation space may be disposed between the first portion of the bank pattern layer and the first wavelength conversion pattern layer and between the second portion of the bank pattern layer and the first wavelength conversion pattern layer.

The separation space between the first wavelength conversion pattern layer and the bank pattern layer may overlap the first emission area.

The first light emitting element may include a red light emitting layer, a green light emitting layer overlapping the red light emitting layer, and a blue light emitting layer overlapping the red light emitting layer and the green light emitting layer, and the first wavelength conversion pattern layer may include quantum dots.

The first base portion may further include a second emission area and a third emission area, a second light emitting element disposed on the first base portion and overlapping the second emission area and a third light emitting element overlapping the third emission area, a second color filter disposed on the surface of the second base portion and overlapping the second emission area and a third color filter overlapping the third emission area, a bank pattern layer disposed on the second color filter and the third color filter and overlapping the non-emission area, a second wavelength conversion pattern layer disposed on the second color filter and overlapping the second emission area and a light transmission layer disposed on the third color filter and overlapping the third emission area, wherein the bank pattern layer may include a third portion facing the second portion along the first direction and a fourth portion facing the third portion along the first direction, the second wavelength conversion pattern layer may be disposed between the second portion and the third portion of the bank pattern layer, the light transmission layer may be disposed between the third portion and the fourth portion of the bank pattern layer, and the filler may be further disposed in a space between the second wavelength conversion pattern layer and the bank pattern layer.

A height of the bank pattern layer measured with respect to the surface of the second base portion may be greater than heights of the second wavelength conversion pattern layer and the light transmission layer measured with respect to the surface of the second base portion, a second width of the second wavelength conversion pattern layer measured along the first direction may be smaller than a width of the second emission area measured along the first direction, the second width may be smaller than a width of the second color filter measured along the first direction, and a third width of the light transmission layer measured along the first direction may be equal to or smaller than a width of the third emission area measured along the first direction.

The separation space between the bank pattern layer and the first wavelength conversion pattern layer may entirely surround the first wavelength conversion pattern layer in plan view.

The first wavelength conversion pattern layer may be spaced apart from one of the first portion of the bank pattern layer and the second portion of the bank pattern layer, and may be in contact with another one of the first portion of the bank pattern layer and the second portion of the bank pattern layer.

An air layer in which the filler is not disposed may further disposed in the separation space.

The display device may further include a reflection layer disposed on the side surface of the bank pattern layer, wherein a part of the filler disposed in the separation space may be disposed between the side surface of the first wavelength conversion pattern layer and the reflection layer.

In an embodiment, a display device may include a first base portion including a first emission area and a non-emission area, a first light emitting element disposed on the first base portion and overlapping the first emission area, a thin film encapsulation layer disposed on the first light emitting element, a bank pattern layer disposed on the thin film encapsulation layer and overlapping the non-emission area, a first wavelength conversion pattern layer disposed on the thin film encapsulation layer and overlapping the first emission area, a capping layer covering the first wavelength conversion pattern layer and the bank pattern layer, a low refractive layer disposed on the capping layer and a first color filter disposed on the low refractive layer and overlapping the first emission area, wherein the bank pattern layer may include a first portion and a second portion facing each other along a first direction, the first wavelength conversion pattern layer is disposed between the first portion of the bank pattern layer and the second portion of the bank pattern layer, a side surface of the first wavelength conversion pattern layer and a side surface of the bank pattern layer may be spaced apart from each other along the first direction with a separation space between the first wavelength conversion pattern layer and the bank pattern layer, and the low refractive layer may be disposed in the separation space.

A height of the bank pattern layer measured with respect to the surface of the thin film encapsulation layer may be greater than a height of the first wavelength conversion pattern layer measured with respect to the surface of the thin film encapsulation layer, and a first width of the first wavelength conversion pattern layer measured along the first direction may be smaller than a width of the first emission area measured along the first direction and a width of the first color filter measured along the first direction.

The separation space overlaps the first emission area, and in the separation space, the capping layer may be in direct contact with the thin film encapsulation layer and the low refractive layer.

In an embodiment, a display device may include a first base portion including a first emission area and a non-emission area, a first light emitting element disposed on the first base portion and overlapping the first emission area, a thin film encapsulation layer disposed on the first light emitting element, a bank pattern layer disposed on the thin film encapsulation layer and overlapping the non-emission area, a first wavelength conversion pattern layer disposed on the thin film encapsulation layer and overlapping the first emission area, a second base portion disposed on the first wavelength conversion pattern layer, a first color filter disposed on the surface of the second base portion facing the first base portion and overlapping the first emission area and a filler disposed between the first color filter and the first wavelength conversion pattern layer, wherein the bank pattern layer and the first wavelength conversion pattern layer may be spaced apart from each other with a separation space therebetween, and a part of the filler may be disposed in the separation space.

The display device may further include a capping layer covering the first wavelength conversion pattern layer and the bank pattern layer, wherein the capping layer may be in contact with the filler and the thin film encapsulation layer in the separation space.

The display device may further include a low refractive layer disposed on the first color filter and a low refractive capping layer disposed on the low refractive layer, wherein the filler may be in contact with the low refractive capping layer and the capping layer.

According to embodiments, a display device having improved light efficiency may be provided.

However, effects according to the embodiments are not limited to the examples above and various other effects are incorporated herein.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
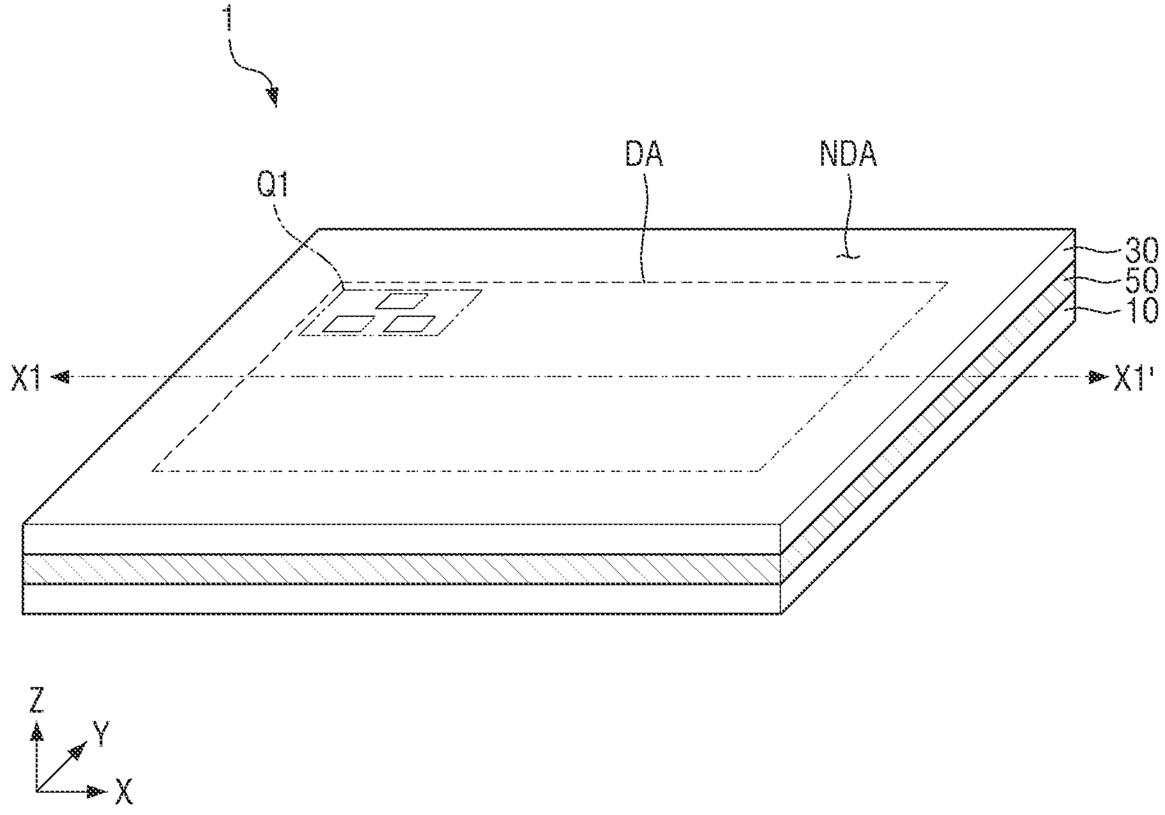
FIG. 1 is a schematic perspective view of a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. In case that an embodiment may be implemented differently, a specific process order may be performed differently from the described order. For example, two consecutively described processes may be performed substantially at the same time or performed in an order opposite to the described order. Also, like reference numerals denote like elements.

In case that an element, such as a layer, is referred to as being "on," "connected to," or "coupled to" another element or layer, it may be directly on, connected to, or coupled to the other element or layer or intervening elements or layers may be present. In case that, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," in case that used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

The invention will now be described more fully hereinafter with reference to the accompanying drawings, in which various embodiments of the invention are shown. This invention may however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

Hereinafter, embodiments will be described in detail with reference to the accompanying drawings.

Figure 2:
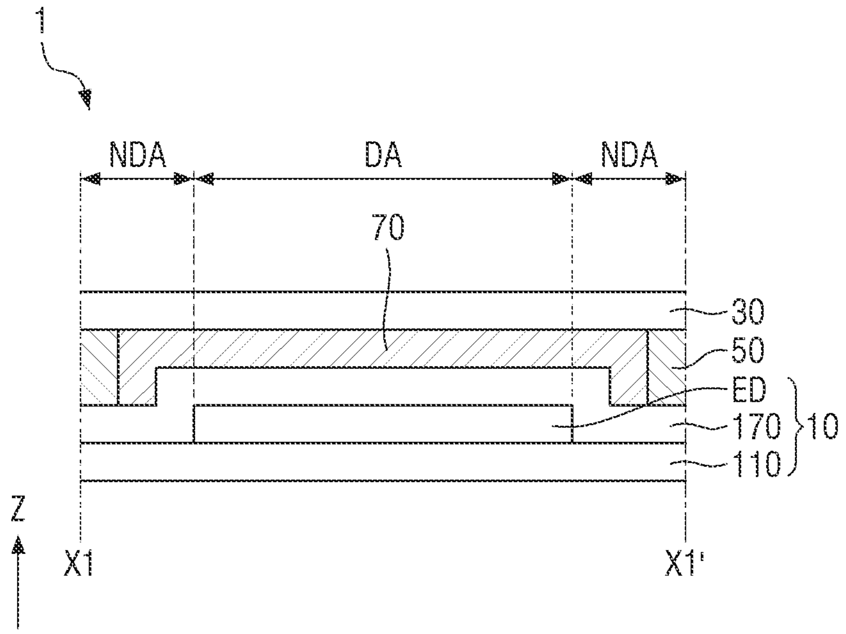
FIG. 2 is a schematic cross-sectional view of a display device 1 according to an embodiment taken along line X1-X1' of FIG. 1.

FIG. 1 is a schematic perspective view of a display device according to an embodiment. FIG. 2 is a schematic cross-sectional view of a display device 1 according to an embodiment taken along line X1-X1' of FIG. 1.

Referring to FIGS. 1 and 2, a display device 1 may be applied to a variety of electronic apparatuses, e.g., small and medium electronic devices such as a tablet PC, a smartphone, a car navigation unit, a camera, a center information display (CID) provided in a vehicle, a wristwatch-type electronic device, a personal digital assistant (PDA), a portable multimedia player (PMP) and a game console, and medium and large electronic devices such as a television, an external billboard, a monitor, a desktop computer integrated with a monitor, and a laptop computer. These are examples, but the display device 1 may also be applied to other electronic devices.

In some embodiments, the display device 1 may have a rectangular shape in plan view. The display device 1 may include two first sides extending in a first direction X and two second sides extending in a second direction Y intersecting the first direction X. A corner where the first side and the second side of the display device 1 meet may have a right angle. However, embodiments are not limited thereto, and the corner may have a curved surface. In some embodiments, the length of the first side and the length of the second side may be different from each other, but embodiments are not limited thereto. The planar shape of the display device 1 is not limited to the example, but may have a circular shape or other shapes.

The display device 1 may include a display area DA displaying an image and a non-display area NDA not displaying an image. In some embodiments, the non-display area NDA may be positioned around the display area DA and may surround the display area DA. An image displayed in the display area DA may be visually recognized by a user in a third direction Z, indicated by an arrow in the drawings, intersecting the first direction X and the second direction Y.

Referring to FIG. 2, the display device 1 may include, as a schematic stacked structure, a display substrate 10 and a color conversion substrate 30 facing the display substrate 10, and may further include a sealing portion 50 for coupling the display substrate 10 and the color conversion substrate 30, and a filler 70 filled between the display substrate 10 and the color conversion substrate 30.

The display substrate 10 may include elements and circuits for displaying an image, for example, a pixel circuit such as a switching element, a pixel defining layer and a self-light emitting element that define an emission area and a non-emission area, which will be described below, in the display area DA. In an embodiment, the self-light emitting element may include at least one of an organic light emitting diode, a quantum dot light emitting diode, an inorganic micro light emitting diode (e.g., micro LED), or an inorganic nano light emitting diode (e.g., nano LED). Hereinafter, for descriptive convenience, a case where the self-light emitting element is an organic light emitting element will be described as an example.

In a schematic stacked structure of the display substrate 10, a light emitting element ED may be disposed on a first base portion 110, a cathode capping layer 160 may be disposed on the light emitting element ED to cover the light emitting element ED, and a thin film encapsulation layer 170 may be disposed on the cathode capping layer 160 to cover the cathode capping layer 160. A specific stacked structure of the display substrate 10 will be described below.

The color conversion substrate 30 may be positioned on the display substrate 10 to face the display substrate 10. In some embodiments, the color conversion substrate 30 may include a color conversion pattern layer for converting the color of incident light. In some embodiments, the color conversion substrate 30 may include at least one of a color filter or a wavelength conversion pattern layer as the color conversion pattern layer. In some embodiments, the color conversion substrate 30 may include both the color filter and the wavelength conversion pattern layer.

The sealing portion 50 may be positioned between the display substrate 10 and the color conversion substrate 30 in the non-display area NDA. The sealing portion 50 may be disposed along edge portions of the display substrate 10 and the color conversion substrate 30 in the non-display area NDA to surround the display area DA in plan view. The display substrate 10 and the color conversion substrate 30 may be bonded to each other through the sealing portion 50.

In some embodiments, the sealing portion 50 may be made of an organic material. For example, the sealing portion 50 may be made of an epoxy-based resin, but embodiments are not limited thereto.

In some embodiments, the sealing portion 50 may be positioned to overlap the thin film encapsulation layer 170 of the display substrate 10. For example, the sealing portion 50 may be positioned between the thin film encapsulation layer 170 and the color conversion substrate 30 in the non-display area NDA. In some embodiments, the sealing portion 50 may be in contact with (e.g., in direct contact with) the thin film encapsulation layer 170.

The filler 70 may be positioned in a space surrounded by the sealing portion 50 between the display substrate 10 and the color conversion substrate 30. The filler 70 may fill the space between the display substrate 10 and the color conversion substrate 30.

In some embodiments, the filler 70 may be made of a material capable of transmitting light. In some embodiments, the filler 70 may be made of an organic material. For example, the filler 70 may be made of a silicon-based organic material, an epoxy-based organic material, or a mixture of a silicon-based organic material and an epoxy-based organic material.

In some embodiments, the filler 70 may be made of a material having an extinction coefficient of substantially zero. There may be a correlation between a refractive index and an extinction coefficient, and as the refractive index decreases, the extinction coefficient may decrease. For example, in case that the refractive index is about 1.7 or less, the extinction coefficient may substantially converge to zero. In some embodiments, the filler 70 may be made of a material having a refractive index of about 1.7 or less, so that it is possible to prevent or minimize light provided from the self-light emitting element from being absorbed with passing through the filler 70. In some embodiments, the filler 70 may be made of an organic material having a refractive index of about 1.4 to about 1.6.

Figure 3:
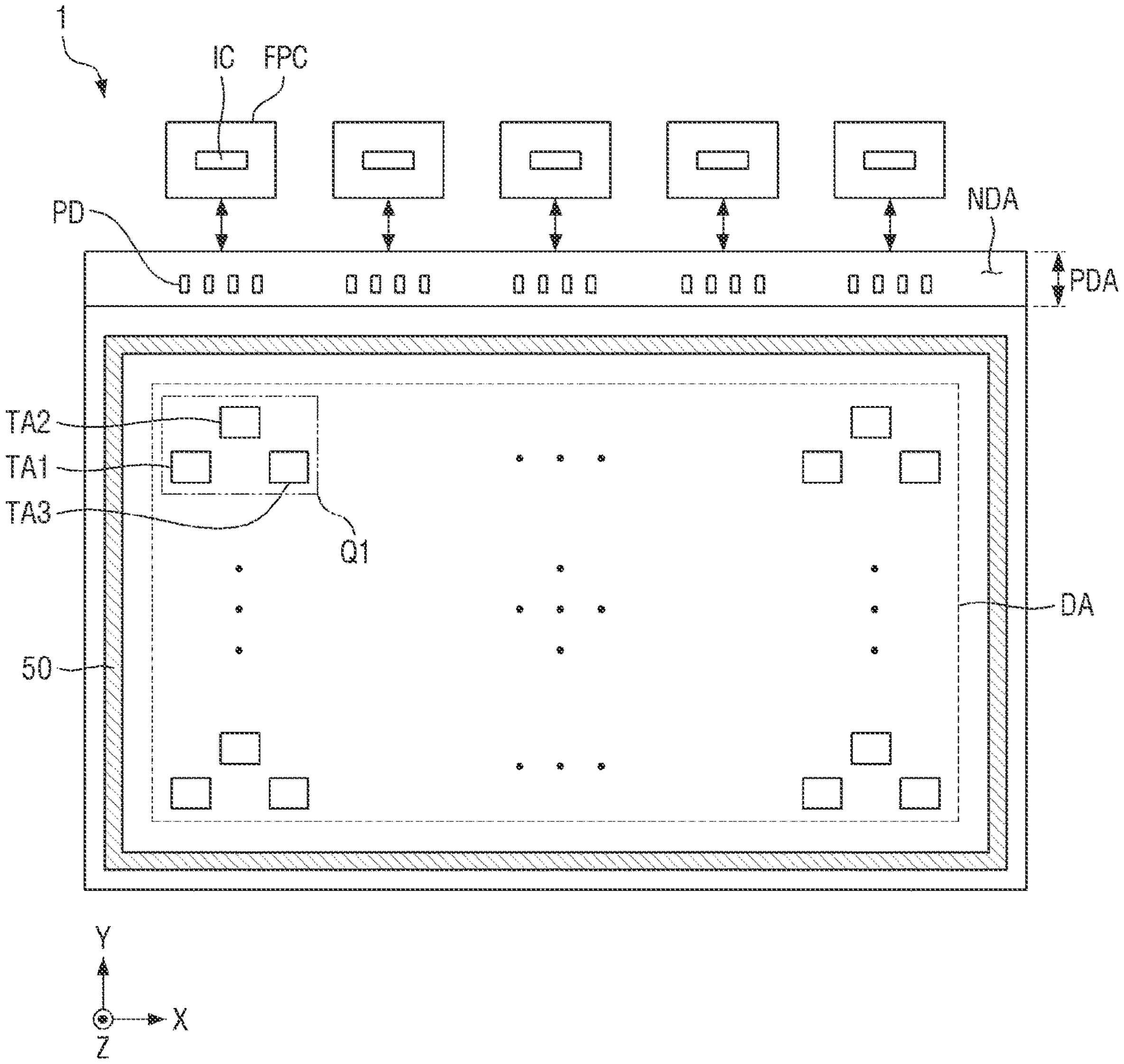
FIG. 3 is a schematic plan view of the display device of FIG. 1.
Figure 4:
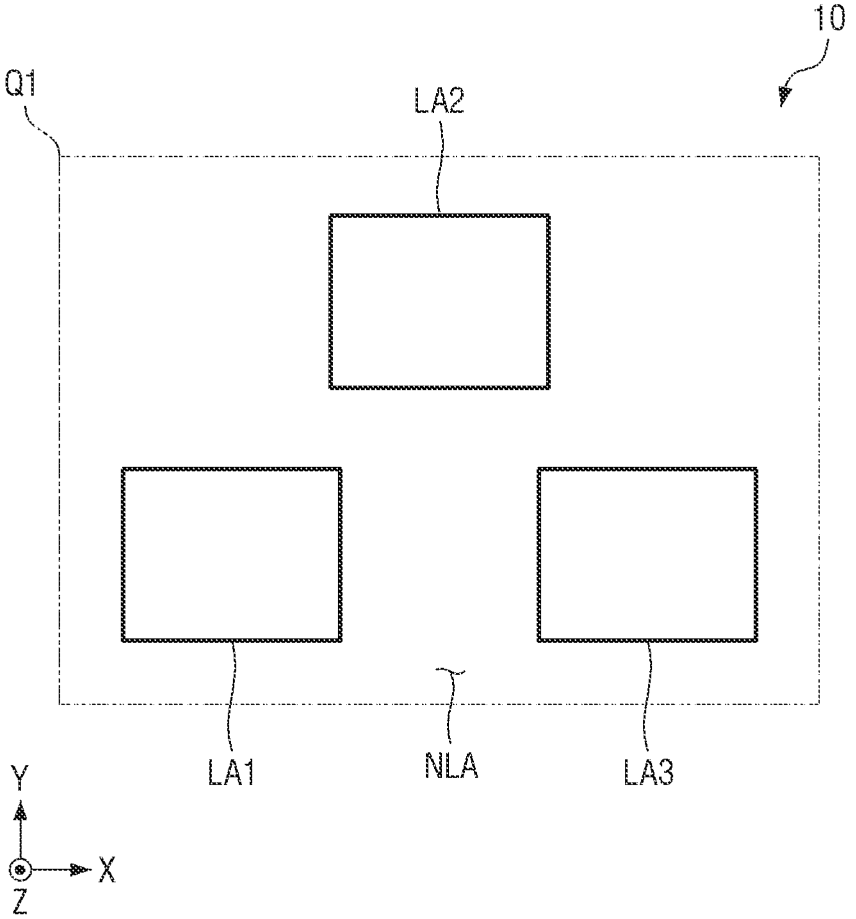
FIG. 4 is an enlarged schematic plan view of a part Q1 of FIG. 3, and is a schematic plan view of the display substrate included in the display device of FIG. 3.
Figure 5:
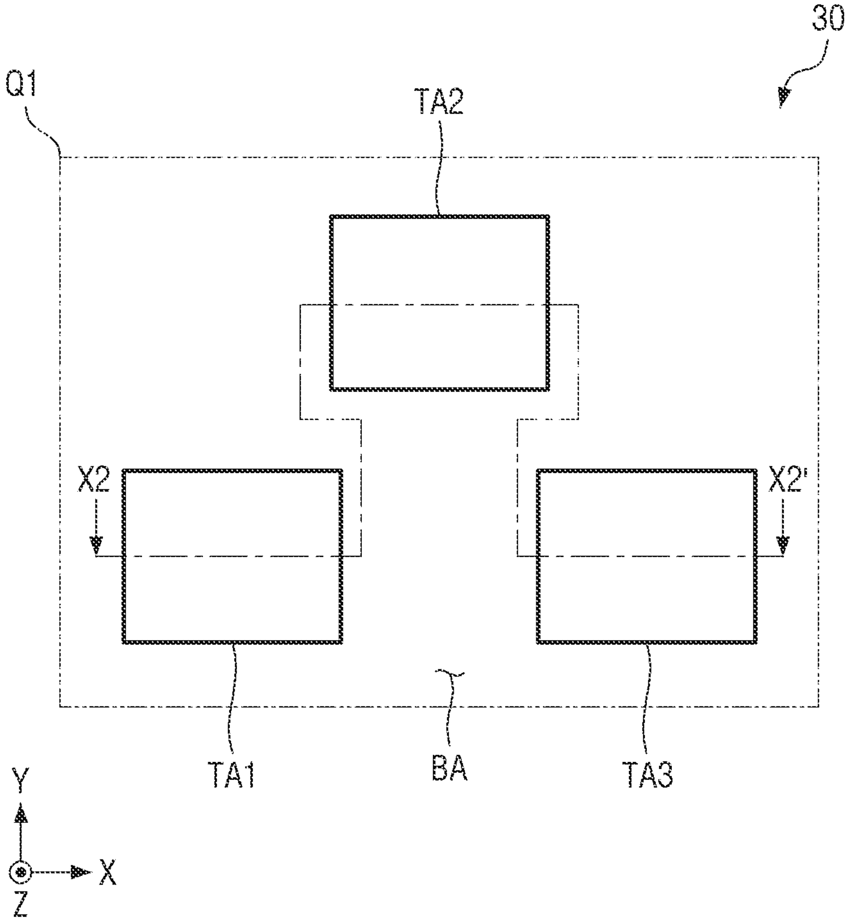
FIG. 5 is an enlarged schematic plan view of a part Q1 of FIG. 3, and is a schematic plan view of the color conversion substrate included in the display device of FIG. 1.
Figure 6:
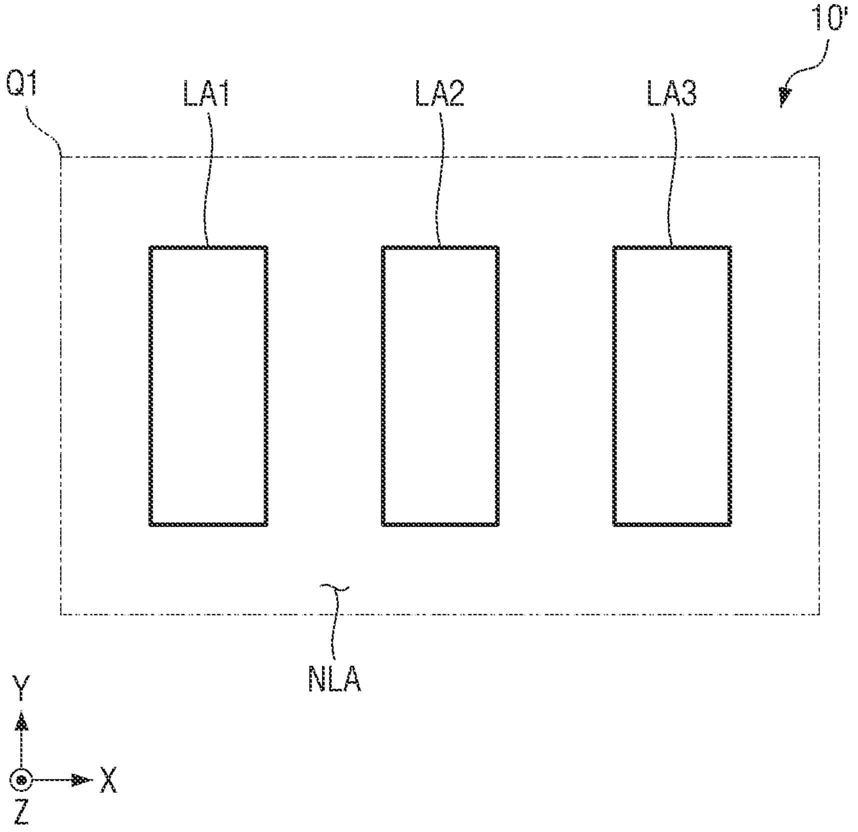
FIG. 6 is a schematic plan view showing a modified example of FIG. 4.
Figure 7:
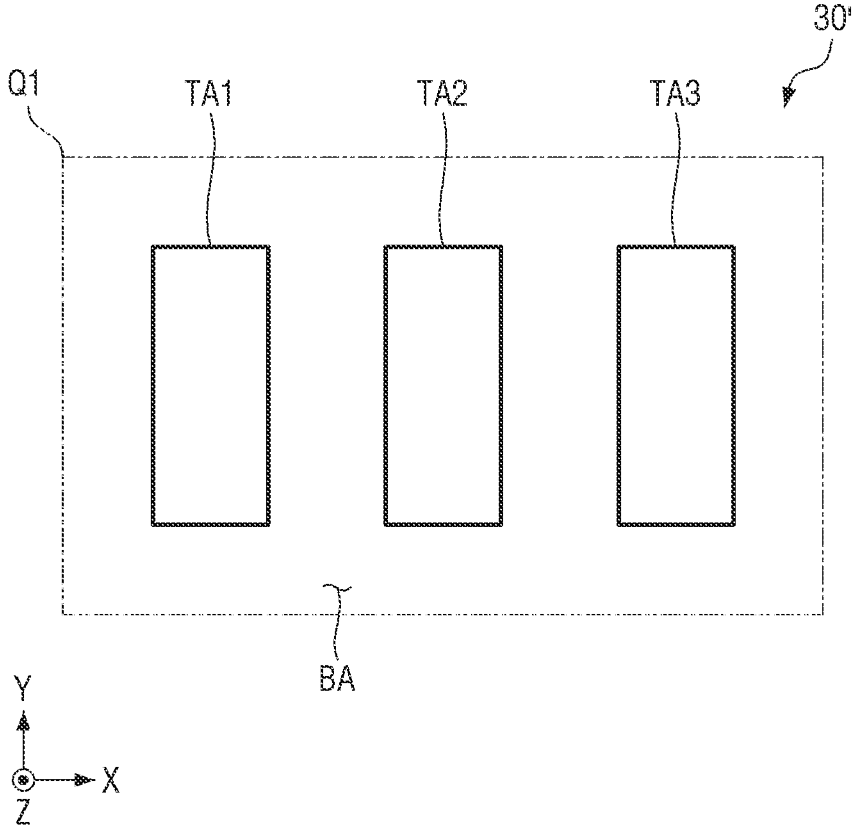
FIG. 7 is a schematic plan view showing a modified example of FIG. 5.

FIG. 3 is a schematic plan view of the display device 1 of FIG. 1. FIG. 4 is an enlarged schematic plan view of a part Q1 of FIG. 3, and is a schematic plan view of the display substrate 10 included in the display device 1 of FIG. 3. FIG. 5 is an enlarged schematic plan view of a part Q1 of FIG. 3, and is a schematic plan view of the color conversion substrate 30 included in the display device 1 of FIG. 3. FIG. 6 is a schematic plan view showing a modified example of FIG. 4 and FIG. 7 is a schematic plan view showing a modified example of FIG. 5.

As shown in FIG. 3, the non-display area NDA of the display device 1 may include a pad area PDA, and pad electrodes PD may be positioned in the pad area PDA.

In some embodiments, the pad electrode PD may be positioned adjacent to the long side of the non-display area NDA, and the pad electrode PD may be electrically connected to a pixel circuit or the like disposed in the display area DA via a connection line or the like. In some embodiments, the display device 1 may further include a flexible circuit board FPC and a driving chip IC.

The display area DA of the display device 1 will be described with reference to FIG. 4.

As shown in FIG. 4, the emission areas LA1, LA2, and LA3 and a non-emission area NLA may be defined on the display substrate 10 in the display area DA.

In some embodiments, a first emission area LA1, a second emission area LA2, and a third emission area LA3 may be defined in the display area DA of the display substrate 10. The first emission area LA1, the second emission area LA2, and the third emission area LA3 may be areas in which light generated by the light emitting element of the display substrate 10 is emitted to the outside of the display substrate 10, and the non-emission area NLA may be an area in which light is not emitted to the outside of the display substrate 10. In some embodiments, the non-emission area NLA may surround each of the first emission area LA1, the second emission area LA2, and the third emission area LA3 in the display area DA.

In some embodiments, emission lights LE having substantially the same wavelength band may be emitted from all emission areas LA1, LA2, and LA3 of the display substrate 10. For example, light emitting elements ED1, ED2, and ED3 of the display substrate 10 may emit the emission light LE including all of a first wavelength band, a second wavelength band, and a third wavelength band. For example, the emission light LE including all of the first wavelength band, the second wavelength band, and the third wavelength band may be white light.

In some embodiments, the first emission area LA1, the second emission area LA2, and the third emission area LA3 may form one group, and a plurality of groups may be defined in the display area DA.

As shown in FIG. 4, the first emission area LA1 and the third emission area LA3 may be adjacent to each other in the first direction X, and the second emission area LA2 may be positioned to a side of the first emission area LA1 and the third emission area LA3 in the second direction Y. However, embodiments are not limited thereto, and the arrangement of the first emission area LA1, the second emission area LA2, and the third emission area LA3 may be variously changed. For example, as shown in FIG. 6, in a display substrate 10', the first emission area LA1, the second emission area LA2, and the third emission area LA3 may be sequentially positioned along the first direction X. In some embodiments, in the display area DA, the first emission area LA1, the second emission area LA2, and the third emission area LA3 may form one group and be repeatedly arranged along the first direction (e.g., X direction) and the second direction (e.g., Y direction).

Hereinafter, a case in which the first emission area LA1, the second emission area LA2, and the third emission area LA3 are arranged as shown in FIG. 4 will be described as an example.

As shown in FIG. 5, light transmitting areas TA1, TA2, and TA3 and a light blocking area BA may be defined on the color conversion substrate 30 in the display area DA. The light transmitting areas TA1, TA2, and TA3 may be regions where light emitted from the display substrate 10 passes through the color conversion substrate 30 and is disposed to the outside of the display device. The light blocking area BA may be a region where light emitted from the display substrate 10 does not transmit.

In some embodiments, a first light transmitting area TA1, a second light transmitting area TA2, and a third light transmitting area TA3 may be defined on the color conversion substrate 30.

The first light transmitting area TA1 may correspond to or overlap the first emission area LA1. For example, the second light transmitting area TA2 may correspond to or overlap the second emission area LA2, and the third light transmitting area TA3 may correspond to or overlap the third emission area LA3.

As shown in FIG. 4, in case that the first emission area LA1 and the third emission area LA3 are adjacent to each other in the first direction X, and the second emission area LA2 is positioned to a side of the first emission area LA1 and the third emission area LA3 in the second direction Y, as shown in FIG. 5, the first light transmitting area TA1 and the third light transmitting area TA3 may be adjacent to each other in the first direction X, and the second light transmitting area TA2 may be positioned to a side of the first light transmitting area TA1 and the third light transmitting area TA3 in the second direction Y.

In some embodiments, as shown in FIG. 6, in case that the first emission area LA1, the second emission area LA2, and the third emission area LA3 are sequentially positioned along the first direction X, as shown in FIG. 7, in a color conversion substrate 30', the first light transmitting area TA1, the second light transmitting area TA2, and the third light transmitting area TA3 may be sequentially positioned along the first direction X.

In some embodiments, each of the first light transmitting area TA1, the second light transmitting area TA2, and the third light transmitting area TA3 may have a quadrilateral shape in plan view. For example, the quadrilateral shape may be a rectangular shape or a square shape. However, embodiments are not limited thereto, and each of the first light transmitting area TA1, the second light transmitting area TA2, and the third light transmitting area TA3 may have a circular shape, an elliptical shape, or another polygonal shape in plan view.

In some embodiments, the emission light LE having the first wavelength band, the second wavelength band, and the third wavelength band provided from the display substrate 10 may be disposed to the outside of the display device 1 through the first light transmitting area TA1, the second light transmitting area TA2, and the third light transmitting area TA3.

Hereinafter, the structure of the display device 1 will be described in more detail.

Figure 8:
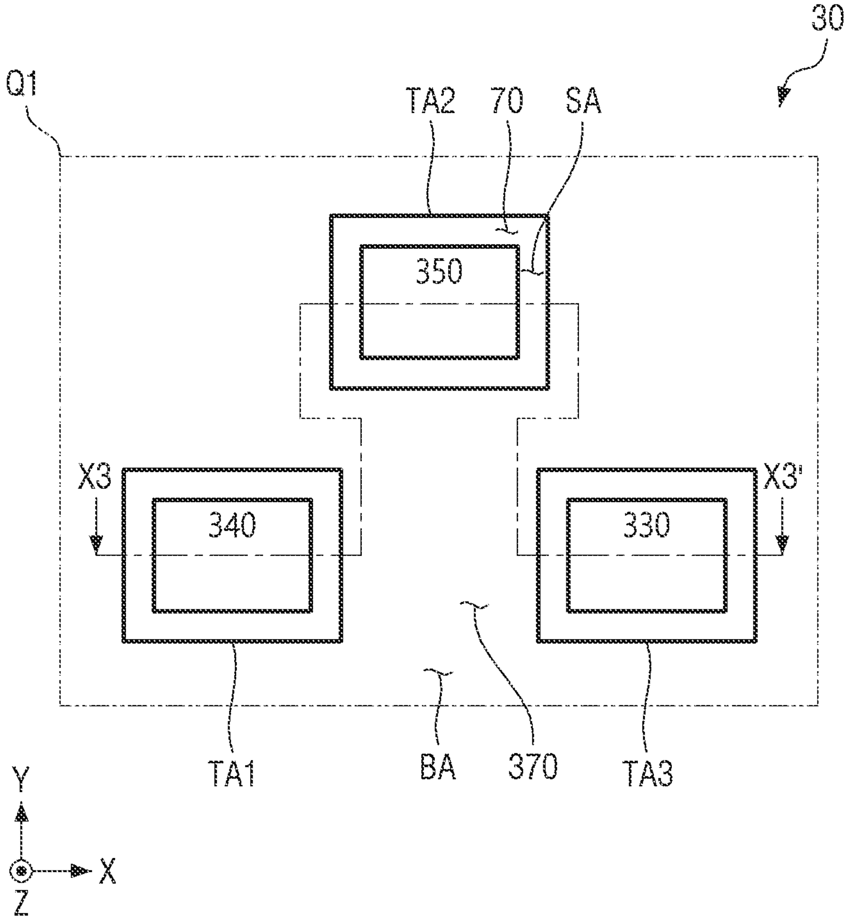
FIG. 8 is an enlarged schematic plan view of a part Q1 of FIG. 3, and is a detailed plan view of a color conversion substrate included in the display device of FIG. 1.
Figure 9:
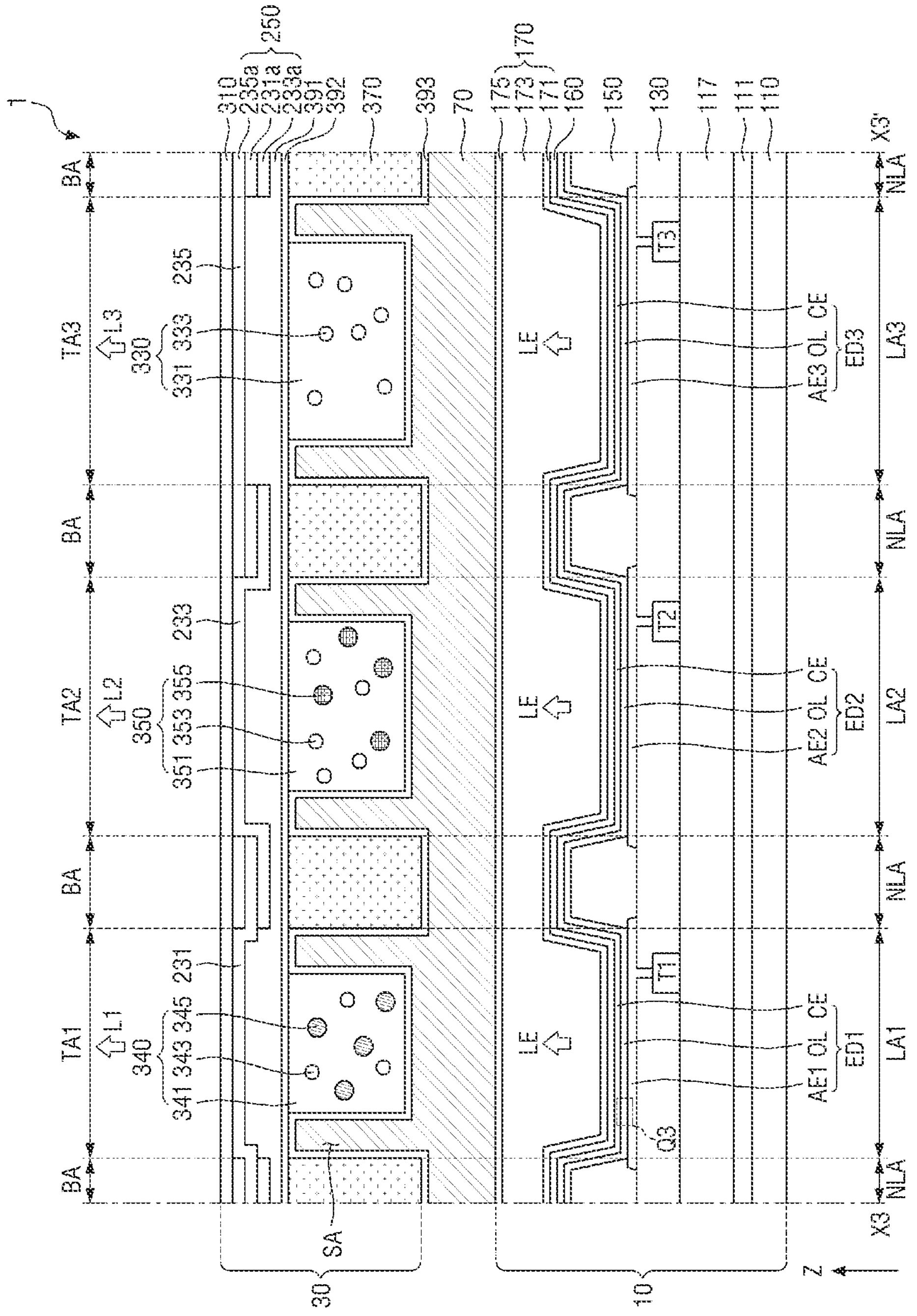
FIG. 9 is a schematic cross-sectional view of the display device according to an embodiment taken along line X3-X3' of FIG. 8.
Figure 10:
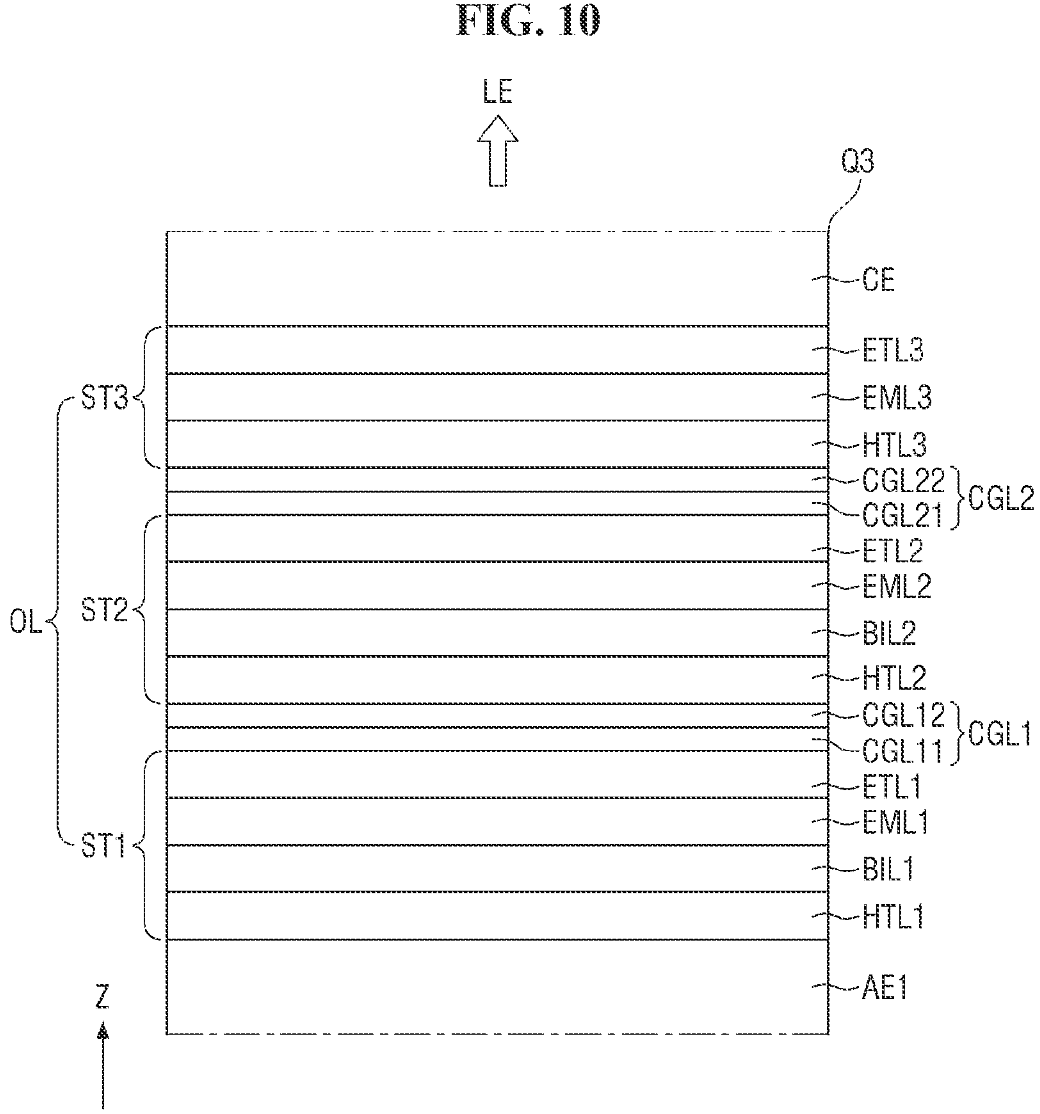
FIG. 10 is an enlarged view of a part Q3 of FIG. 9.

FIG. 8 is an enlarged schematic plan view of a part Q1 of FIG. 3, and is a detailed plan view of a color conversion substrate included in the display device of FIG. 1. FIG. 9 is a schematic cross-sectional view of the display device 1 according to an embodiment taken along line X3-X3' of FIG. 8 and FIG. 10 is an enlarged schematic view of a part Q3 of FIG. 9.

In addition to FIGS. 1 to 7, FIG. 8 illustrating the display device 1 is referenced. As described above, the display device 1 may include the display substrate 10 and the color conversion substrate 30, and may further include the filler 70 disposed between the display substrate 10 and the color conversion substrate 30.

As illustrated in FIG. 8, the color conversion substrate 30 may include a first wavelength conversion pattern layer 340, a second wavelength conversion pattern layer 350, and a light transmission layer 330 having a rectangular shape, the first light transmitting area TA1, the second light transmitting area TA2, and the third light transmitting area TA3 having a rectangular shape and surrounding them, and the light blocking area BA disposed in an area other than the light transmitting areas. In some embodiments, the light blocking area BA may be formed of a bank pattern layer 370.

In some embodiments, a separation space SA may be defined between the light blocking area BA and each of the first wavelength conversion pattern layer 340, the second wavelength conversion pattern layer 350, and the light transmission layer 330 with overlapping the light transmitting areas. For example, the first wavelength conversion pattern layer 340, the second wavelength conversion pattern layer 350, and the light transmission layer 330 may be arranged to be spaced apart from the light blocking area BA, the space therebetween may be defined as the "separation space SA," and the filler 70 may fill the separation space SA.

As mentioned above, in some embodiments, each of the first light transmitting area TA1, the second light transmitting area TA2, and the third light transmitting area TA3 may have a quadrilateral shape in plan view. For example, the quadrilateral shape may be a rectangular shape or a square shape. However, embodiments are not limited thereto, and each of the first light transmitting area TA1, the second light transmitting area TA2, and the third light transmitting area TA3 may have a circular shape, an elliptical shape, or another polygonal shape in plan view.

Hereinafter, the display substrate 10 will be described with reference to FIG. 9.

FIG. 9 is a schematic cross-sectional view of the display device 1 according to an embodiment taken along line X3-X3' of FIG. 8. Referring to FIG. 9, in case that light emitted to the outside of the display device 1 from the first light transmitting area TA1 is referred to as first emission light L1, light emitted to the outside of the display device 1 from the second light transmitting area TA2 is referred to as second emission light L2, and light emitted to the outside of the display device 1 from the third light transmitting area TA3 is referred to as third emission light L3, the first emission light L1 may be light of a first color, the second emission light L2 may be light of a second color different from the first color, and the third emission light L3 may be light of a third color different from the first color and the second color.

In some embodiments, the light of the third color may be blue light having a wavelength range of about 380 nm to about 500 nm and having a peak wavelength within a range of about 440 nm to about 480 nm, and the light of the first color may be red light having a wavelength range of about 600 nm to about 780 nm and having a peak wavelength within a range of about 610 nm to about 650 nm. Further, the light of the second color may be green light having a wavelength range of about 500 nm to about 600 nm and having a peak wavelength within a range of about 510 nm to about 550 nm.

The light blocking area BA may be positioned around the first light transmitting area TA1, the second light transmitting area TA2, and the third light transmitting area TA3 of the color conversion substrate 30 in the display area DA. In some embodiments, the light blocking area BA may surround the first light transmitting area TA1, the second light transmitting area TA2, and the third light transmitting area TA3. For example, the light blocking area BA may be positioned in the non-display area NDA of the display device 1 and may also overlap the non-emission area NLA.

The first base portion 110 may be made of a light transmissive material. In some embodiments, the first base portion 110 may be a glass substrate or a plastic substrate. In case that the first base portion 110 is a plastic substrate, the first base portion 110 may have flexibility.

A buffer layer 111 may be further positioned on the first base portion 110. The buffer layer 111 may be positioned on the first base portion 110 and may be disposed in the display area DA and the non-display area NDA. The buffer layer 111 may block foreign substances or moisture permeating through the first base portion 110. For example, the buffer layer 111 may include an inorganic material such as $SiO_2$, SiNx, or SiON, and may be formed as a single layer or multiple layers.

For example, signal lines (e.g., gate lines, data lines, power lines, and the like) transmitting signals to each transistor may be further disposed on the buffer layer 111.

A protective layer 117 may be positioned on the signal lines. In some embodiments, the protective layer 117 may be positioned in the display area DA and the non-display area NDA, and may be a protective layer protecting the signal lines. The protective layer 117 may include an inorganic material.

Transistors T1, T2, and T3 may be positioned on the protective layer 117. In some embodiments, each of the transistors T1, T2, and T3 may be a thin film transistor. In some embodiments, the first transistor T1 may overlap the first emission area LA1, the second transistor T2 may overlap the second emission area LA2, and the third transistor T3 may overlap the third emission area LA3. Although the drawing illustrates that the first transistor T1, the second transistor T2, and the third transistor T3 overlap the emission area LA, and do not overlap the non-emission area NLA, this is an example. In another example, at least one of the first transistor T1, the second transistor T2, or the third transistor T3 may overlap the non-emission area NLA. In another example, the first transistor T1, the second transistor T2, and the third transistor T3 may all overlap the non-emission area NLA and do not overlap the emission area LA.

An insulating layer 130 may be positioned on the first transistor T1, the second transistor T2, and the third transistor T3. In some embodiments, the insulating layer 130 may be a planarization layer. In some embodiments, the insulating layer 130 may include an organic material. For example, the insulating layer 130 may include acrylic resin, epoxy resin, imide resin, ester resin, or the like. In some embodiments, the insulating layer 130 may include a photosensitive organic material.

A first anode electrode AE1, a second anode electrode AE2, and a third anode electrode AE3 may be positioned on the insulating layer 130.

The first anode electrode AE1 may overlap the first emission area LA1 and may partially extend to the non-emission area NLA. The second anode electrode AE2 may overlap the second emission area LA2 and may partially extend to the non-emission area NLA, and the third anode electrode AE3 may overlap the third emission area LA3 and may partially extend to the non-emission area NLA. The first anode electrode AE1 may be connected (e.g., electrically connected) to the first transistor T1 through penetrating the insulating layer 130, the second anode electrode AE2 may be connected (e.g., electrically connected) to the second transistor T2 through penetrating the insulating layer 130, and the third anode electrode AE3 may be connected (e.g., electrically connected) to the third transistor T3 through penetrating the insulating layer 130.

In some embodiments, the first anode electrode AE1, the second anode electrode AE2, and the third anode electrode AE3 may be reflective electrodes. For example, the first anode electrode AE1, the second anode electrode AE2 and the third anode electrode AE3 may be a metal layer containing at least one of Ag, Mg, Al, Pt, Pd, Au, Ni, Nd, Ir, or Cr. In another example, the first anode electrode AE1, the second anode electrode AE2 and the third anode electrode AE3 may further include a metal oxide layer stacked on the metal layer. In an embodiment, the first anode electrode AE1, the second anode electrode AE2, and the third anode electrode AE3 may have a multilayer structure, e.g., a two-layer structure of ITO/Ag, Ag/ITO, ITO/Mg, or ITO/MgF, or a three-layer structure such as ITO/Ag/ITO.

A pixel defining layer 150 may be positioned on the first anode electrode AE1, the second anode electrode AE2 and the third anode electrode AE3. The pixel defining layer 150 may include an opening exposing the first anode electrode AE1, an opening exposing the second anode electrode AE2 and an opening exposing the third anode electrode AE3, and may define the first emission area LA1, the second emission area LA2, the third emission area LA3 and the non-emission area NLA. For example, a region of the first anode electrode AE1 which is exposed without being covered by the pixel defining layer 150 may be the first emission area LA1. For example, a region of the second anode electrode AE2 which is exposed without being covered by the pixel defining layer 150 may be the second emission area LA2, and a region of the third anode electrode AE3 which is exposed without being covered by the pixel defining layer 150 may be the third emission area LA3. Further, a region where the pixel defining layer 150 is positioned may be the non-emission area NLA.

In some embodiments, the pixel defining layer 150 may include an organic insulating material selected from the group consisting of acrylic resin, epoxy resin, phenolic resin, polyamide resin, polyimide resin, unsaturated polyester resin, polyphenylene ether resin, polyphenylenesulfide resin and benzocyclobutene (BCB).

In some embodiments, the pixel defining layer 150 may overlap a light blocking pattern layer 250 which will be described below, and may also overlap a color filter overlapping the non-emission area NLA. Further, the pixel defining layer 150 may also overlap the bank pattern layer 370 to be described below.

As shown in FIG. 9, a light emitting layer OL may be positioned on the first anode electrode AE1, the second anode electrode AE2, and the third anode electrode AE3.

In some embodiments, the light emitting layer OL may have a shape of a continuous film formed over the emission areas LA1, LA2, and LA3 and the non-emission area NLA. A more detailed description of the light emitting layer OL will be given below.

As shown in FIG. 9, a cathode electrode CE may be positioned on the light emitting layer OL.

In some embodiments, the cathode electrode CE may have a semi-transmissive or transmissive property. In case that the cathode electrode CE has a semi-transmissive property, the cathode electrode CE may include Ag, Mg, Cu, Al, Pt, Pd, Au, Ni, Nd, Ir, Cr, Li, Ca, LiF/Ca, LiF/Al, Mo, Ti or a compound or mixture thereof, such as a mixture of Ag and Mg. For example, in case that the cathode electrode CE has a thickness of tens to hundreds of angstroms, the cathode electrode CE may have a semi-transmissive property.

In case that the cathode electrode CE has a transmissive property, the cathode electrode CE may include a transparent conductive oxide (TCO). For example, the cathode electrode CE may include tungsten oxide ($W_xO_y$), titanium oxide ($TiO_2$), indium tin oxide (ITO), indium zinc oxide (IZO), zinc oxide (ZnO), indium tin zinc oxide (ITZO), magnesium oxide (MgO) or the like.

The first anode electrode AE1, the light emitting layer OL and the cathode electrode CE may constitute (or form) a first light emitting element ED1. The second anode electrode AE2, the light emitting layer OL and the cathode electrode CE may constitute (or form) a second light emitting element ED2. The third anode electrode AE3, the light emitting layer OL and the cathode electrode CE may constitute (or form) a third light emitting element ED3. Each of the first light emitting element ED1, the second light emitting element ED2, and the third light emitting element ED3 may emit emission light LE, and the emission light LE may be provided to the color conversion substrate 30.

Referring to FIGS. 9 and 10, the emission lights LE emitted from the light emitting layer OL may have substantially the same wavelength band. For example, the light emitting elements ED1, ED2, and ED3 of the display substrate 10 may emit the emission lights LE including all of the first wavelength band, the second wavelength band, and the third wavelength band. For example, white light may be emitted. The first wavelength band, the second wavelength band, and the third wavelength band may be wavelength bands of lights converted or filtered by the wavelength conversion pattern layers 340 and 350, the light transmission layer 330, and the color filters 231, 233, and 235 which will be described below.

An organic layer of the display substrate 10 may have a structure (e.g., tandem structure) in which light emitting layers are stacked to emit light L including all of the first, second, and third wavelength bands described above, e.g., white light, but embodiments are not limited thereto.

FIG. 10 is an enlarged schematic view of a part Q3 of FIG. 9.

As shown in FIG. 10, the light emitting layer OL may include a first stack ST1 including a first light emitting layer EML1, a second stack ST2 positioned on the first stack ST1 and including a second light emitting layer EML2, a third stack ST3 positioned on the second stack ST2 and including a third light emitting layer EML3, a first charge generation layer CGL1 positioned between the first stack ST1 and the second stack ST2, and a second charge generation layer CGL2 positioned between the second stack ST2 and the third stack ST3. The first stack ST1, the second stack ST2, and the third stack ST3 may be disposed to overlap each other. The first stack ST1 may include a first hole transport layer HTL1, a first bi-layer BIL1, and the first light emitting layer EML1, and a first electron transport layer ETL1. The second stack ST2 may include a second hole transport layer HTL2, a second bi-layer BIL2, and the second light emitting layer EML2, and a second electron transport layer ETL2. The third stack ST3 may include a third hole transport layer HTL3, a third bi-layer BIL3, and the third light emitting layer EML3, and a third electron transport layer ETL3. The first charge generation layer CGL1 may include a first-first charge generation layer CGL11 and a first-second charge generation layer CGL12. The second charge generation layer CGL2 may include a second-first charge generation layer CGL21 and a second-second charge generation layer CGL22.

The first light emitting layer EML1, the second light emitting layer EML2, and the third light emitting layer EML3 may be disposed to overlap each other.

In some embodiments, the first light emitting layer EML1 may emit light of the third wavelength band, for example, blue light. For example, each first light emitting layer EML1 may be a blue light emitting layer and may include an organic material. In some embodiments, the third wavelength band is a blue wavelength band, and may have a wavelength range of about 380 nm to about 500 nm and a peak wavelength range of about 440 nm to about 480 nm, but embodiments are not limited thereto.

In some embodiments, the second light emitting layer EML2 may emit light of the second wavelength band, for example, green light. For example, each second light emitting layer EML2 may be a green light emitting layer and may include an organic material. In some embodiments, the second wavelength band is a green wavelength band, may have a wavelength range of about 500 nm to about 600 nm, and may have a peak wavelength range of about 510 nm to about 550 nm, but embodiments are not limited thereto.

In some embodiments, the third light emitting layer EML3 may emit light of the first wavelength band, for example, red light. For example, each third light emitting layer EML3 may be a red light emitting layer and may include an organic material. In some embodiments, the first wavelength band is a red wavelength band and may have a wavelength range of about 600 nm to about 780 nm and a peak wavelength range of about 610 nm to about 650 nm, but embodiments are not limited thereto.

Red, green, and blue wavelength bands are not limited to the above examples, and should be understood to include all wavelength ranges that are recognized as red, green, and blue.

Accordingly, the display substrate 10 may emit white light including all wavelength bands of red, green, and blue. Further, white light of the display substrate 10 may also include a wavelength band of about 597 nm to about 622 nm (e.g., orange) and a wavelength band of about 577 nm to about 597 nm (e.g., yellow).

According to the above-described embodiments, although it has been described that the first light emitting layer EML1, the second light emitting layer EML2, and the third light emitting layer EML3 are arranged to overlap each other to have a tandem structure, the first light emitting layer EML1 emits blue light, the second light emitting layer EML2 emits green light, and the third light emitting layer EML3 emits red light, the stacking order or the wavelength bands are not limited thereto.

For example, the first light emitting layer EML1 may emit any one of red light, green light, and blue light, the second light emitting layer EML2 may also emit any one of red light, green light, and blue light, and the third light emitting layer EML3 may also emit any one of red light, green light, and blue light.

In some embodiments, the tandem structure has been described as a structure of the third light emitting layer EML3 on the second light emitting layer EML2 on the first light emitting layer EML1, but this order is also not limited thereto and the stacking order may be changed.

In accordance with the above-described embodiments, as compared to the conventional light emitting element that does not adopt a tandem structure, e.g., a structure in which light emitting layers are stacked, it is advantageous in that the light efficiency increases and the lifespan of the display device increases.

As shown in FIG. 9, the cathode capping layer 160 may be positioned on the cathode electrode CE. The cathode capping layer 160 may be commonly disposed in the first emission area LA1, the second emission area LA2, the third emission area LA3, and the non-emission area NLA, and may improve viewing angle characteristics and increase external luminous efficiency.

The cathode capping layer 160 may include at least one of an inorganic material or an organic material having a light transmissive property. For example, the cathode capping layer 160 may be formed of an inorganic layer, an organic layer, or an organic layer including inorganic particles. For example, the cathode capping layer 160 may include a triamine derivative, a carbazole biphenyl derivative, an arylenediamine derivative, an aluminum quinolium complex ($Alq_3$), or the like.

Further, the cathode capping layer 160 may be made of a mixture of a high refractive material and a low refractive material. In another example, the cathode capping layer 160 may include two layers having different refractive indices, e.g., a high refractive layer and a low refractive layer.

In some embodiments, the cathode capping layer 160 may cover (e.g., completely cover) the cathode electrode CE.

The thin film encapsulation layer 170 may be disposed on the cathode capping layer 160. The thin film encapsulation layer 170 may be commonly disposed in the first emission area LA1, the second emission area LA2, the third emission area LA3, and the non-emissive area NLA. In some embodiments, the thin film encapsulation layer 170 may cover (e.g., directly cover) the cathode capping layer 160.

In some embodiments, the thin film encapsulation layer 170 may include a lower inorganic layer 171, an organic layer 173, and an upper inorganic layer 175 sequentially stacked on the cathode capping layer 160.

The lower inorganic layer 171 may cover the first light emitting element ED1, the second light emitting element ED2, and the third light emitting element ED3 in the display area DA.

The lower inorganic layer 171 may include an inorganic material and may have a multilayer structure.

The organic layer 173 may be positioned on the lower inorganic layer 171. The organic layer 173 may cover the first light emitting element ED1, the second light emitting element ED2, and the third light emitting element ED3 in the display area DA.

In some embodiments, the organic layer 173 may be formed of acrylic resin, methacrylic resin, polyisoprene, vinyl resin, epoxy resin, urethane resin, cellulose resin, perylene resin or the like.

The upper inorganic layer 175 may be positioned on the organic layer 173. The upper inorganic layer 175 may cover the organic layer 173. In some embodiments, the upper inorganic layer 175 may be in contact with (e.g., in direct contact with) the lower inorganic layer 171 in the non-display area to form an inorganic-inorganic junction.

In some embodiments, each of the lower inorganic layer 171 and the upper inorganic layer 175 may be formed of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), lithium fluoride or the like.

In some embodiments, each of the lower inorganic layer 171 and the upper inorganic layer 175 may be formed as a single layer, but embodiments are not limited thereto. At least one of the lower inorganic layer 171 or the upper inorganic layer 175 may have a structure, e.g., a multilayer structure, in which layers each made of an inorganic material are stacked.

In addition to the above-described structure, the structure of the thin film encapsulation layer 170 may be variously modified.

Hereinafter, the color conversion substrate 30 will be described.

The second base portion 310 shown in FIG. 9 may be made of a light transmitting material.

In some embodiments, the second base portion 310 may include a glass substrate or a plastic substrate. In some embodiments, the second base portion 310 may further include a separate layer, for example, an insulating layer such as an inorganic layer, positioned on the glass substrate or the plastic substrate.

As described above, in some embodiments, the light transmitting areas TA1, TA2, and TA3 and the light blocking area BA may be defined in the second base portion 310. In case that the second base portion 310 includes a glass substrate, the refractive index of the second base portion 310 may be about 1.5.

As shown in FIG. 9, the color filters 231, 233, and 235 may be disposed on a surface of the second base portion 310 facing the display substrate 10.

Figure 11:
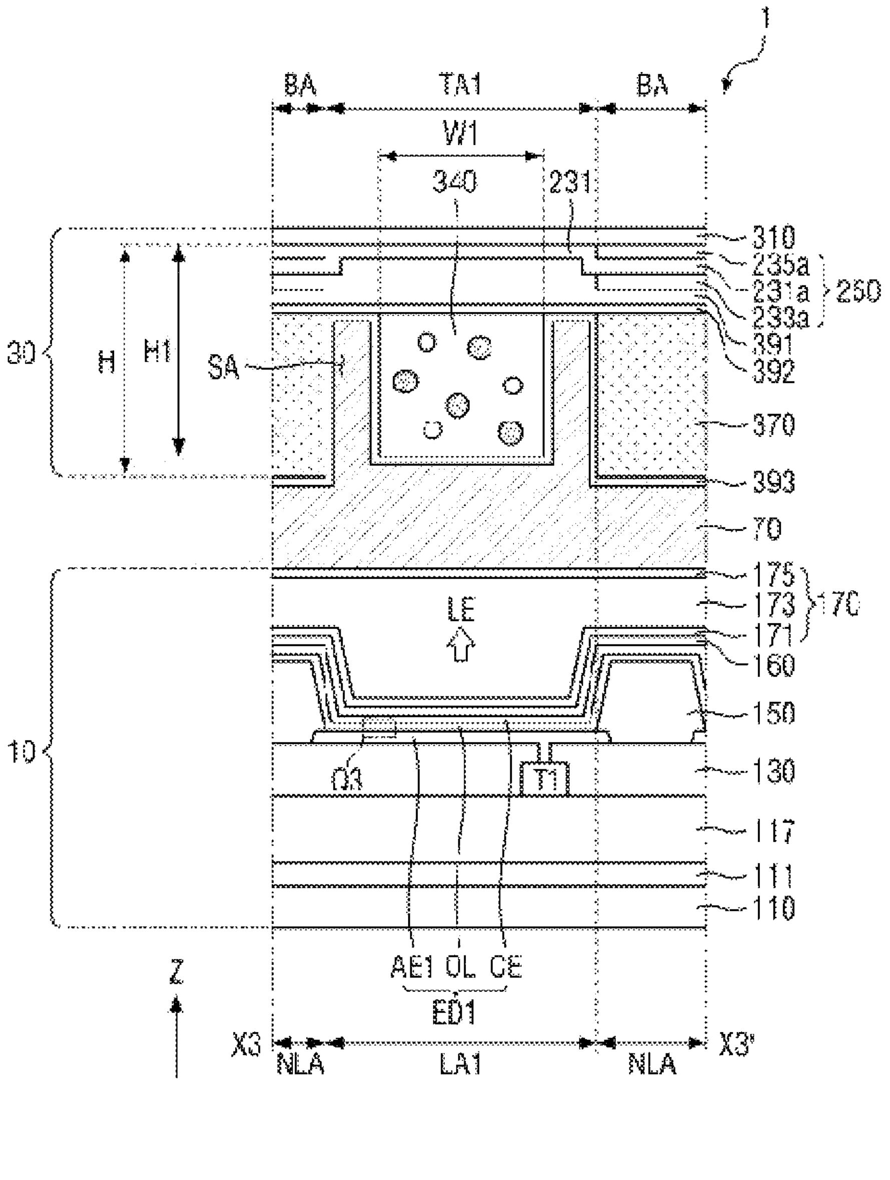
FIG. 11 is a partial schematic cross-sectional view of a display device according to an embodiment taken along line X3-X3' of FIG. 8.

As shown in FIGS. 9 and 11, the first color filter 231 may be disposed to overlap the first emission area LA1 or the first light transmitting area TA1.

In some embodiments, the first color filter 231 may block or absorb a part of the white light. In some embodiments, the first color filter 231 may selectively transmit light of the first color (e.g., red light) and may block or absorb light of the third color (e.g., blue light) and light of the second color (e.g., green light). For example, the first color filter 231 may be a red color filter, and may include a red colorant.

The first color filter 231 may be disposed to further overlap the non-emission area NLA or the light blocking area BA, and the first color filter 231 may be positioned on the third color filter 235 in a direction toward a first base substrate in the light blocking area BA.

Figure 12:
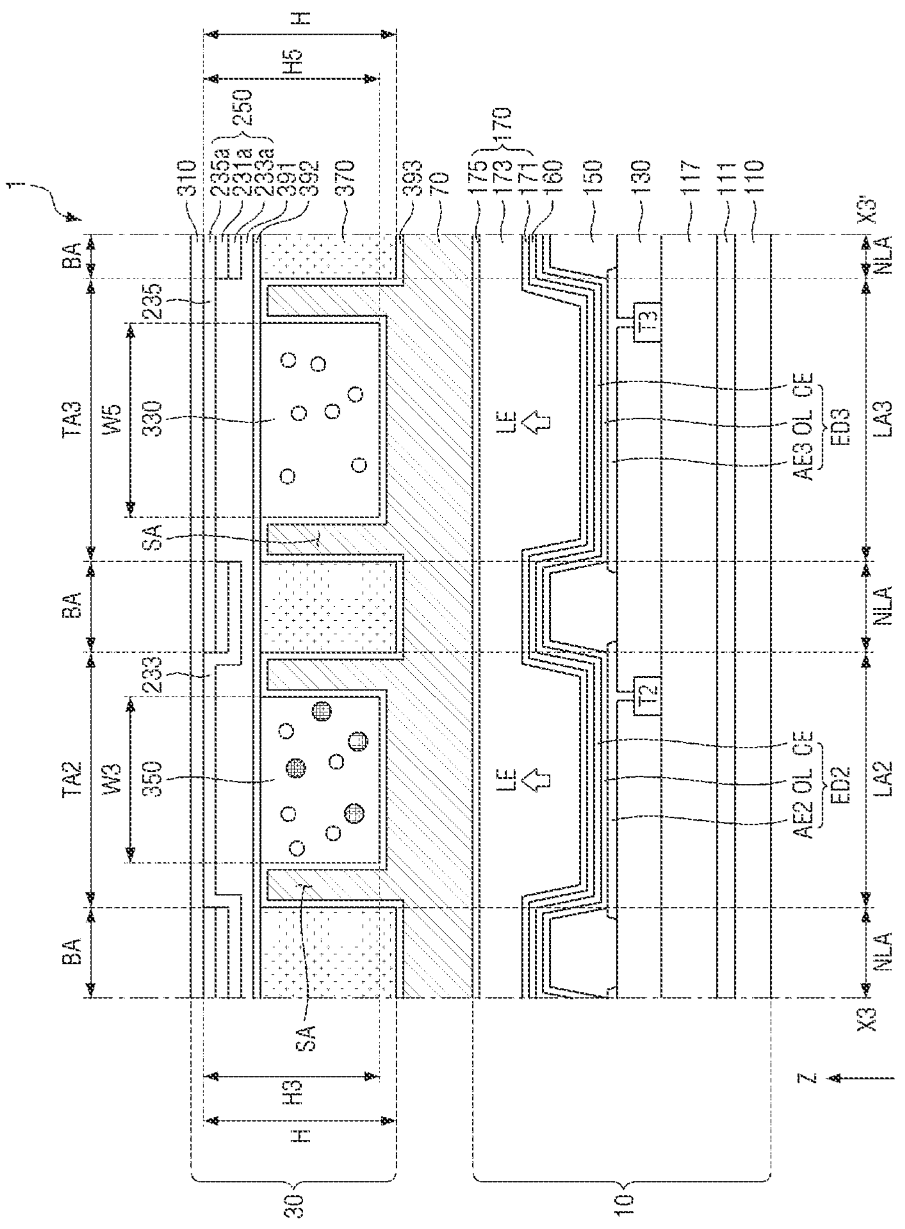
FIG. 12 is a partial schematic cross-sectional view of a display device according to an embodiment taken along line X3-X3' of FIG. 8.

As shown in FIGS. 9 and 12, the second color filter 233 may be disposed to overlap the second emission area LA2 or the second light transmitting area TA2.

In some embodiments, the second color filter 233 may block or absorb a part of the white light. For example, the second color filter 233 may also function as a blocking filter. In some embodiments, the second color filter 233 may selectively transmit light of the second color (e.g., green light) and may block or absorb light of the third color (e.g., blue light) and light of the first color (e.g., red light). For example, the second color filter 233 may be a green color filter, and may include a green colorant.

The second color filter 233 may be disposed to further overlap the non-emission area NLA or the light blocking area BA, and the second color filter 233 may be positioned on the first color filter 231 in the direction toward the first base substrate in the light blocking area BA.

As shown in FIGS. 9 and 12, the third color filter 235 may be disposed to overlap the third emission area LA3 or the third light transmitting area TA3.

In some embodiments, the third color filter 235 may block or absorb a part of the white light. For example, the third color filter 235 may also function as a blocking filter. In some embodiments, the third color filter 235 may selectively transmit light of the third color (e.g., blue light) and may block or absorb light of the second color (e.g., green light)

and light of the first color (e.g., red light). For example, the third color filter 235 may be a blue color filter, and may include a blue colorant.

The third color filter 235 may be disposed to further overlap the non-emission area NLA or the light blocking area BA, and the first color filter 231 and the second color filter 233 may be sequentially positioned on the third color filter 235 in the direction toward the first base substrate in the light blocking area BA.

As shown in FIG. 9, a low refractive layer 391 may be disposed to cover the light blocking pattern layer 250, the first color filter 231, the second color filter 233, and the third color filter 235 on a surface of the second base portion 310. In some embodiments, the low refractive layer 391 may be in contact with (e.g., in direct contact with) the first color filter 231, the second color filter 233 and the third color filter 235. Further, in some embodiments, the low refractive layer 391 may also be in contact with (e.g., in direct contact with) the light blocking pattern layer 250.

The low refractive layer 391 may have a refractive index lower than those of wavelength conversion pattern layers 340 and 350 and the light transmission layer 330. For example, the low refractive layer 391 may be formed of a mixture of an organic material and an inorganic material. For example, the inorganic material of the low refractive layer 391 may include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, or the like, and the organic material of the low refractive layer 391 may be formed of acrylic resin, methacrylic resin, polyisoprene, vinyl resin, epoxy resin, urethane resin, cellulose resin, perylene resin or the like.

In some embodiments, the refractive index of the low refractive layer 391, which is made of a mixture of an organic material and an inorganic material, may be about 1.2. Hollow particles may be formed in the low refractive layer to lower the refractive index of the low refractive layer 391.

A low refractive capping layer 392 may be further disposed on a surface of the low refractive layer 391 facing the first base portion 110. In some embodiments, the low refractive capping layer 392 may be in contact with (e.g., in direct contact with) the wavelength conversion pattern layers 340 and 350 and the light transmission layer 330. Further, in some embodiments, the low refractive capping layer 392 may also be in contact with (e.g., in direct contact with) the bank pattern layer 370.

The low refractive capping layer 392 may have a refractive index lower than those of the wavelength conversion pattern layers 340 and 350 and the light transmission layer 330. In some embodiments, the low refractive capping layer 392 may be made of an inorganic material. For example, the low refractive capping layer 392 may include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, or the like. In some embodiments, hollow particles may be formed in the low refractive layer to lower the refractive index of the low refractive capping layer 392.

The low refractive capping layer 392 may prevent contamination or damage of the first color filter 231, the second color filter 233, the third color filter 235 and the like due to infiltration (or permeation) of impurities such as moisture or air from the outside. Further, the low refractive capping layer 392 may prevent the colorants included in the first color filter 231, the second color filter 233, and the third color filter 235 from being diffused to the components other than the first color filter 231, the second color filter 233, and the third color filter 235, such as the first wavelength conversion pattern layer 340, the second wavelength conversion pattern layer 350, and the like.

In some embodiments, the low refractive layer 391 and the low refractive capping layer 392 may cover the side surface of the light blocking pattern layer 250 in the non-emission area NLA and the light blocking area BA.

The bank pattern layer 370 may be positioned on a surface of the low refractive capping layer 392 that overlaps the non-emission area NLA and faces the display substrate 10. In some embodiments, the bank pattern layer 370 may be positioned on (e.g., directly on) a surface of the low refractive capping layer 392 and may be in contact with (e.g., in direct contact with) the low refractive capping layer 392.

As shown in FIG. 8, the bank pattern layer 370 may constitute (or form) the light blocking area BA and may surround the first light transmitting area TA1, the second light transmitting area TA2, and the third light transmitting area TA3 in plan view. The bank pattern layer 370 may partition (or separate) the space in which the first wavelength conversion pattern layer 340, the second wavelength conversion pattern layer 350, and the light transmission layer 330 are disposed.

In some embodiments, the bank pattern layer 370 may be in contact with (e.g., in direct contact with) a surface (e.g., lower surface) of the low refractive capping layer 392.

As shown in FIG. 8, the bank pattern layer 370 may be formed in an integrally connected single pattern, but embodiments are not limited thereto. In another example, a portion of the bank pattern layer 370 surrounding the first light transmitting area TA1, a portion of the bank pattern layer 370 surrounding the second light transmitting area TA2, and a portion of the bank pattern layer 370 surrounding the third light transmitting area TA3 may be formed in individual patterns separated from each other.

The first wavelength conversion pattern layer 340, the second wavelength conversion pattern layer 350, and the light transmission layer 330 may be positioned on the surface of the low refractive capping layer 392 overlapping the emission areas and facing the first base portion 110.

In some embodiments, the first wavelength conversion pattern layer 340, the second wavelength conversion pattern layer 350, and the light transmission layer 330 may be positioned in the emission areas LA1, LA2, and LA3.

As shown in FIGS. 9 and 11, the first wavelength conversion pattern layer 340 may overlap the first emission area LA1, the first light emitting element ED1, or the first light transmitting area TA1. In some embodiments, the first wavelength conversion pattern layer 340 may be positioned in the space partitioned by the bank pattern layer 370 in the first light transmitting area TA1.

In some embodiments, the first wavelength conversion pattern layer 340 may be positioned between the bank pattern layer 370 positioned on a side of the first wavelength conversion pattern layer 340 in the first direction and the bank pattern layer 370 positioned on another side thereof in the first direction with being spaced apart therefrom. The spaces on sides (e.g., opposite sides) may be defined as "separation space SA," and the widths of the spaces SA included in the emission areas LA1, LA2, and LA3 may be the same or different from each other.

In some embodiments, the bank pattern layers 370 disposed on sides (e.g., opposite sides) of the first wavelength conversion pattern layer 340 may be defined as a first portion and a second portion, respectively. The bank pattern layer 370, which is positioned on a side of the first wavelength conversion pattern layer 340 in the first direction, may be defined as the first portion, and the bank pattern layer 370, which is positioned on another side of the first wavelength conversion pattern layer 340 in the first direction, may be defined as the second portion. However, embodiments are not limited thereto, and the bank pattern layer 370 positioned on a side in the first direction may be defined as the second portion and the bank pattern layer 370 positioned on another side in the first direction may be defined as the first portion. For example, the first wavelength conversion pattern layer 340 may be positioned between the first and second portions of the bank pattern layers 370 and may be spaced apart from the first and second portions of the bank pattern layers 370.

FIG. 11 is a partial schematic cross-sectional view of a display device according to an embodiment taken along line X3-X3' of FIG. 8. FIG. 12 is a partial schematic cross-sectional view of a display device according to an embodiment taken along line X3-X3' of FIG. 8.

FIG. 11 is a partial schematic cross-sectional view illustrating the first emission area LA1 and the first light transmitting area TA1 of the display device 1 taken along line X3-X3' of FIG. 8. As shown in FIG. 11, a width W1 of the first wavelength conversion pattern layer 340 may be smaller than the widths of the first emission area LA1 and the first light transmitting area TA1. For example, a height H1 of the first wavelength conversion pattern layer 340 with respect to the second base portion 310 may be lower than heights H of both bank pattern layers 370, which partition the space of the first light transmitting area TA1, with respect to the second base portion 310.

Referring to FIGS. 9 and 11, the first wavelength conversion pattern layer 340 may be manufactured by a photolithography process. In case that the first wavelength conversion pattern layer 340 is manufactured by a photolithography process, the arrangement shape thereof spaced apart from the bank pattern layer 370 may be readily manufactured. Although the drawing illustrates the shape of the first wavelength conversion pattern layer 340 as a rectangle, embodiments are not limited thereto. For example, it may include all shapes that are manufactured by a photolithography process, such as a trapezoid, a rounded rectangle, and a semicircle.

The first wavelength conversion pattern layer 340 may convert or shift the peak wavelength of incident light to another specific peak wavelength by using a first wavelength shifter 345 to be described below and emit the light having another specific peak wavelength. In some embodiments, the first wavelength conversion pattern layer 340 may convert the emission light LE provided from the first light emitting element ED1 to red light having a peak wavelength in the range of about 610 nm to about 650 nm and emit the red light.

As shown in FIG. 9, the first wavelength conversion pattern layer 340 may include first base resin 341 and the first wavelength shifter 345 dispersed in the first base resin 341, and may further include first scatterers 343 dispersed in the first base resin 341.

The first base resin 341 may be made of a material having high light transmittance. In some embodiments, the first base resin 341 may be formed of an organic material. In some embodiments, the first base resin 341 may be made of the same material as the third base resin 331, or may include at least one of the materials as the constituent materials of the third base resin 331.

Examples of the first wavelength shifter 345 may include a quantum dot, a quantum rod, a phosphor, and the like. For example, a quantum dot may be a particulate material that emits light of a specific color in case that an electron transitions from a conduction band to a valence band.

The quantum dot may be a semiconductor nanocrystal material. The quantum dot may have a specific band gap according to its composition and size. Thus, the quantum dot may absorb light and emit light having an intrinsic wavelength. Examples of semiconductor nanocrystal of quantum dots may include group IV nanocrystal, group II-VI compound nanocrystal, group III-V compound nanocrystal, group IV-VI nanocrystal, a combination thereof, or the like.

The group II-VI compound may be selected from the group consisting of binary compounds, ternary compounds, and quaternary compounds, wherein the binary compounds are selected from the group consisting of CdSe, CdTe, ZnS, ZnSe, ZnTe, ZnO, HgS, HgSe, HgTe, MgSe, MgS and mixtures thereof, the ternary compounds are selected from the group consisting of InZnP, AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and mixtures thereof, and the quaternary compounds are selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe and mixtures thereof.

The group III-V compound may be selected from the group consisting of binary compounds, ternary compounds, and quaternary compounds, wherein the binary compounds are selected from the group consisting of GaN, GaP, GaAs, GaSb, AlN, AlP, AlAs, AlSb, InN, InP, InAs, InSb and mixtures thereof, the ternary compounds are selected from the group consisting of GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP and mixtures thereof, and the quaternary compounds are selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and mixtures thereof.

The group IV-VI compound may be selected from the group consisting of binary compounds, ternary compounds, and quaternary compounds, wherein the binary compounds are selected from the group consisting of SnS, SnSe, SnTe, PbS, PbSe, PbTe and mixtures thereof, the ternary compounds are selected from the group consisting of SnSeS, SnSeTe, SnSTe, PbSeS, PbSeTe, PbSTe, SnPbS, SnPbSe, SnPbTe and mixtures thereof, and the quaternary compounds are selected from the group consisting of SnPbSSe, SnPbSeTe, SnPbSTe and mixtures thereof. The group IV element may be selected from the group consisting of Si, Ge and mixtures thereof. The group IV compound may be a binary compound selected from the group consisting of SiC, SiGe and mixtures thereof.

For example, the binary compound, the tertiary compound or the quaternary compound may exist in particles at a uniform concentration, or may exist in the same particle divided into states where concentration distributions are partially different. Further, the particles may have a core/shell structure in which one quantum dot surrounds another quantum dot. An interface between the core and the shell may have a concentration gradient in which the concentration of elements present in the shell decreases as being closer toward the center portion.

In some embodiments, the quantum dot may have a core-shell structure including a core including the nanocrystal described above and a shell surrounding the core. The shell of the quantum dot may function as a protective layer for maintaining semiconductor characteristics by preventing chemical denaturation of the core and/or as a charging layer for giving electrophoretic characteristics to the quantum dot. The shell may be a single layer or a multilayer. An interface between the core and the shell may have a concentration gradient in which the concentration of elements present in the shell decreases as being closer toward the center portion. Examples of the shell of the quantum dot may include a metal or non-metal oxide, a semiconductor compound, and a combination thereof.

For example, the metal or non-metal oxide may be a binary compound such as $SiO_2$, $AlO_2O_3$, $TiO_2$, ZnO, MnO, $Mn_2O_3$, $Mn_3O_4$, CuO, FeO, $Fe_2O_3$, $Fe_3O_4$, CoO, $Co_3O_4$ and NiO, or a tertiary compound such as $MgAl_2O_4$, $CoFe_2O_4$, $NiFe_2O_4$ and $CoMn_2O_4$, but embodiments are not limited thereto.

For example, the semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb or the like, but embodiments are not limited thereto.

The light emitted from the first wavelength shifter 345 may have a full width of half maximum (FWHM) of the emission wavelength spectrum, which is about 45 nm or less, about 40 nm or less, or about 30 nm or less. Thus, the purity and reproducibility of colors displayed by the display device 1 may be further improved. For example, the light emitted from the first wavelength shifter 345 may be emitted in various directions regardless of the incident direction of incident light. Accordingly, the side surface visibility of the first color displayed in the first light transmitting area TA1 may be improved.

A part of the emission light LE provided from the first light emitting element ED1 may be emitted through passing through the first wavelength conversion pattern layer 340 without being converted to red light by the first wavelength shifter 345. The component of the emission light LE incident to the first color filter 231 without being converted by the first wavelength conversion pattern layer 340 may be blocked by the first color filter 231. For example, in the emission light LE, the red light converted by the first wavelength conversion pattern layer 340 passes through the first color filter 231 and is emitted to the outside. For example, first emission light L1 emitted to the outside of the display device 1 from the first emission area LA1 may be red light.

The first scatterer 343 may have a refractive index different from that of the first base resin 341 and form an optical interface with the first base resin 341. For example, the first scatterer 343 may be light scattering particles. A more detailed description of the first scatterer 343 is substantially the same as or similar to the description of the third scatterer 333, and thus will be omitted for descriptive convenience.

FIG. 12 is a partial schematic cross-sectional view of the second emission area LA2, the second light transmitting area TA2, the third emission area LA3 and the third light transmitting area TA3 of the display device 1 taken along line X3-X3' of FIG. 8.

As shown in FIG. 12, a width W3 of the first wavelength conversion pattern layer 340 may be smaller than the widths of the second emission area LA2 and the second light transmitting area TA2. For example, a height H3 of the first wavelength conversion pattern layer 340 with respect to the second base portion 310 may be lower than the heights H of both bank pattern layers 370, which partition the space of the second light transmitting area TA2, with respect to the second base portion 310.

Referring to FIGS. 9 and 12, the bank pattern layer 370 disposed on sides (e.g., opposite sides) of the second wavelength conversion pattern layer 350 may be defined as the second portion and a third portion, respectively. The bank pattern layer 370, which is positioned on a side of the second wavelength conversion pattern layer 350 in the first direction, may be defined as the second portion, and the bank pattern layer 370, which is positioned on another side of the second wavelength conversion pattern layer 350 in the first direction, may be defined as the third portion. However, embodiments are not limited thereto, and the bank pattern layer 370 positioned on a side in the first direction may be defined as the third portion, and the bank pattern layer 370 positioned on another side in the first direction may be defined as the second portion. For example, the first wavelength conversion pattern layer 340 may be disposed between the second and third portions of the bank pattern layers 370 with being spaced apart therefrom.

In some embodiments, the second wavelength conversion pattern layer 350 may transmit the emission light LE emitted from the second light emitting element ED2. As described above, the emission light LE provided from the second light emitting element ED2 may be white light. In some embodiments, the emission light LE that is white light may be emitted to the outside of the display device 1 through the second wavelength conversion pattern layer 350 and the second color filter 233.

As shown in FIG. 9, the second wavelength conversion pattern layer 350 may be manufactured by a photolithography process. In case that the second wavelength conversion pattern layer 350 is manufactured by a photolithography process, the arrangement shape thereof spaced apart from the bank pattern layer 370 may be readily manufactured. Although FIG. 9 illustrates the shape of the second wavelength conversion pattern layer 350 as a rectangle, embodiments are not limited thereto. For example, it may include all shapes that are manufactured by a photolithography process, such as a trapezoid, a rounded rectangle, and a semicircle.

The second wavelength conversion pattern layer 350 may convert or shift the peak wavelength of incident light into another specific peak wavelength by using a second wavelength shifter 355 to be described below and emit light having another specific peak wavelength. In some embodiments, the second wavelength conversion pattern layer 350 may convert the emission light LE provided from the second light emitting element ED2 into green light having a peak wavelength of about 510 nm to about 550 nm and emit the green light.

In some embodiments, the second wavelength conversion pattern layer 350 may include second base resin 351 and the second wavelength shifter 355 dispersed in the second base resin 351, and may further include second scatterers 353 dispersed in the second base resin 351.

The second base resin 351 may be made of a material having high light transmittance. In some embodiments, the second base resin 351 may be formed of an organic material. In some embodiments, the second base resin 351 may be made of the same material as the third base resin 331, or may include at least one of the materials as the constituent materials of the third base resin 331.

Examples of the second wavelength shifter 355 may include a quantum dot, a quantum rod, a phosphor, and the like. A more detailed description of the second wavelength shifter 355 is substantially the same as or similar to the description of the first wavelength shifter 345, and thus will be omitted for descriptive convenience.

In some embodiments, both the first wavelength shifter 345 and the second wavelength shifter 355 may be formed of quantum dots. For example, the particle size of the quantum dots forming the second wavelength shifter 355 may be smaller than the particle size of the quantum dots forming the first wavelength shifter 345.

The second scatterer 353 may have a refractive index different from that of the second base resin 351 and form an optical interface with the second base resin 351. For example, the second scatterer 353 may be light scattering particles. A more detailed description of the second scatterer 353 is substantially the same as or similar to the description of the first scatterer 343, and thus will be omitted for descriptive convenience.

A part of the emission light LE that is white light may pass through the second wavelength conversion pattern layer 350 without being converted to green light by the second wavelength shifter 355, and may be blocked by the second color filter 233. For example, in the emission light LE, the green light converted by the second wavelength conversion pattern layer 350 may pass through the second color filter 233 and may be emitted to the outside. For example, light of the second color emitted from the second emission area LA2 to the outside of the display device 1 may be green light.

Referring to FIGS. 9 and 12, the light transmission layer 330 may overlap the third emission area LA3 or the third light transmitting area TA3. The light transmission layer 330 may be positioned in the space partitioned by the bank pattern layer 370 in the third light transmitting area TA3.

In some embodiments, the light transmission layer 330 may be disposed between the bank pattern layer 370 positioned on a side of the light transmission layer 330 in the first direction and the bank pattern layer 370 positioned on another side thereof in the first direction, and may be spaced apart therefrom. The widths of spaces on sides (e.g., opposite sides) may be the same or may be different from each other.

In some embodiments, the bank pattern layers 370 disposed on sides (e.g., opposite sides) of the light transmission layer 330 may be defined as the third portion and a fourth portion, respectively. The bank pattern layer 370, which is positioned on a side of the light transmission layer 330 in the first direction, may be defined as the third portion, and the bank pattern layer 370, which is positioned on another side of the light transmission layer 330 in the first direction, may be defined as the fourth portion. However, embodiments are not limited thereto, and the bank pattern layer 370 positioned on a side in the first direction may be defined as the fourth portion, and the bank pattern layer 370 positioned on another side in the first direction may be defined as the third portion. For example, the light transmission layer 330 may be disposed between the third and fourth portions of the bank pattern layers 370, and may be spaced apart therefrom.

In some embodiments, the space where the light transmission layer 330 is spaced apart from the third portion of the bank pattern layer 370 and the space where the light transmission layer 330 is spaced apart from the fourth portion of the bank pattern layer 370 may be defined as "separation space SA."

For example, as shown in FIG. 12, a height H5 of the light transmission layer 330 with respect to the second base portion 310 may be lower than the heights of both bank pattern layers 370, which partition the space of the third light transmitting area TA3, with respect to the second base portion 310.

The light transmission layer 330 may transmit the emission light LE emitted from the third light emitting element ED3. The emission light LE provided from the third light emitting element ED3 may be white light as described above. The emission light LE that is white light may pass through the light transmission layer 330 and the third color filter 235 and be emitted to the outside of the display device 1. For example, the third emission light L3 emitted from the third emission area LA3 to the outside of the display device 1 may be blue light.

In some embodiments, the light transmission layer 330 may be manufactured by a photolithography process. In case that the light transmission layer 330 is manufactured by a photolithography process, the arrangement shape thereof spaced apart from the bank pattern layer 370 may be readily manufactured. Although FIG. 9 illustrates the shape of the light transmission layer 330 as a rectangle, embodiments are not limited thereto. For example, it may include all shapes that are manufactured by a photolithography process, such as a trapezoid, a rounded rectangle, and a semicircle.

As shown in FIG. 9, the light transmission layer 330 may include third base resin 331, and may further include third scatterers 333 dispersed in the third base resin 331. In the following description, in designating the base resin, the scatterer, and/or the wavelength shifter included in the light transmission layer 330 and the wavelength conversion pattern layers 340 and 350, the components of the light transmission layer 330 and the wavelength conversion pattern layers 340 and 350 are distinguished by the ordinal numbers "first," "second," and "third." However, the ordinal numbers "first," "second," and "third" used for the components of the light transmission layer 330 and the wavelength conversion pattern layers 340 and 350 are not limited thereto, and may be used for the components in different orders.

The third base resin 331 may be made of a material having high light transmittance. In some embodiments, the third base resin 331 may be formed of an organic material. For example, the third base resin 331 may include an organic material such as epoxy resin, acrylic resin, cardo resin, or imide resin.

The third scatterer 333 may have a refractive index different from that of the third base resin 331 and form an optical interface with the third base resin 331. For example, the third scatterer 333 may be light scattering particles. The third scatterer 333 is not particularly limited as long as it is a material capable of scattering at least a portion of the transmitted light, but may be, for example, metal oxide particles or organic particles. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), and the like. Examples of a material of the organic particles may include acrylic resin and urethane resin, and the like. For example, the third scatterer 333 according to an embodiment may include titanium oxide ($TiO_2$).

The third scatterer 333 may scatter the light in a random direction regardless of the incident direction of the incident light without substantially converting the wavelength of the light passing through the light transmission layer 330. In some embodiments, the light transmission layer 330 may be in contact with (e.g., in direct contact with) the bank pattern layer 370.

As shown in FIG. 9, the capping layer 393 may cover the outer surface of the bank pattern layer 370 in the non-emission area NLA, and may cover the side surface of the bank pattern layer 370 and the outer surfaces of the first wavelength conversion pattern layer 340, the second wavelength conversion pattern layer 350, and the light transmission layer 330 in the emission area LA. For example, a surface of the capping layer 393 may be in contact with (e.g., in direct contact with) the low refractive capping layer 392 in the separation space SA, and another surface thereof opposite to the surface in contact with (e.g., in direct contact with) the low refractive capping layer 392 may be in contact with (e.g., in direct contact with) the filler 70.

In some embodiments, the capping layer 393 may be made of an inorganic material. The capping layer 393 may be made of the same material as the low refractive capping layer 392, or may include at least one of the materials mentioned in the description of the low refractive capping layer 392.

In some embodiments, the capping layer 393 may cover and surround the outer surfaces of the first wavelength conversion pattern layer 340, the second wavelength conversion pattern layer 350, and the light transmission layer 330 in the emission areas LA1, LA2, and LA3, and the light transmitting areas TA1, TA2, and TA3.

In some embodiments, the capping layer 393 covering the side surface of the first wavelength conversion pattern layer 340 may be positioned opposite to the capping layer 393 covering the side surface of the bank pattern layer 370 with a space therebetween. For example, the capping layer 393 covering the side surface of the second wavelength conversion pattern layer 350 may be positioned opposite to the capping layer 393 covering the side surface of the bank pattern layer 370 with a space therebetween. For example, the capping layer 393 covering the side surface of the light transmission layer 330 may be positioned opposite to the capping layer 393 covering the side surface of the bank pattern layer 370 with a space therebetween.

Figure 13:
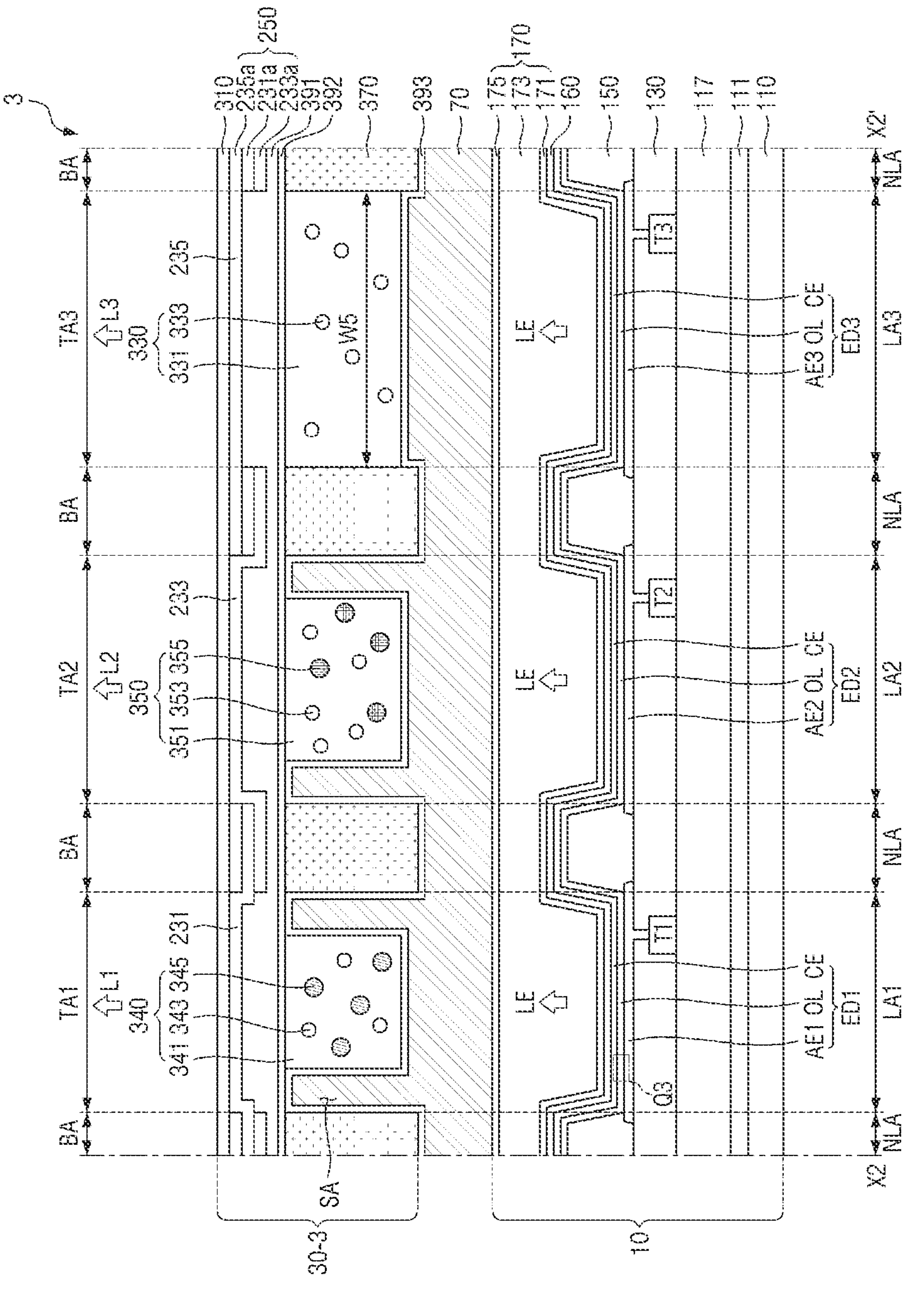
FIG. 13 is a schematic cross-sectional view of a display device according to an embodiment taken along line X2-X2' as another modified example of the color conversion substrate of FIG. 5.

FIG. 13 is a schematic cross-sectional view of a display device 3 according to an embodiment taken along line X2-X2' as another modified example of the color conversion substrate of FIG. 5.

As shown in FIG. 13, a color conversion substrate 30-3 of the display device 3 may not include the separation space SA where the light transmission layer 330 is spaced apart. Unlike the first wavelength conversion pattern layer 340 and the second wavelength conversion pattern layer 350, the light transmission layer 330 does not change a wavelength, and thus light loss due to the change in wavelength may not occur. Therefore, in case that the separation space SA is not present, the light efficiency may not be affected.

As shown in FIGS. 12 and 13, the light transmission layer 330 of the color conversion substrate of the display device may have a width W5 equal to or smaller than the widths of the third emission area LA3 and the third light transmitting area TA3. As described above, since the light transmission layer 330 does not function to change the wavelength, the width of the light transmissive layer 330 of FIG. 13, there may be no difference in the light transmission efficiency in the case where the width of the light transmission layer 330 is the same as the width of the third light transmitting area TA3 as shown in FIG. 13 and in the case where the width of the light transmission layer 330 is smaller than the width of the third light transmitting area TA3 as shown in FIG. 12.

Figure 14:
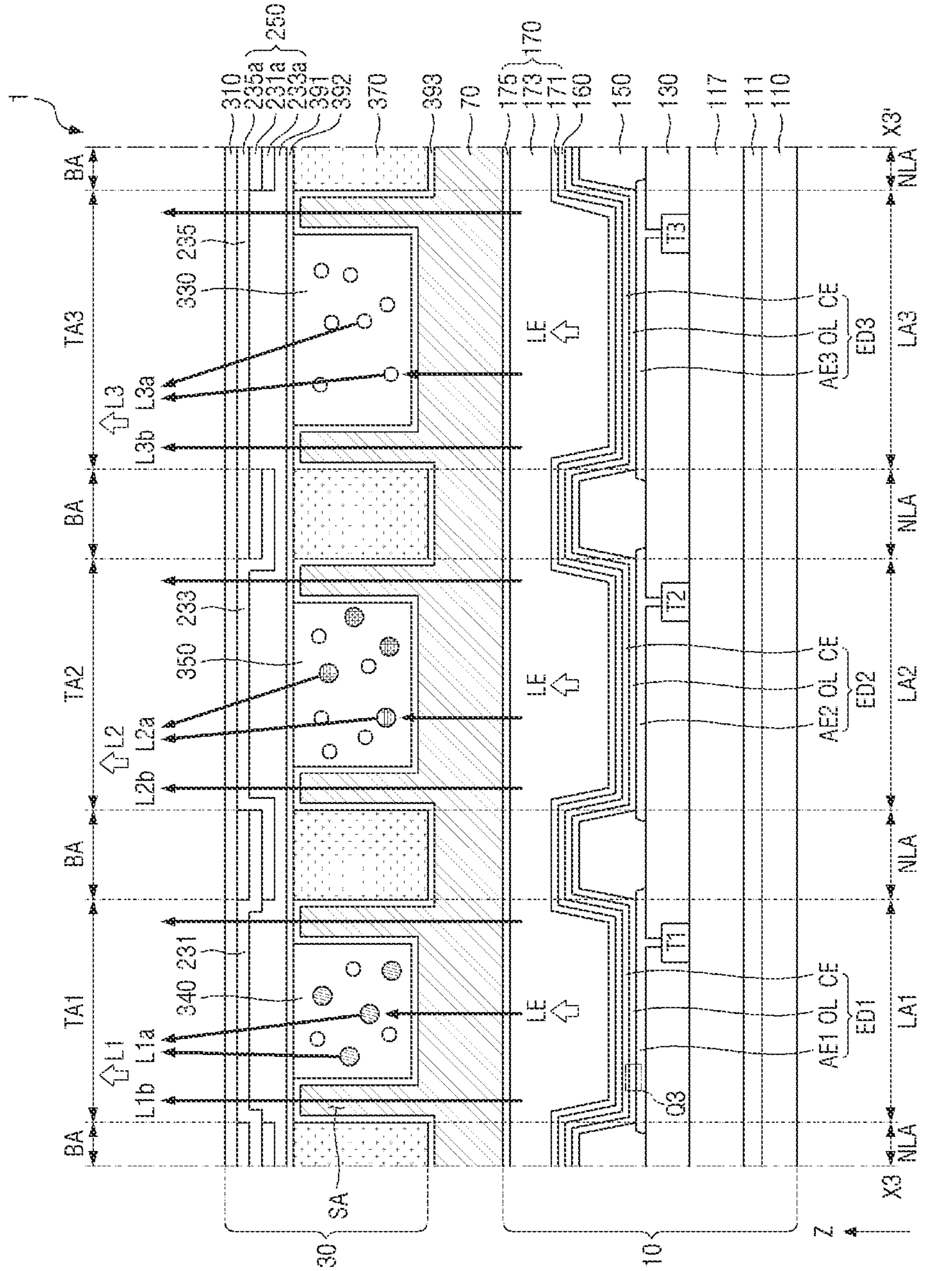
FIG. 14 is a schematic cross-sectional view of the light extraction path of FIG. 9.

FIG. 14 is a schematic cross-sectional view of the light extraction path of FIG. 9.

As shown in FIG. 14, the first emission light L1 may be emitted to the outside of the display device 1 through the first wavelength conversion pattern layer 340 and the first color filter 231, or may be emitted to the outside of the display device 1 through the first color filter 231 after passing through the filler 70 disposed in the separation space SA between the side of the first wavelength conversion pattern layer and the side of the bank pattern layer 370 positioned adjacent thereto. The emission light LE provided from the first light emitting element ED1 may be white light.

In some embodiments, in case that light transmitted through the first color filter 231 after passing through the first wavelength conversion pattern layer 340 is defined as "first_a emission light L1*a*" and light transmitted through the first color filter 231 after passing through the separation space SA is defined as "first_b emission light L1*b*," the first emission light L1 may include both the first_a emission light L1*a* and the first_b emission light L1*b*.

In some embodiments, in case that the first_a emission light L1*a* is changed into a first wavelength (e.g., red) and passes through the first wavelength conversion pattern layer 340, light loss may occur.

In some embodiments, since the first_b emission light L1*b*, which is emitted to the outside of the display device 1 through the first color filter 231 after passing through the separation space SA between the first wavelength conversion pattern layer 340 and the bank pattern layer 370, may be incident (e.g., directly incident) to the first color filter 231 without passing through the first wavelength conversion pattern layer 340, light loss may be decreased. Therefore, the structure, in which the first_b emission light L1*b* passes through the separation space SA, may increase the efficiency of the first emission light L1.

For example, it is possible to increase efficiency of the first emission light L1, e.g., red light emitted to the outside of the display device 1 from the first emission area LA1.

As shown in FIG. 14, the second emission light L2 may be emitted to the outside of the display device 1 through the second wavelength conversion pattern layer 350 and the second color filter 233, or may be emitted to the outside of the display device 1 through the second color filter 233 after passing through the filler 70 disposed in the separation space SA between the side of the second wavelength conversion pattern layer 350 and the side of the bank pattern layer 370 positioned adjacent thereto. The emission light LE provided from the second light emitting element ED2 may be white light as described above.

In some embodiments, in case that light transmitted through the second color filter 233 after passing through the second wavelength conversion pattern layer 350 is defined as "second_a emission light L2*a*" and light transmitted through the second color filter 233 after passing through the separation space SA is defined as "second_b emission light L2*b*," the second emission light L2 may include both the second_a emission light L2*a* and the second_b emission light L2*b*.

In some embodiments, in case that the second_a emission light L2*a* is changed into a second wavelength (e.g., green) and passes through the second wavelength conversion pattern layer 350, light loss may occur.

In some embodiments, since the second_b emission light L2*b*, which is emitted to the outside of the first display device 1 through the second color filter 233 after passing through the separation space SA between the second wavelength conversion pattern layer 350 and the bank pattern layer 370, may be incident (e.g., directly incident) to the second color filter 233 without passing through the second wavelength conversion pattern layer 350, light loss may be decreased. Therefore, the structure in which light passes through the separation space SA may increase the efficiency of the second_b emission light L2*b* emitted to the outside of the display device 1.

For example, it is possible to increase efficiency of the second color light, e.g., green light emitted to the outside of the display device 1 from the second emission area LA2.

As shown in FIG. 14, the third emission light L3 may be emitted to the outside of the display device 1 through the light transmission layer 330 and the third color filter 235, or may be emitted to the outside of the display device 1 through the third color filter 235 after passing through the filler 70 disposed in the separation space SA between the side of the light transmission layer 330 and the side of the bank pattern layer 370 positioned adjacent thereto. The emission light LE provided from the third light emitting element ED3 may be white light.

In some embodiments, in case that light transmitted through the third color filter 235 after passing through the light transmission layer 330 is defined as "third_a emission light L3*a*" and light transmitted through the third color filter 235 after passing through the separation space SA is defined as "third_b emission light L3*b*," the third emission light L3 may include both the third_a emission light L3*a* and the third_b emission light L3*b*.

However, unlike the first emission light L1 and the second emission light L2, since the light transmission layer 330 scatters incident light without changing the wavelength, light loss due to the change in wavelength may not occur similarly to the first_a emission light L1*a* passing through the first wavelength conversion pattern layer 340 and the second_a emission light L2*a* passing through the second wavelength conversion pattern layer 350. For example, the third_a emission light L3*a* and the third_b emission light L3*b* of the third emission light L3 may have the same light efficiency.

Therefore, as shown in FIGS. 13 and 14, the width W5 of the light transmission layer 330 in the horizontal direction may be equal to or smaller than the width of the third emission area LA3. For example, the light transmission layer 330 and the bank pattern layers 370 positioned on sides (e.g., opposite sides) of the light transmission layer 330 may include or may not include the separation space SA. For simplicity of the process, the light transmission layer 330 and the bank pattern layers 370 may be manufactured to have a shape of separated patterns. In another example, the light transmission layer 330 and the bank pattern layers 370 may be manufactured without separation.

In some embodiments, blue light efficiency may be adjusted by adjusting the content of the third scatters 333 of the light transmission layer 330 for each of cases where the separation space SA is provided between the light transmission layer 330 and the bank pattern layer 370 and where the separation space SA is not provided therebetween. For example, there may be or may not be a difference in blue light efficiency between the case where the separation space SA is provided between the light transmission layer 330 and the bank pattern layer 370 and the case where the separation space SA is not provided therebetween.

Figure 15:
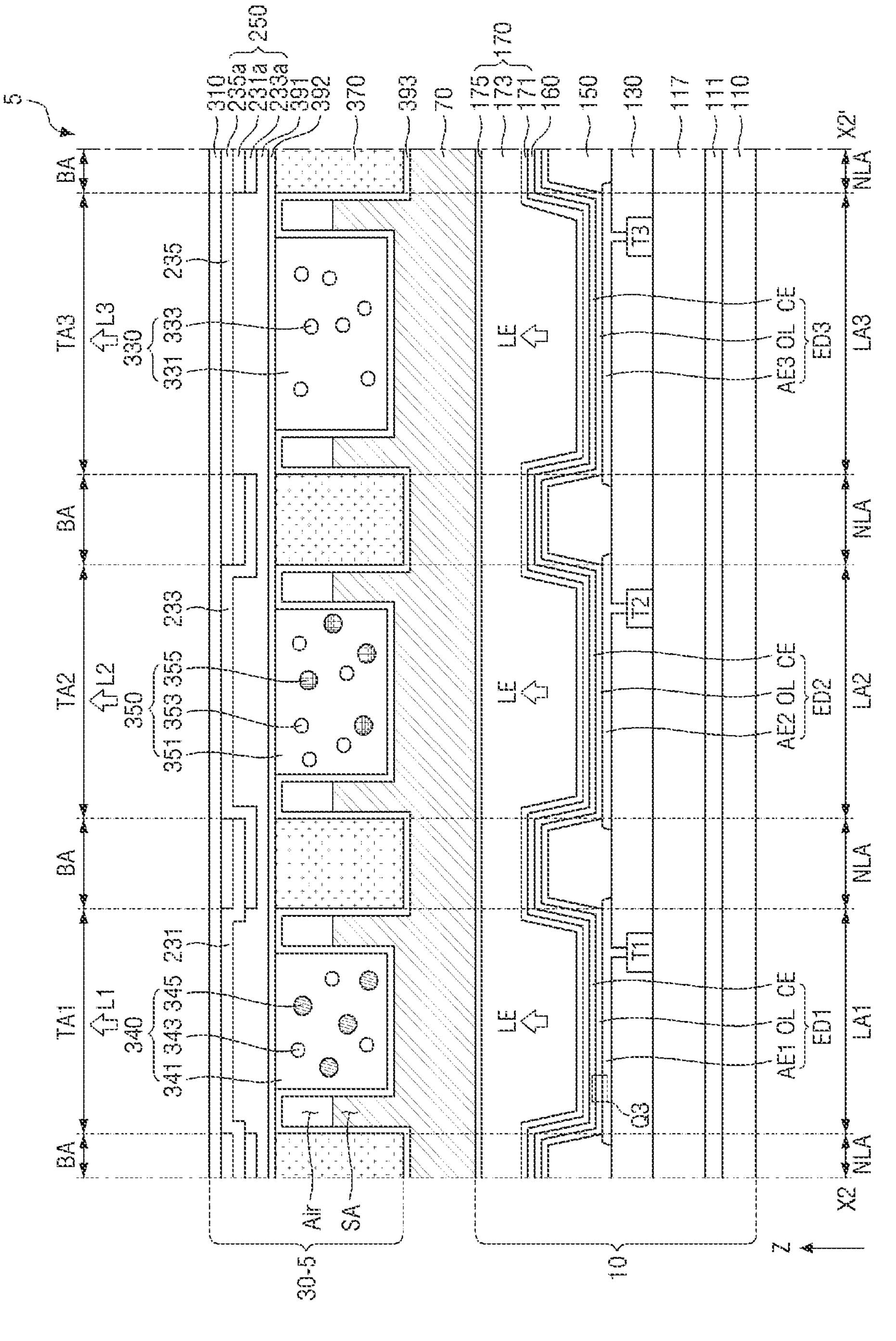
FIG. 15 is a schematic cross-sectional view of a display device according to an embodiment taken along line X2-X2' as another modified example of the color conversion substrate of FIG. 5.
Figure 16:
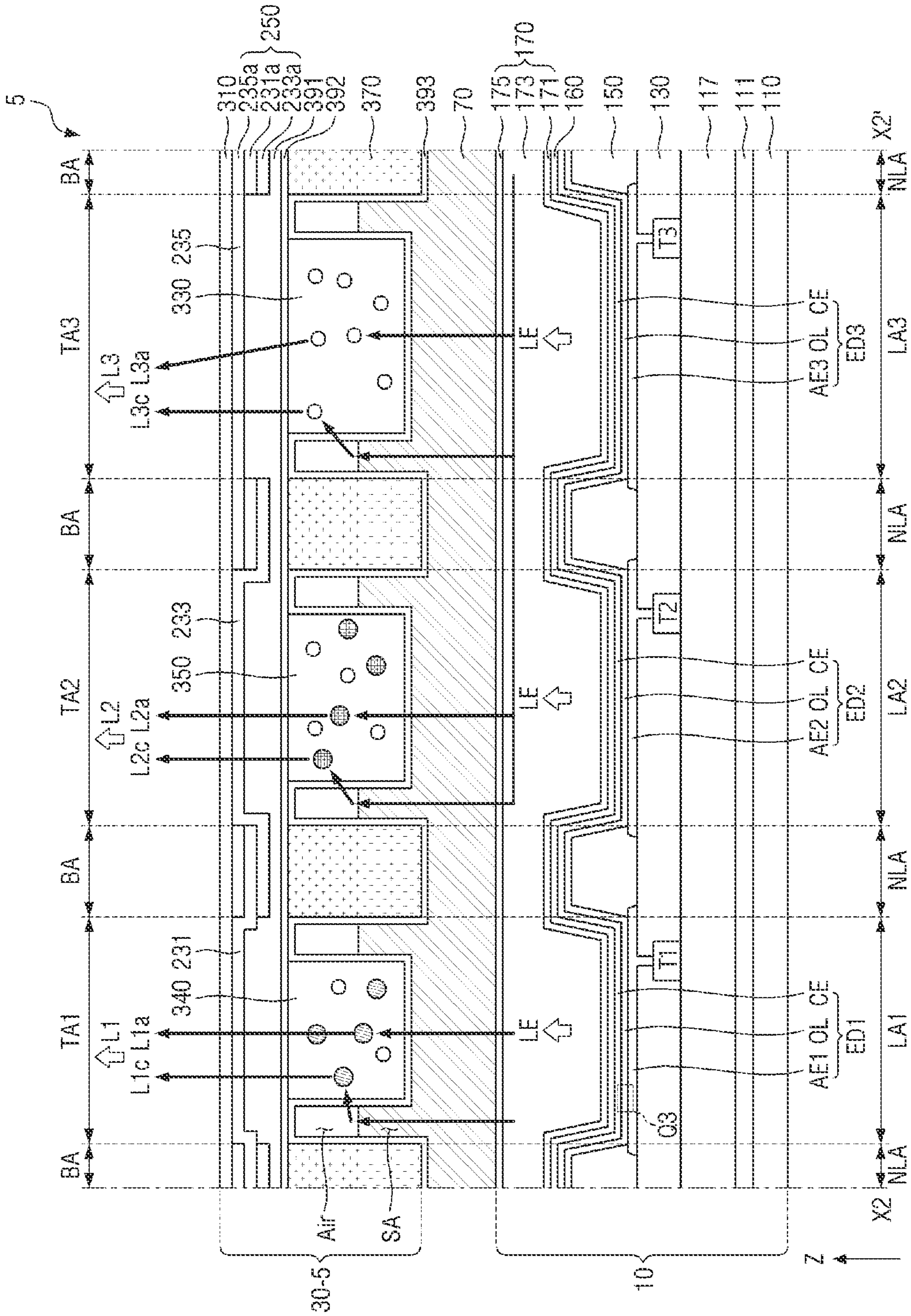
FIG. 16 is a schematic cross-sectional view of a light extraction path of the display device of FIG. 15.

FIG. 15 is a schematic cross-sectional view of a display device 5 according to an embodiment taken along line X2-X2' as another modified example of the color conversion substrate of FIG. 5. FIG. 16 is a schematic cross-sectional view of a light extraction path of the display device 5 of FIG. 15.

As shown in FIG. 15, in a color conversion substrate 30-5, the separation space SA may be defined between the sides of the first wavelength conversion pattern layer 340, the second wavelength conversion pattern layer 350 and the light transmission layer 330 and the side of each of the bank pattern layers 370 disposed to be spaced apart therefrom at sides (e.g., opposite sides), and an air layer Air in which the filler 70 is not disposed may be further filled in the separation space SA.

FIG. 15 shows that the air layer Air is filled on a surface of the capping layer 393 to overlap the separation space SA, but embodiments are not limited thereto. In some embodiments, the air layer Air may be disposed in the Z-axis direction along the side surface of the bank pattern layer 370 that is disposed to face the wavelength conversion pattern layers 340 and 350 and the light transmission layer 330.

As shown in FIG. 16, the first to third emission lights L1, L2, and L3 may pass through the first wavelength conversion pattern layer 340, the second wavelength conversion pattern layer 350, and the light transmission layer 330, and the color filters 231, 233, and 235 to be emitted to the outside of the display device 5, or may pass through the filler 70 and the air layer Air disposed in the separation space SA between the sides of the wavelength conversion pattern layers 340 and 350 and the light transmission layer 330 and the side of the bank pattern layer 370 disposed adjacent thereto, change their path to the first wavelength conversion pattern layer 340, the second wavelength conversion pattern layer 350, and the light transmission layer 330, and pass through the color filters 231, 233, and 235 to be emitted to the outside of the display device 5. As described above, the emission light LE provided from the light emitting elements ED1, ED2, and ED3 may be white light.

In some embodiments, the first to third emission lights L1, L2, and L3 may include all of first_a, second_a, and third_a emission lights L1*a*, L2*a*, and L3*a* that pass through the wavelength conversion pattern layers 340 and 350 and the light transmission layer 330, and first_c, second_c, and third_c emission lights L1*c*, L2*c*, and L3*c* that pass through the filler 70 and the air layer Air of the separation space SA.

In some embodiments, the air layer Air disposed in the separation space SA may change the optical path of the emission light LE passing through the filler 70 in the separation space SA or being incident to and extinguished in the bank pattern layer 370 without passing through the wavelength conversion pattern layers 340 and 350 and the light transmission layer 330 after being emitted from the light emitting elements ED1, ED2, and ED3, so that it may be incident to the wavelength conversion pattern layers 340 and 350 and the light transmission layer 330.

In some embodiments, as described above, in case that the optical path is changed to increase the amount of emission light LE incident to the wavelength conversion pattern layers 340 and 350 and the light transmission layer 330, the efficiency of the first to third emission lights L1, L2, and L3 that pass through the color filters 231, 233, and 235 to be emitted to the outside of the display device 5 may be enhanced.

In another example, the light transmission layer 330 of the display device 5 having the structure, in which the separation space SA is defined between the sides of the first wavelength conversion pattern layer 340, the second wavelength conversion pattern layer 350, and the light transmission layer 330 and the side of each of the bank pattern layers 370 disposed to be spaced apart therefrom at sides (e.g., opposite sides), and the filler 70 and the air layer Air are together filled in the separation space SA, may include the structure of the light transmission layer 330 of FIG. 13.

For example, the light transmission layer 330 of the display device 5 may or may not include the separation space SA. For simplicity of the process, the light transmission layer 330 may be manufactured to have a shape of separated patterns. In another example, the light transmission layer 330 may be manufactured without separation.

For example, the light transmission layer 330 of the color conversion substrate 30-5 of the display device 5 may have the width W5 substantially equal to the widths of the third emission area LA3 and the third light transmitting area TA3.

Other configurations are the same as those described above with reference to FIGS. 9 to 16, and thus, detailed descriptions thereof will be omitted for descriptive convenience.

Figure 17:
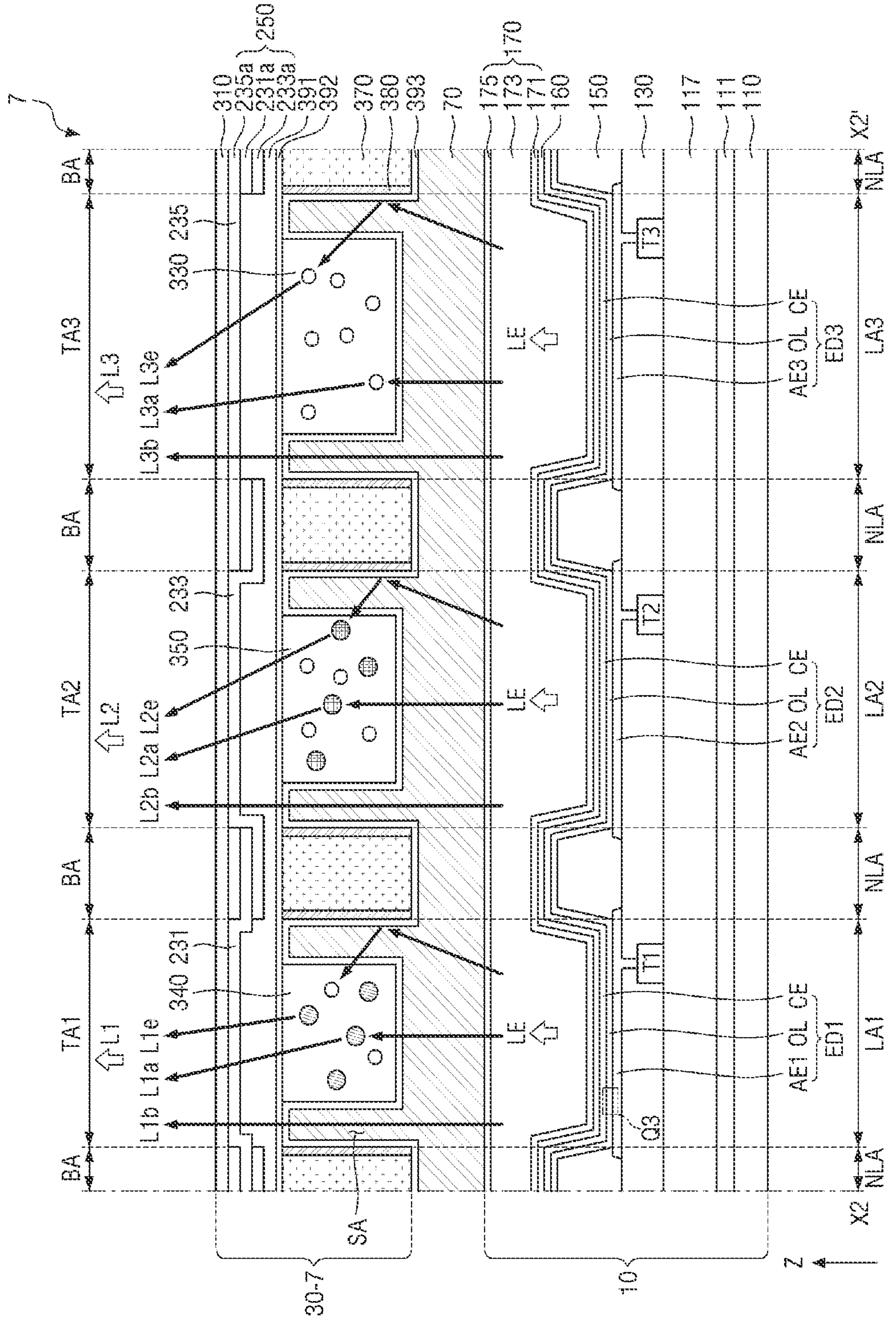
FIG. 17 shows a light extraction path and a cross-sectional view of a display device according to an embodiment, taken along line X2-X2' of the color conversion substrate of FIG. 5, as yet another modified example.

FIG. 17 shows a light extraction path and a schematic cross-sectional view of a display device according to an embodiment, taken along line X2-X2' of the color conversion substrate of FIG. 5, as yet another modified example.

As shown in FIG. 17, a reflection layer 380 may be provided on the side surface of the bank pattern layer 370 that overlaps the non-emission area NLA and faces the first wavelength conversion pattern layer 340, the second wavelength conversion pattern layer 350, and the light transmission layer 330.

In some embodiments, the reflection layer 380 may be a metal layer including at least one of Ag, Mg, Al, Pt, Pd, Au, Ni, Nd, Ir, or Cr.

Referring to FIG. 17, it is illustrated that the capping layer 393 covers both the bank pattern layer 370 and the reflection layer 380, but embodiments are not limited thereto. The capping layer 393 may be disposed on the bank pattern layer 370 to cover it and the reflection layer 380 may be disposed (e.g., directly disposed) on the side surface of the capping layer 393.

As shown in FIG. 17, the emission light LE may include all of first_a, second_a, and third_a emission lights L1*a*, L2*a*, and L3*a*, which pass through the first wavelength conversion pattern layer 340, the second wavelength conversion pattern layer 350, and the light transmission layer 330 and are incident to the color filter to be emitted to the outside of the display device 7, first_b, second_b, and third_b emission lights L1*b*, L2*b*, and L3*b* that travel (or transmit) straight into the separation space SA and are incident to the color filter to be emitted to the outside of the display device 7, and first_e, second_e, and third_e emission lights L1*e*, L2*e*, and L3*e* that are reflected by the reflection layer 380 and incident to the first wavelength conversion pattern layer 340, the second wavelength conversion pattern layer 350, and the light transmission layer 330 or are reflected by the reflection layer 380 and incident (e.g., directly incident) to the color filter to be emitted to the outside of the display device 7.

In some embodiments, in case that the reflection layer 380 is provided, the optical path of the emission light LE being incident to and extinguished in the bank pattern layer 370 may be changed to be incident to the wavelength conversion pattern layers 340 and 350 and the light transmission layer 330. Accordingly, in case that the amount of the emission light LE incident to the wavelength conversion pattern layers 340 and 350 and the light transmission layer 330 increases, the efficiency of the emission lights L1, L2, and L3 passing through the color filters 231, 233, and 235 to be emitted to the outside of the display device 7 may be enhanced.

In some embodiments, as shown in FIG. 17, the first_b, second_b, and third_b emission lights L1*b*, L2*b*, and L3*b*, which are incident (e.g., directly incident) to the color filter after passing through the separation space SA, and the first_e, second_e, and third_e emission lights L1*e*, L2*e*, and L3*e*, which are incident (e.g., directly incident) to the color filter after being reflected by the reflection layer 380, may compensate for light loss, thereby increasing the efficiency of the first, second, and third emission lights L1, L2, and L3 emitted to the outside of the display device 7.

In another example, the light transmission layer 330 of the display device 7, which includes the reflection layer 380 on the side surface of the bank pattern layer 370 facing the first wavelength conversion pattern layer 340, the second wavelength conversion pattern layer 350, and the light transmission layer 330, may include the structure of the light transmission layer 330 of FIG. 13.

For example, the light transmission layer 330 of the display device 7 may or may not include the separation space SA. For simplicity of the process, the light transmission layer 330 may be manufactured to have a shape of separated patterns. In another example, the light transmission layer 330 may be manufactured without separation.

The width W5 of the light transmission layer 330 of a color conversion substrate 30-7 of the display device 7 may be substantially equal to the widths of the third emission area LA3 and the third light transmitting area TA3.

Other configurations are the same as those described above with reference to FIGS. 9 to 16, and thus, detailed descriptions thereof will be omitted for descriptive convenience.

In another example, as shown in FIG. 16, the air layer Air and the filler 70 may be provided together in the separation space SA of the display device 7 including the reflection layer 380.

As described above, in case that the air layer Air and the reflection layer 380 are provided, the optical path of the emission light LE that is incident to and extinguished in the bank pattern layer 370 may be changed to be incident to the wavelength conversion pattern layers 340 and 350 and the light transmission layer 330.

In some embodiments, as described above, in case that the optical path is changed, and thus the amount of the emission light LE incident to the wavelength conversion pattern layers 340 and 350 and the light transmission layer 330 increases, the efficiency of the emission lights L1, L2, and L3 passing through the color filters 231, 233, and 235 to be emitted to the outside of the display device 7 may be enhanced.

In another example, the light transmission layer 330 of the display device 7 including the reflection layer 380 and the air layer Air and the filler 70 in the separation space SA may include the structure of the light transmission layer 330 of FIG. 13.

Other configurations are the same as those described above with reference to FIGS. 9 to 16, and thus, detailed descriptions thereof will be omitted for descriptive convenience.

Figure 18:
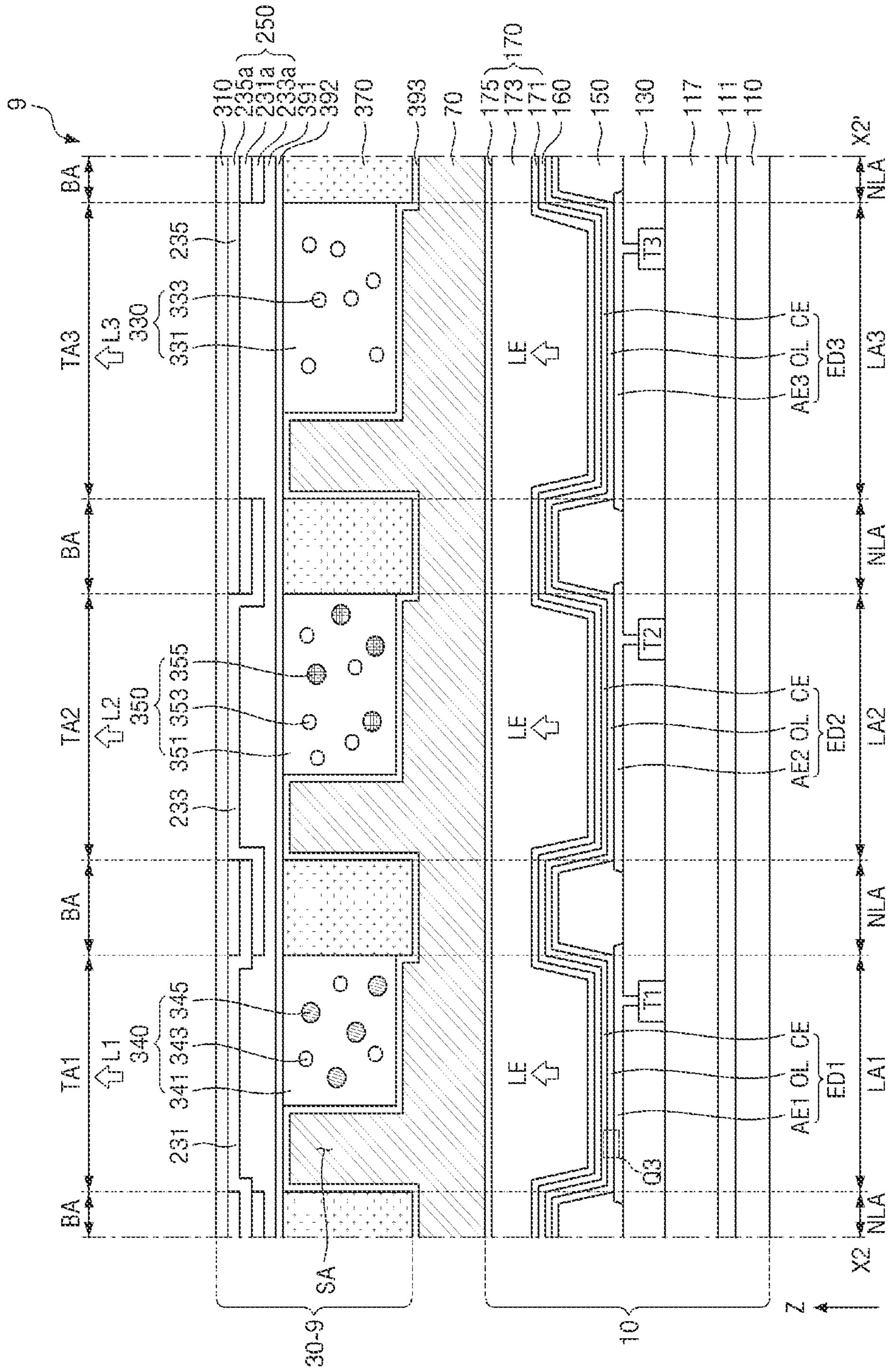
FIG. 18 is a schematic cross-sectional view of a display device according to an embodiment taken along line X2-X2' as yet another modified example of the color conversion substrate of FIG. 5.

FIG. 18 is a schematic cross-sectional view of a display device 9 according to an embodiment taken along line X2-X2' as yet another modified example of the color conversion substrate of FIG. 5.

As shown in FIG. 18, there is a difference in which the first wavelength conversion pattern layer 340, the second wavelength conversion pattern layer 350, and the light transmission layer 330 are arranged such that a side surfaces thereof may be in contact with (e.g., in direct contact with) the bank pattern layer 370, and another side surfaces thereof may be spaced apart from the bank pattern layer 370.

FIG. 18 shows a structure in which the contact is made at the side of the first direction, but embodiments are not limited thereto. For example, the first wavelength conversion pattern layer 340, the second wavelength conversion pattern layer 350, and the light transmission layer 330 may be arranged to be in contact with the bank pattern layer 370 at the another side of the first direction and to be spaced apart from the bank pattern layer 370 at a side of the first direction.

For example, as described with reference to FIG. 14, the emission light LE may pass through the wavelength conversion pattern layers 340 and 350 and the light transmission layer 330, and may be emitted to the outside of the display device 9 through the color filters 231, 233, and 235, or may pass through the filler 70 disposed in the separation space SA and may be emitted to the outside of the display device 9 through the color filters 231, 233, and 235.

As described above, the emission light LE provided from the light emitting elements ED1, ED2, and ED3 may be white light.

In another example, the light transmission layer 330 of the display device 9, in which the first wavelength conversion pattern layer 340, the second wavelength conversion pattern layer 350, and the light transmission layer 330 are arranged such that a side surfaces thereof are in contact with (e.g., in direct contact with) the bank pattern layer 370 and another side surfaces thereof are spaced apart from the bank pattern layer 370, may include the structure of the light transmission layer 330 of FIG. 13.

For example, the light transmission layer 330 of the display device 9 including the reflection layer 380 in the separation space SA may or may not include the separation space SA. For simplicity of the process, the light transmission layer 330 may be manufactured to have a shape of separated patterns. In another example, the light transmission layer 330 may be manufactured without separation.

For example, the light transmission layer 330 of a color conversion substrate 30-9 of the display device 9 may have the width W5 substantially equal to the widths of the third emission area LA3 and the third light transmitting area TA3.

Other configurations are the same as those described above with reference to FIGS. 9 to 14, and thus, detailed descriptions thereof will be omitted for descriptive convenience.

In another example, the display device 9, in which the first wavelength conversion pattern layer 340, the second wavelength conversion pattern layer 350, and the light transmission layer 330 are arranged such that a side surfaces thereof are in contact with (e.g., in direct contact with) the bank pattern layer 370 and another side surfaces thereof are spaced apart from the bank pattern layer 370, may include the air layer Air and the filler 70 together in the separation space SA as shown in FIG. 16.

As described above, in case that the air layer Air is provided, the optical path of the emission light LE that is incident to and extinguished in the bank pattern layer 370 may be changed to be incident to the wavelength conversion pattern layers 340 and 350 and the light transmission layer 330.

Other configurations are the same as those described above with reference to FIGS. 9 to 16, and thus, detailed descriptions thereof will be omitted for descriptive convenience.

In another example, the light transmission layer 330 of the display device 9, which includes the structure in which the first wavelength conversion pattern layer 340, the second wavelength conversion pattern layer 350, and the light transmission layer 330 are arranged such that a side surfaces thereof are in contact with (e.g., in direct contact with) the bank pattern layer 370 and another side surfaces thereof are spaced apart from the bank pattern layer 370, and the air layer Air and the filler 70 in the separation space SA, may include the structure of the light transmission layer 330 of FIG. 13.

For example, the light transmission layer 330 of the display device 9, which includes the structure in which the first wavelength conversion pattern layer 340, the second wavelength conversion pattern layer 350, and the light transmission layer 330 are arranged such that a side surfaces thereof are in contact with (e.g., in direct contact with) the bank pattern layer 370 and another side surfaces thereof are spaced apart from the bank pattern layer 370, may or may not include the separation space SA. For simplicity of the process, the light transmission layer 330 may be manufactured to have a shape of separated patterns. In another example, the light transmission layer 330 may be manufactured without separation.

Other configurations are the same as those described above with reference to FIGS. 9 to 16, and thus, detailed descriptions thereof will be omitted for descriptive convenience.

Figure 19:
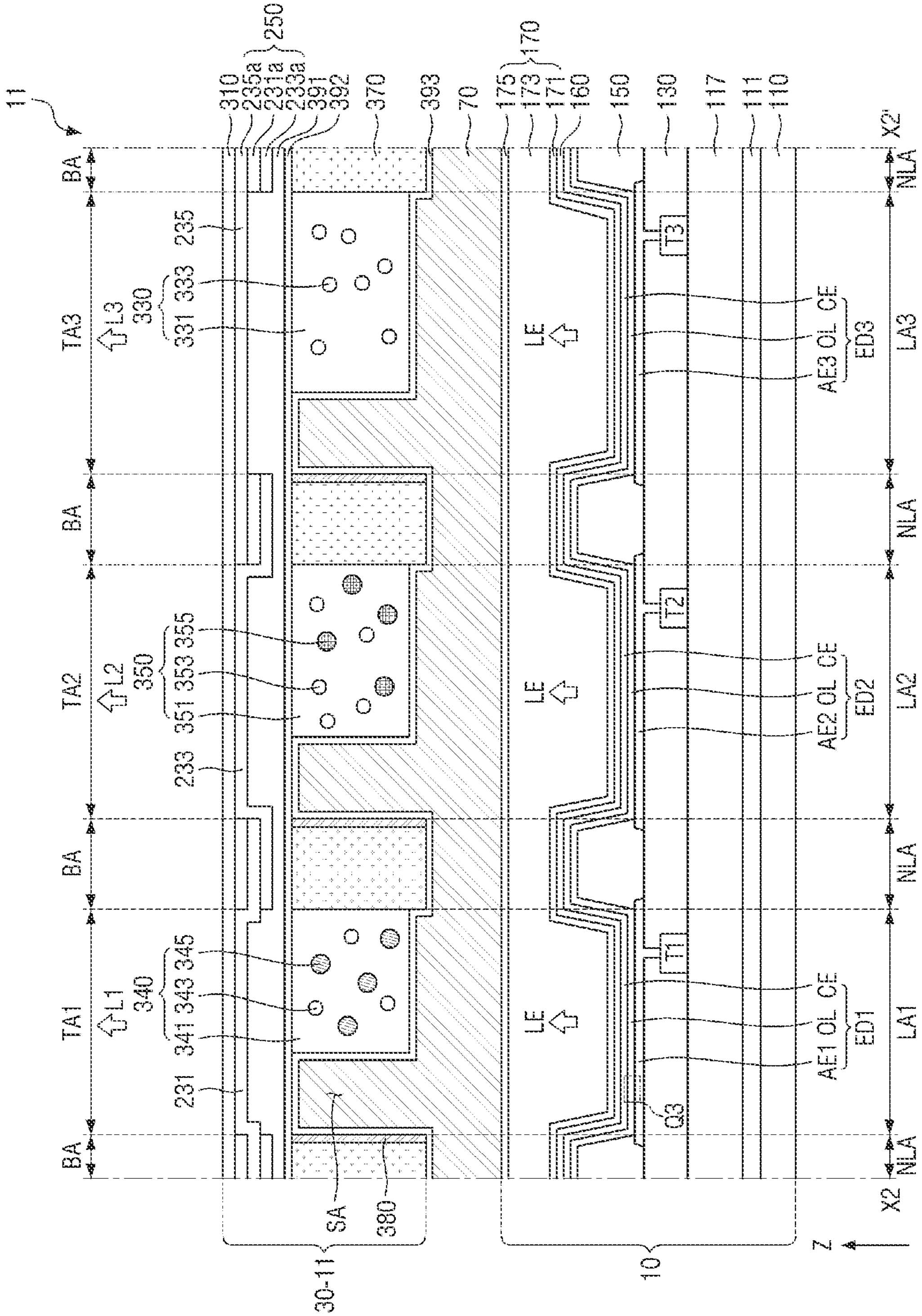
FIG. 19 is a schematic cross-sectional view of a display device 11 according to an embodiment taken along line X2-X2' as yet another modified example of the color conversion substrate of FIG. 5.

FIG. 19 is a schematic cross-sectional view of a display device 11 according to an embodiment taken along line X2-X2' as yet another modified example of the color conversion substrate of FIG. 5.

As shown in FIG. 19, the display device 11, in which a side surfaces of the first wavelength conversion pattern layer 340, the second wavelength conversion pattern layer 350, and the light transmission layer 330 are in contact with (e.g., in direct contact with) the bank pattern layer 370, and another side surfaces thereof are spaced apart from the bank pattern layer 370, may include the reflection layer 380 disposed (e.g., directly disposed) on the bank pattern layer 370 disposed with a space.

Other configurations are the same as those described above with reference to FIGS. 9 to 18, and thus, detailed descriptions thereof will be omitted for descriptive convenience.

In another example, the light transmission layer 330 of the display device 11, in which side surfaces of the first wavelength conversion pattern layer 340, the second wavelength conversion pattern layer 350, and the light transmission layer 330 are in contact with (e.g., in direct contact with) the bank pattern layer 370, another side surfaces thereof are spaced apart from the bank pattern layer 370, and the reflection layer 380 is disposed (e.g., directly disposed) on the bank pattern layer 370 disposed with a space, may or may not include the separation space SA as shown in FIG. 13.

Other configurations are the same as those described above with reference to FIGS. 9 to 18, and thus, detailed descriptions thereof will be omitted for descriptive convenience.

In another example, the display device 11 may include the air layer Air and the filler 70 in the separation space SA. As shown in FIG. 13, the light transmission layer 330 of the modified display device 11 may or may not include the separation space SA.

Other configurations are the same as those described above with reference to FIGS. 9 to 18, and thus, detailed descriptions thereof will be omitted for descriptive convenience.

FIGS. 20 to 25 show a display device according to an embodiment.

Figure 20:
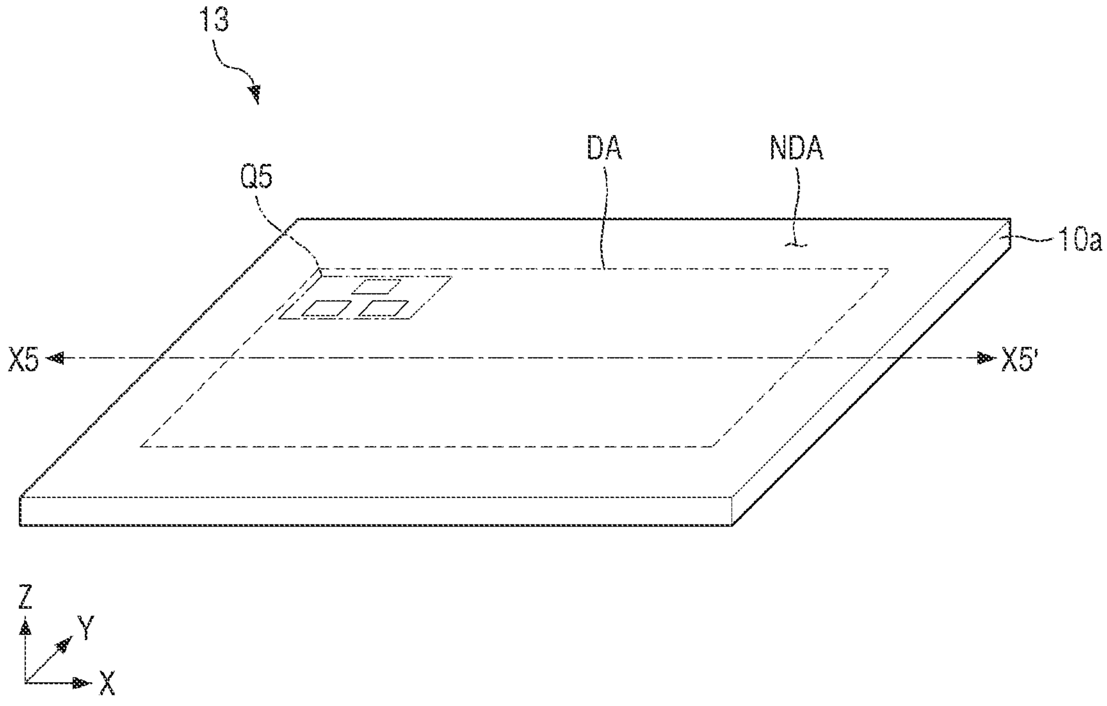
FIG. 20 is a schematic perspective view of a display device according to an embodiment.
Figure 21:
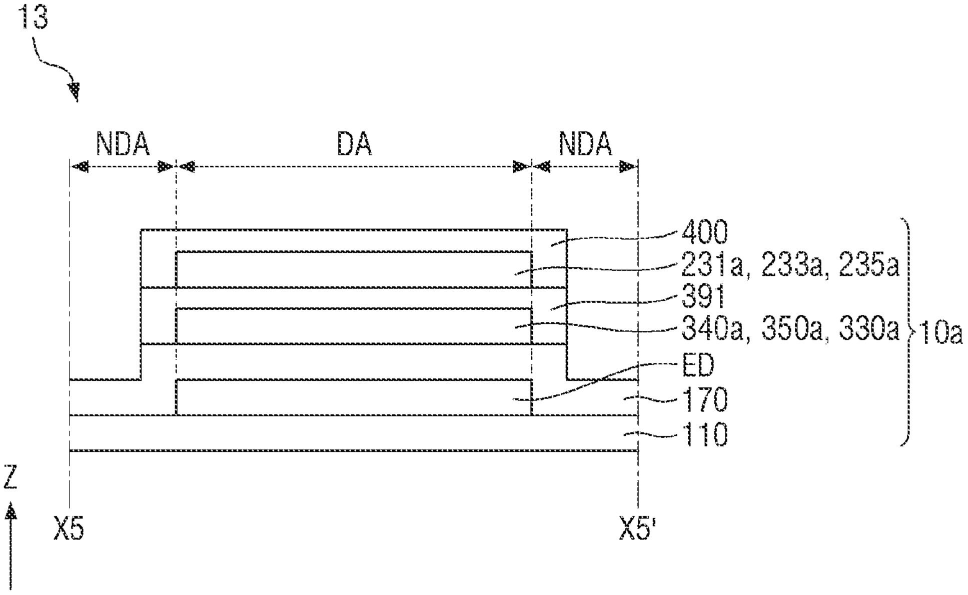
FIG. 21 is a schematic cross-sectional view of the display device taken along line X5-X5' of FIG. 20.

FIG. 20 is a schematic perspective view of a display device according to an embodiment, and FIG. 21 is a schematic cross-sectional view of the display device taken along line X5-X5' of FIG. 20.

Figure 22:
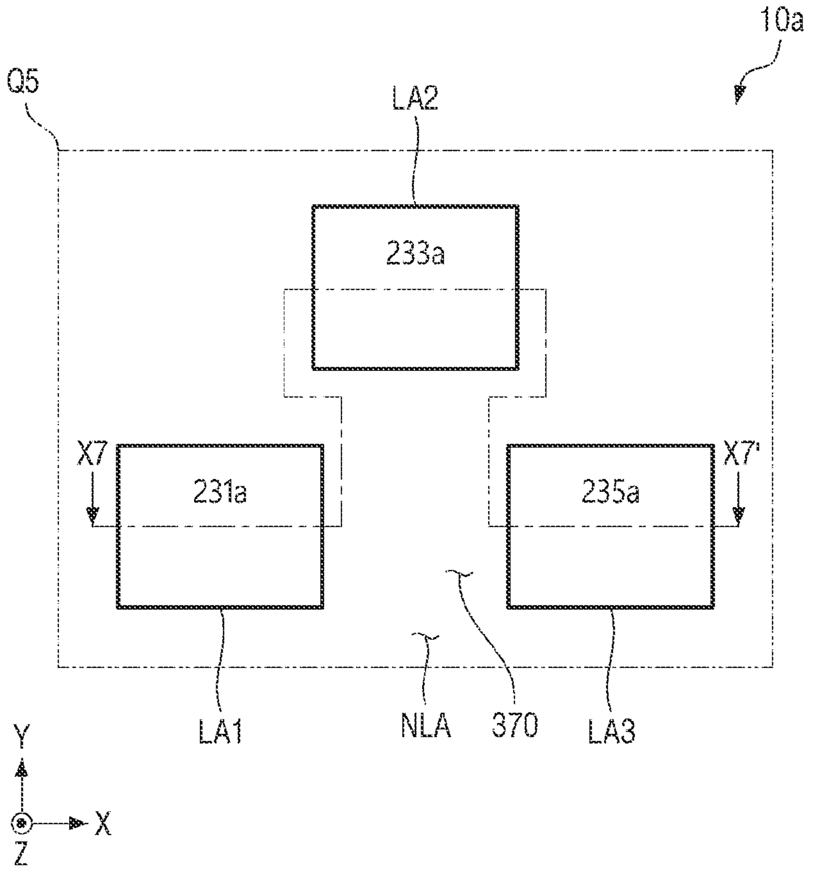
FIG. 22 is an enlarged schematic plan view of a part Q5 of FIG. 20, and is a schematic plan view of the display substrate included in the display device of FIG. 21.
Figure 23:
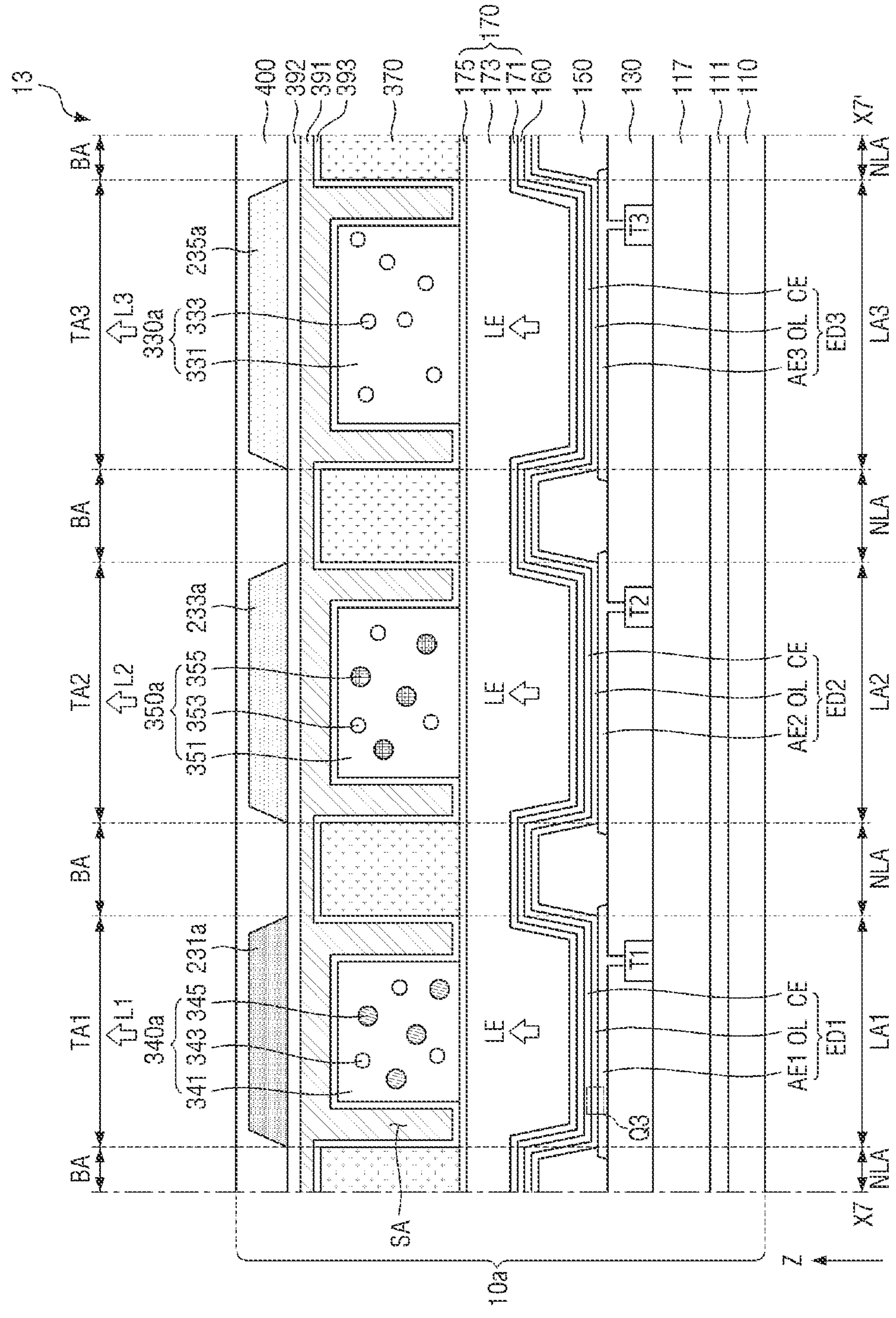
FIG. 23 is a schematic cross-sectional view of the display device taken along line X7-X7' of FIG. 22.

FIG. 22 is an enlarged schematic plan view of a part Q5 of FIG. 20, and is a schematic plan view of a display substrate included in the display device of FIG. 21. FIG. 23 is a schematic cross-sectional view of the display device taken along line X7-X7' of FIG. 22.

As shown in FIG. 20, a display device 13 is different from the display device 1, in which the display substrate 10 and the color conversion substrate 30 are bonded together by using the sealing portion 50, in that it has a structure in which all upper structures are stacked on the first base portion 110 of a display substrate 10*a*. For example, there is a difference in which the display device 1 has a structure in which two substrates are bonded together, and the display device 13 has a structure in which a single substrate is used.

As shown in FIG. 21, in a schematic stacked structure of the display substrate 10*a* included in the display device 13, the light emitting element ED may be positioned on the first base portion 110, and the thin film encapsulation layer 170 may be positioned on the light emitting element ED to cover the light emitting element ED. Wavelength conversion pattern layers 340*a* and 350*a* and a light transmission layer 330*a* overlapping the light emitting element ED may be positioned on the thin film encapsulation layer 170, the low refractive layer 391 may be positioned on the wavelength conversion pattern layers 340*a* and 350*a* and the light transmission layer 330*a* to cover the wavelength conversion pattern layers 340*a* and 350*a* and the light transmission layer 330*a*, and color filters 231*a*, 233*a*, and 235*a* overlapping the emission areas LA1, LA2 and LA3 and an overcoating layer 400 covering the color filters 231*a*, 233*a*, and 235*a* may be positioned on the low refractive layer 391.

As mentioned above, the display device 13 is different from the display device 1 in that it does not separately include the color conversion substrate 30 and has a structure in which all structures are stacked on the display substrate 10*a*.

FIG. 22 is an enlarged schematic plan view of the part Q5 of FIG. 20, and is a schematic plan view of the display substrate 10*a* included in the display device 13 of FIG. 21.

As shown in FIG. 22, the emission areas LA1, LA2, and LA3 and the non-emission area NLA may be defined on the display substrate 10*a*. The non-emission area NLA may overlap the light blocking area BA including the bank pattern layer 370. For example, the area where the non-emission area NLA is disposed may be the same as the area where the light blocking area BA is disposed.

In some embodiments, the color filters 231*a*, 233*a*, and 235*a* may be disposed to overlap the emission areas LA1, LA2, and LA3. Referring to FIG. 22, the emission areas LA1, LA2, and LA3 may be areas in which light emitted from the light emitting elements ED1, ED2, and ED3 is disposed to the outside of the display device 13 through the color filters 231*a*, 233*a*, and 235*a*. The non-emission area NLA may overlap the light blocking area BA, and the light blocking area BA may be an area through which light emitted from the display substrate 10*a* does not pass.

In the display device 13, the first emission area LA1, the second emission area LA2, and the third emission area LA3 may be defined on the display substrate 10*a*, the first wavelength conversion pattern layer 340*a*, the second wavelength conversion pattern layer 350*a*, and the light transmission layer 330*a* may be disposed in the emission areas and may overlap them, and the first color filter 231*a*, the second color filter 233*a*, and the third color filter 235*a* may be defined on the wavelength conversion pattern layers 340*a* and 350*a* and the light transmission layer 330*a* and may overlap them.

The display device 1 is different from the display device 13 in that the first emission area LA1, the second emission area LA2, and the third emission area LA3 are defined on the display substrate 10, and the first light transmitting area TA1, the second light transmitting area TA2, and the third light transmitting area TA3 are defined on the color conversion substrate 30.

As shown in FIG. 23, in the display device 13, the bank pattern layer 370, the first wavelength conversion pattern layer 340*a*, the second wavelength conversion pattern layer 350*a*, and the light transmission layer 330*a* may be disposed (e.g., directly disposed) on the thin film encapsulation layer 170.

Since structures below the thin film encapsulation layer 170 have been described in the display device 1, differences between the display device 1 and the display device 13 will be described below.

The bank pattern layers 370 may be disposed to overlap the non-emission area NLA and may be spaced apart from sides (e.g., opposite sides) of the wavelength conversion pattern layers 340*a* and 350*a* and the light transmission layer 330*a* in the first direction. The wavelength conversion pattern layers 340*a* and 350*a* and the light transmission layer 330*a* may overlap the emission area and may be positioned between the bank pattern layers 370 and may be spaced apart therefrom. The separation space SA may be defined between the bank pattern layer 370, and each of the wavelength conversion pattern layers 340*a* and 350*a* and the light transmission layer 330*a*.

In some embodiments, the wavelength conversion pattern layers 340*a* and 350*a* and the light transmission layer 330*a* may be manufactured by a photolithography process. In case that the wavelength conversion pattern layers 340*a* and 350*a* and the light transmission layer 330*a* are manufactured by a photolithography process, the arrangement shape thereof spaced apart from the bank pattern layer 370 may be readily manufactured. FIG. 22 illustrates the shapes of the wavelength conversion pattern layers 340*a* and 350*a* and the light transmission layer 330*a* as rectangles, but embodiments are not limited thereto. For example, it may include all shapes that are manufactured by a photolithography process, such as a trapezoid, a rounded rectangle, and a semicircle.

The capping layer 393 may be disposed on the bank pattern layer 370, the wavelength conversion pattern layers 340*a* and 350*a*, and the light transmission layer 330*a* to cover them.

In some embodiments, the capping layer 393 may cover the outer surface of the bank pattern layer 370 in the non-emission area NLA, and may cover the side surface of the bank pattern layer 370 and the outer surfaces of the first wavelength conversion pattern layer 340*a*, the second wavelength conversion pattern layer 350*a*, and the light transmission layer 330*a* in the emission area LA.

Since a detailed description of the capping layer 393 has been made above, description thereof will be omitted for descriptive convenience.

In some embodiments, the low refractive layer 391 may be disposed on the capping layer 393 that covers the bank pattern layer 370, the wavelength conversion pattern layers 340*a* and 350*a*, and the light transmission layer 330*a*. The low refractive layer 391 may also be filled in the separation space SA between the side of the bank pattern layer 370 and the sides of the wavelength conversion pattern layer and the light transmission layer.

In some embodiments, the low refractive layer 391 may be formed of a mixture of an organic material and an inorganic material. For example, the inorganic material of the low refractive layer 391 may include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, or the like, and the organic material of the low refractive layer 391 may be formed of acrylic resin, methacrylic resin, polyisoprene, vinyl resin, epoxy resin, urethane resin, cellulose resin, perylene resin or the like.

In some embodiments, the refractive index of the low refractive layer 391, which is made of a mixture of an organic material and an inorganic material, may be about 1.2. Hollow particles may be formed in the low refractive layer to lower the refractive index of the low refractive layer 391.

In some embodiments, the mixing ratio of organic materials of the low refractive layer 391 included in the display substrate 10*a* of the display device 13 may be higher than the mixing ratio of the organic materials of the low refractive layer 391 included in the display substrate 10 of the display device 1.

In some embodiments, a surface of the capping layer 393 in the separation space SA may be in contact with (e.g., in direct contact with) the thin film encapsulation layer 170, and another surface thereof opposite to the surface in contact with (e.g., in direct contact with) the thin film encapsulation layer 170 may be in contact with (e.g., in direct contact with) the low refractive layer 391.

The low refractive capping layer 392 may be disposed on the low refractive layer 391.

In some embodiments, the low refractive layer 391 may also be disposed between the low refractive capping layer 392 and the bank pattern layer 370, and between the low refractive capping layer 392 and the first wavelength conversion pattern layer 340*a*, the second wavelength conversion pattern layer 350*a*, and the light transmission layer 330*a*.

The first color filter 231*a*, the second color filter 233*a*, and the third color filter 235*a* overlapping the emission area may be disposed on the low refractive capping layer 392.

The overcoating layer 400 may be disposed on the color filters 231*a*, 233*a*, and 235*a*. The overcoating layer 400 may cover the color filters 231*a*, 233*a*, and 235*a*, and may be formed of acrylic resin, methacrylic resin, polyisoprene, vinyl resin, epoxy resin, urethane resin, cellulose resin, perylene resin or the like.

In another example, the display device 13 may include the reflection layer 380 disposed on the side surface of the bank pattern layer 370 that is disposed to face the first wavelength conversion pattern layer 340*a*, the second wavelength conversion pattern layer 350*a*, and the light transmission layer 330*a*.

The reflection layer 380 may be disposed (e.g., directly disposed) on the side surface of the bank pattern layer 370 and the capping layer 393 may cover (e.g., directly cover) both the bank pattern layer 370 and the reflection layer 380. In another example, the bank pattern layer 370 and the capping layer 393 covering it may be disposed, and the reflection layer 380 may be disposed (e.g., directly disposed) on the side surface of the capping layer 393 covering the bank pattern layer 370.

Other detailed configurations are the same as those described above with reference to FIGS. 9 to 19, and thus, detailed descriptions thereof will be omitted for descriptive convenience.

Figure 24:
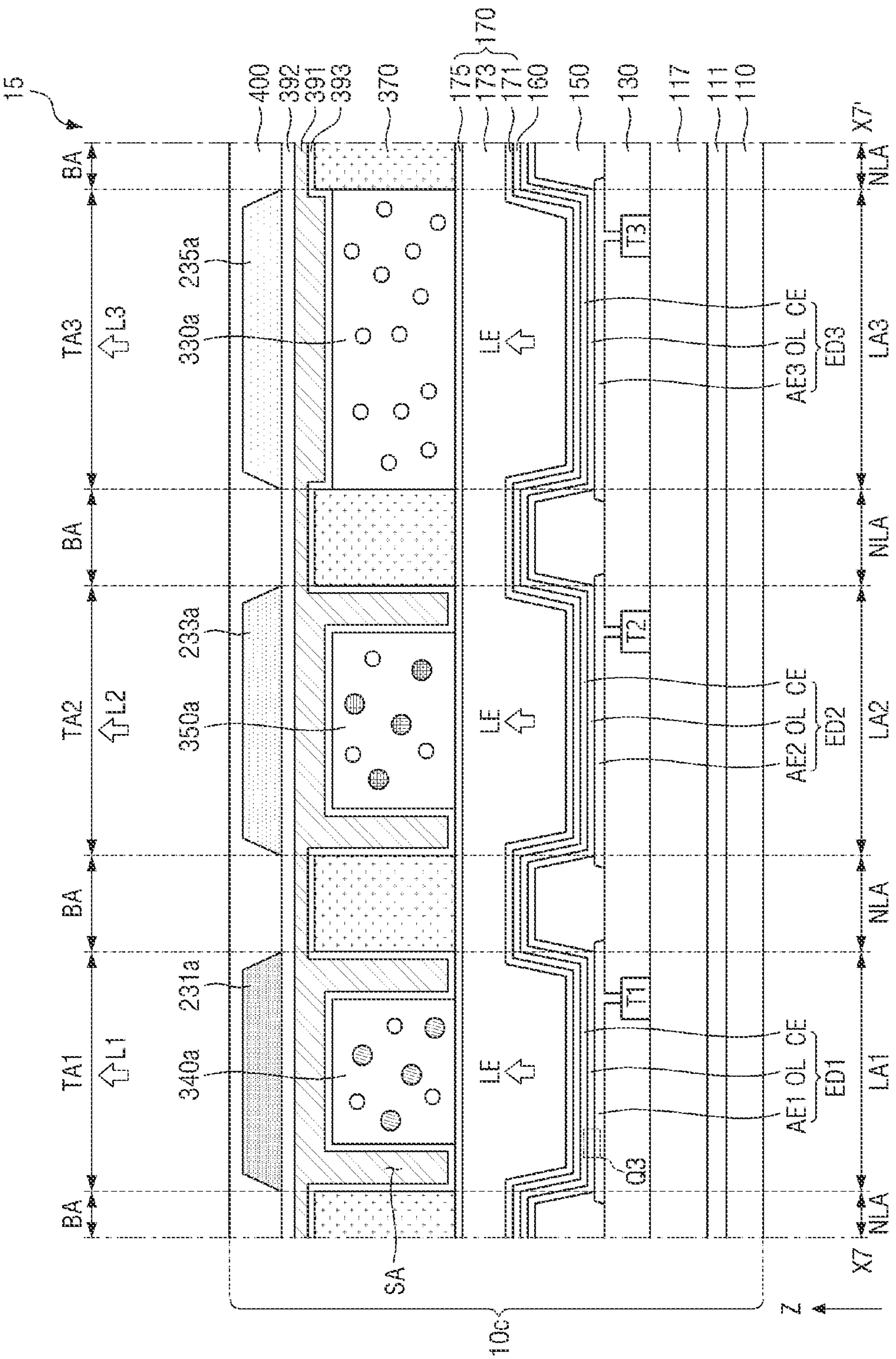
FIG. 24 is a schematic cross-sectional view of a display device according to an embodiment taken along line X7-X7' as another modified example of the display substrate of FIG. 22.

FIG. 24 is a schematic cross-sectional view of a display device according to an embodiment taken along line X7-X7' as another modified example of the display substrate of FIG. 22.

As shown in FIG. 24, the light transmission layer 330*a* of a display device 15 may not include the separation space SA.

For example, the light transmission layer 330*a* of the display device 15 may or may not include the separation space SA. As shown in FIG. 24, the width W5 of the light transmission layer 330*a* may be substantially equal to the widths of the third emission area LA3 and the third light emitting area TA3. For simplicity of the process, the light transmission layer 330*a* may be manufactured to have a shape of separated patterns. In another example, the light transmission layer 330*a* may be manufactured without separation.

Other detailed configurations are the same as those described above with reference to FIGS. 9 to 19, and thus, detailed descriptions thereof will be omitted for descriptive convenience.

In another example, the display device 15 may include the reflection layer 380 disposed on the side surface of the bank pattern layer 370 that is disposed to face the first wavelength conversion pattern layer 340*a*, the second wavelength conversion pattern layer 350*a*, and the light transmission layer 330*a*.

The reflection layer 380 may be disposed (e.g., directly disposed) on the side surface of the bank pattern layer 370 and the capping layer 393 may cover (e.g., directly cover) both the bank pattern layer 370 and the reflection layer 380. In another example, the bank pattern layer 370 and the capping layer 393 covering it may be disposed and the reflection layer 380 may be disposed (e.g., directly disposed) on the side surface of the capping layer 393 covering the bank pattern layer 370.

Other detailed configurations are the same as those described above with reference to FIGS. 9 to 23, and thus, detailed descriptions thereof will be omitted for descriptive convenience.

Figure 25:
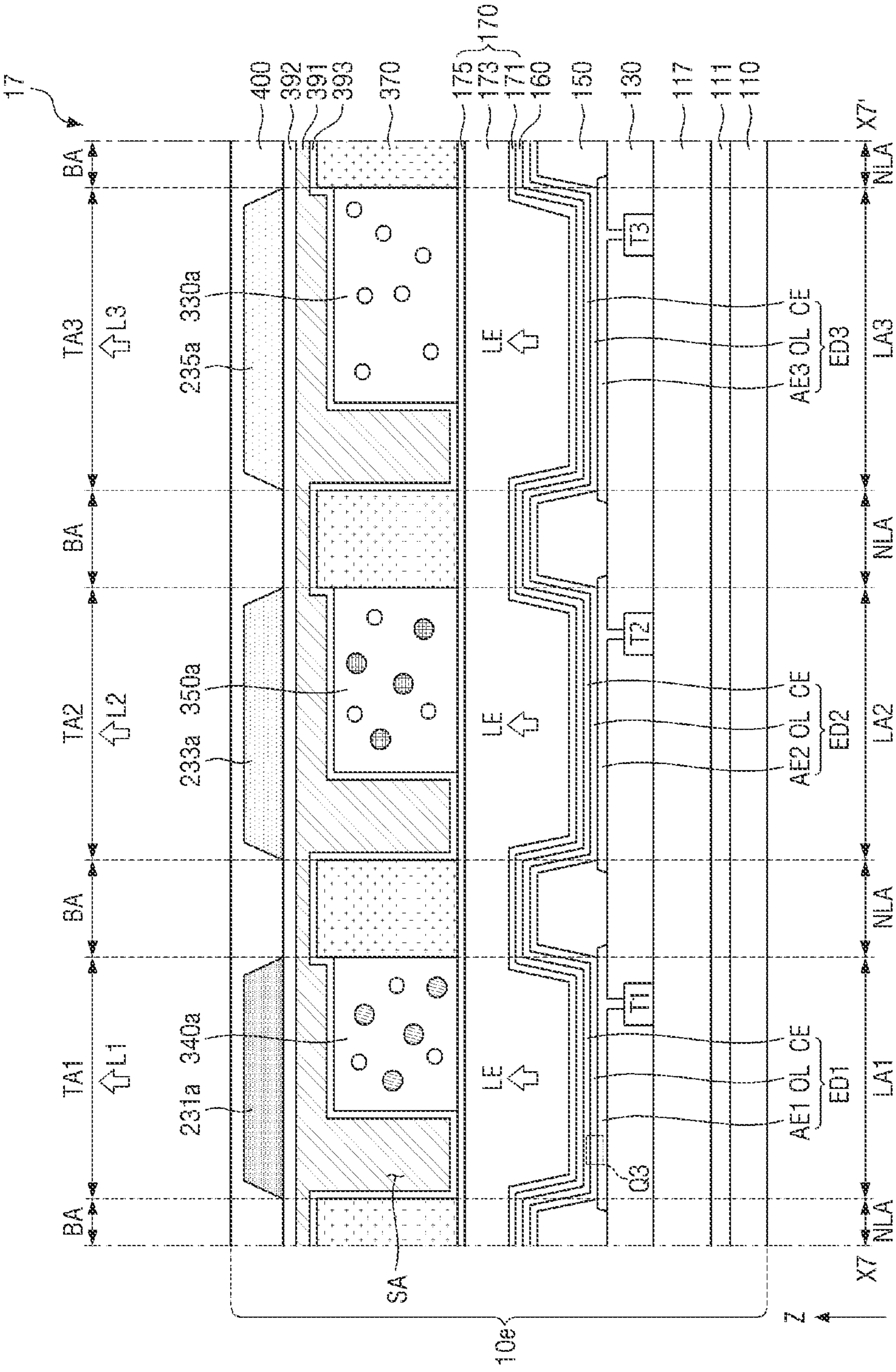
FIG. 25 is a schematic cross-sectional view of a display device according to an embodiment taken along line X7-X7' as yet another modified example of the display substrate of FIG. 22.

FIG. 25 is a schematic cross-sectional view of a display device 17 according to an embodiment taken along line X7-X7' as yet another modified example of the display substrate of FIG. 22.

As shown in FIG. 25, the display device 17 is different from the display device 13 of FIG. 23 in that the first wavelength conversion pattern layer 340*a*, the second wavelength conversion pattern layer 350*a*, and the light transmission layer 330*a* are arranged such that a side surfaces thereof may be in contact with (e.g., in direct contact with) the bank pattern layer 370, and another side surfaces thereof may be spaced apart from the bank pattern layer 370.

FIG. 25 shows a structure in which the contact is made at a side of the first direction, but embodiments are not limited thereto. For example, the first wavelength conversion pattern layer 340*a*, the second wavelength conversion pattern layer 350*a*, and the light transmission layer 330*a* may be arranged to be in contact with the bank pattern layer 370 at another side of the first direction and to be spaced apart from the bank pattern layer 370 at the side of the first direction.

As described with reference to FIG. 14, the emission light LE may pass through the wavelength conversion pattern layers 340*a* and 350*a* and the light transmission layer 330*a*, and may be emitted to the outside of the display device 17 through the color filters 231*a*, 233*a*, and 235*a*, or may pass through the filler 70 disposed in the separation space SA and may be emitted to the outside of the display device 17 through the color filters 231*a*, 233*a*, and 235*a*.

As described above, the emission light LE provided from the light emitting elements ED1, ED2, and ED3 may be white light.

In another example, the light transmission layer 330*a* of the display device 17, in which the first wavelength conversion pattern layer 340*a*, the second wavelength conversion pattern layer 350*a*, and the light transmission layer 330*a* are arranged such that a side surfaces thereof are in contact with (e.g., in direct contact with) the bank pattern layer 370 and another side surfaces thereof are spaced apart from the bank pattern layer 370, may not include the separation space SA as shown in FIG. 24. In another example, the width W5 of the light transmission layer 330*a* of FIG. 25 may be substantially equal to the widths of the third emission area LA3 and the third light emitting area TA3.

Other configurations are the same as those described above with reference to FIGS. 9 to 24, and thus, detailed descriptions thereof will be omitted for descriptive convenience.

In another example, the display device 17 may include the reflection layer 380 disposed on the side surface of the bank pattern layer 370 which is disposed to face the first wavelength conversion pattern layer 340*a*, the second wavelength conversion pattern layer 350*a*, and the light transmission layer 330*a*.

The reflection layer 380 may be disposed (e.g., directly disposed) on the side surface of the bank pattern layer 370 and the capping layer 393 may cover (e.g., directly cover) both the bank pattern layer 370 and the reflection layer 380. In another example, the bank pattern layer 370 and the capping layer 393 covering it may be disposed and the reflection layer 380 may be disposed (e.g., directly disposed) on the side surface of the capping layer 393 covering the bank pattern layer 370.

Other detailed configurations are the same as those described above with reference to FIGS. 9 to 25, and thus, detailed descriptions thereof will be omitted for descriptive convenience.

In another example, the light transmission layer 330*a* of the display device 17, which includes the reflection layer 380 on the side surface of the bank pattern layer 370 disposed to face the first wavelength conversion pattern layer 340*a*, the second wavelength conversion pattern layer 350*a*, and the light transmission layer 330*a*, may not include the separation space SA as shown in FIG. 24. For example, in another example, the width W5 of the light transmission layer 330*a* of FIG. 25 may be substantially equal to the widths of the third emission area LA3 and the third light emitting area TA3.

Other configurations are the same as those described above with reference to FIGS. 9 to 24, and thus, detailed descriptions thereof will be omitted for descriptive convenience.

FIGS. 26 to 29 show a display device according to an embodiment.

Figure 26:
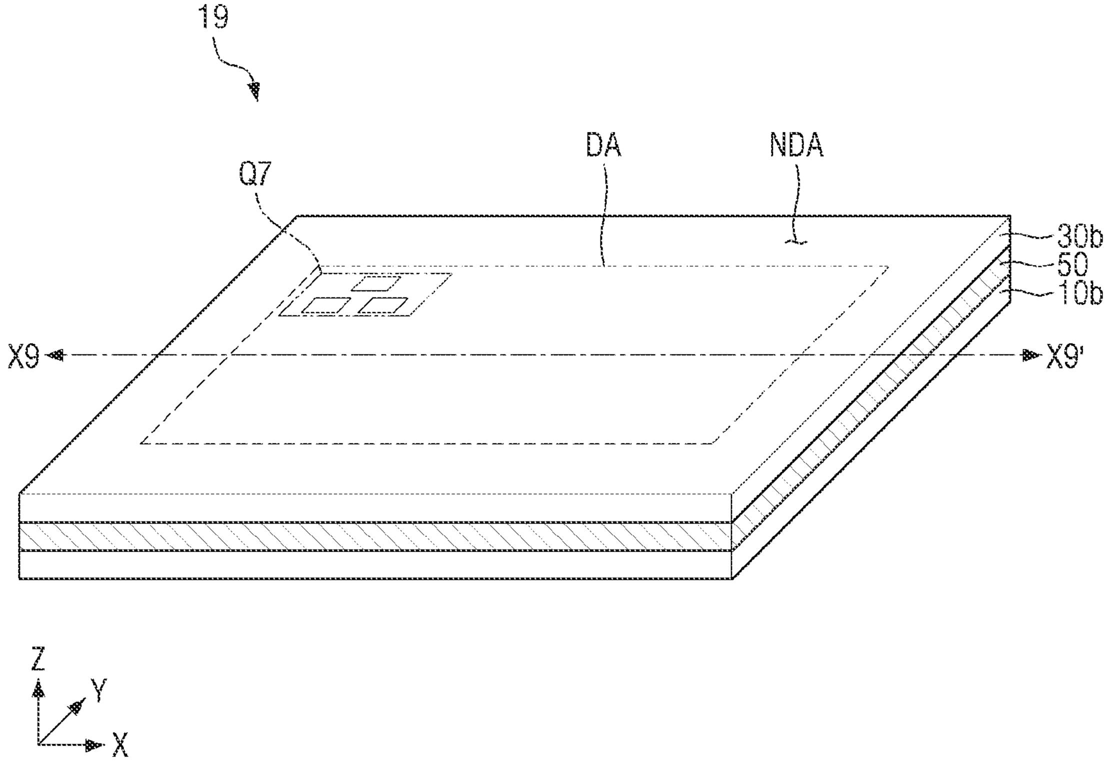
FIG. 26 is a schematic perspective view of a display device according to an embodiment.
Figure 27:
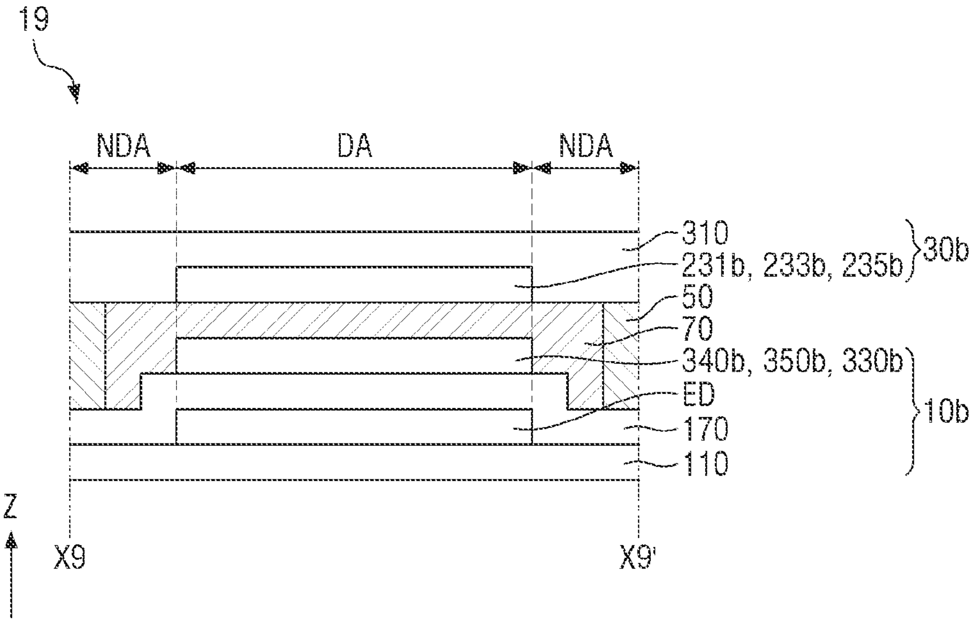
FIG. 27 is a schematic cross-sectional view of the display device taken along line X9-X9' of FIG. 26.

FIG. 26 is a schematic perspective view of a display device according to an embodiment, and FIG. 27 is a schematic cross-sectional view of the display device taken along line X9-X9' of FIG. 26.

Figure 28:
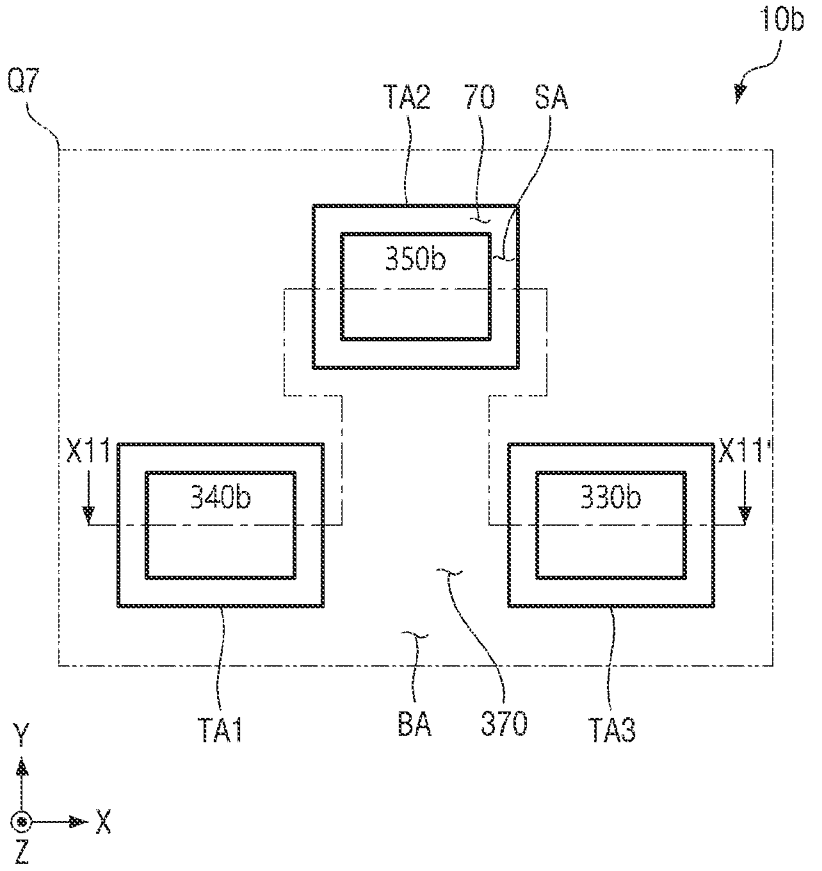
FIG. 28 is an enlarged schematic plan view of a part Q7 of FIG. 26, and is a schematic plan view of a display substrate included in the display device of FIG. 27.
Figure 29:
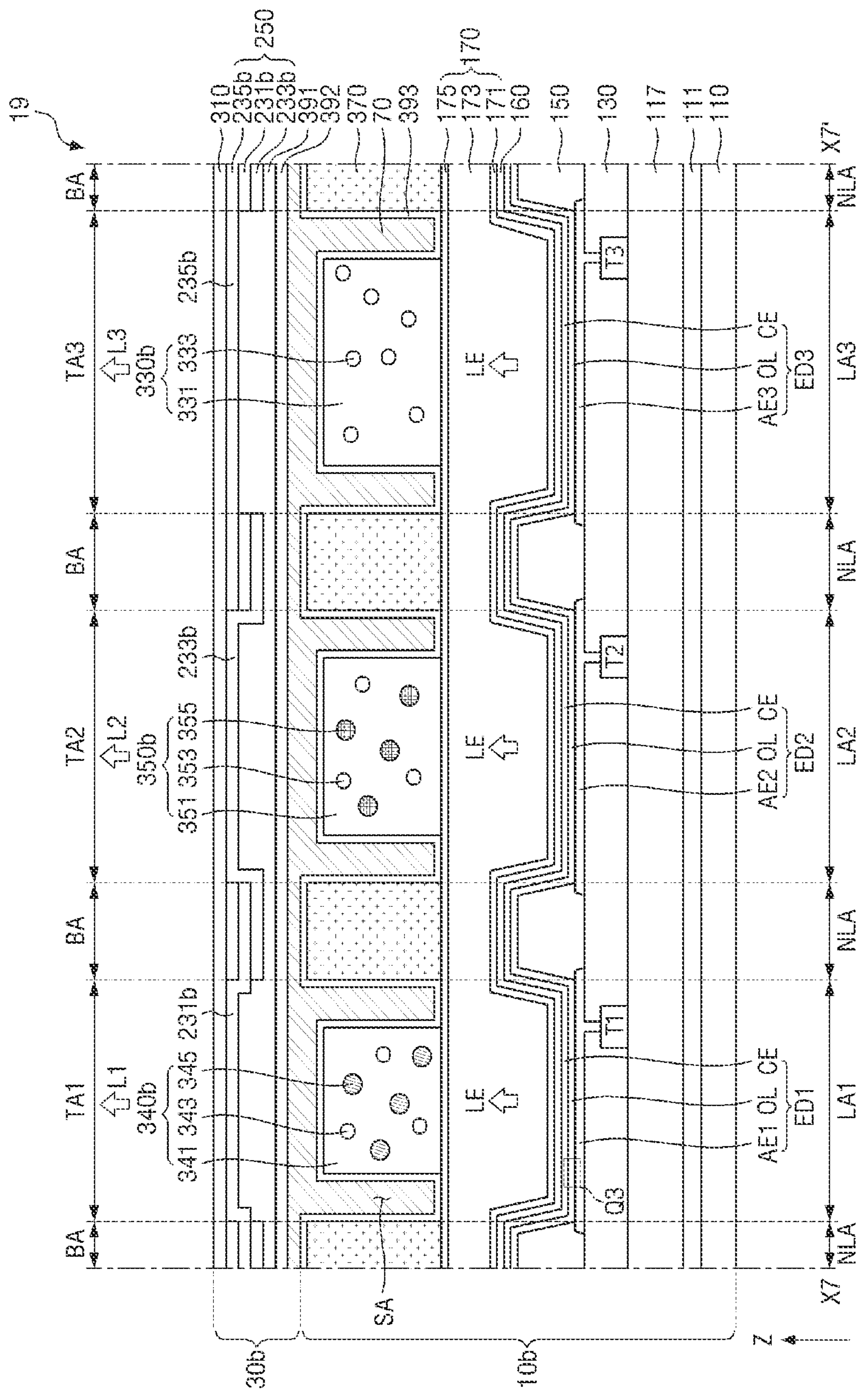
FIG. 29 is a schematic cross-sectional view of the display device taken along line X11-X11' of FIG. 28.

FIG. 28 is an enlarged schematic plan view of a part Q7 of FIG. 26, and is a schematic plan view of a display substrate included in the display device of FIG. 27. FIG. 29 is a schematic cross-sectional view of the display device taken along line X11-X11' of FIG. 28.

In another example, in FIG. 26, a display device 19 is similar to the display device 1 in that it includes a display substrate 10*b* and a color conversion substrate 30*b*, but is different from the display device 1 in that the display substrate 10*b* includes wavelength conversion pattern layers 340*b* and 350*b*, the light transmission layer 330*b*, and the bank pattern layer 370 on the thin film encapsulation layer 170, and the color conversion substrate 30*b* includes only color filters 231*b*, 233*b*, and 235*b*.

As shown in FIG. 27, the display device 19 may include, as a schematic stacked structure, the display substrate 10*b* and the color conversion substrate 30*b* facing the display substrate 10*b*, and may further include the sealing portion 50 for coupling the display substrate 10*b* and the color conversion substrate 30*b*, and the filler 70 filled between the display substrate 10*b* and the color conversion substrate 30*b*.

The display substrate 10*b* is similar to the display device 1 in that the light emitting element ED is disposed on the first base portion 110, and the thin film encapsulation layer 170 is disposed on the light emitting element ED to cover the light emitting element ED, but is different from the display device 1 in that the bank pattern layer 370, the first wavelength conversion pattern layer 340*b*, the second wavelength conversion pattern layer 350*b*, and the light transmission layer 330*b* are disposed (e.g., directly disposed) on the thin film encapsulation layer 170.

The color conversion substrate 30*b* may be positioned on the display substrate 10*b* to face the display substrate 10*b*. In some embodiments, the color conversion substrate 30*b* may include a color filter that converts the color of incident light. In the case of the display device 1, the color conversion substrate 30 may include at least one of a color filter or a wavelength conversion pattern layer as the color conversion pattern layer, but in the case of the display device 19, the color conversion substrate 30*b* may include only a color filter.

For example, the color conversion substrate 30*b* of the display device 19 may include the color filter similarly to the display device 1, but it may not include the bank pattern layer 370, the first wavelength conversion pattern layer 340, the second wavelength conversion pattern layer 350, and the light transmission layer 330 unlike the display device 1.

FIG. 28 is an enlarged schematic plan view of the part Q7 of FIG. 26, and is a schematic plan view of the display substrate 10*b* included in the display device 19 of FIG. 27.

As shown in FIG. 28, the emission areas LA1, LA2, and LA3 and the non-emission area NLA may be defined in the display substrate 10*b*. The display substrate 10*b* may include the first wavelength conversion pattern layer 340*b*, the second wavelength conversion pattern layer 350*b*, and the light transmission layer 330*b* disposed in the emission areas LA1, LA2, and LA3 and may overlap the emission areas LA1, LA2, and LA3. In some embodiments, referring to FIGS. 28 and 29, the light transmitting areas TA1, TA2, and TA3 of the color conversion substrate 30*b* may be disposed to overlap the emission areas LA1, LA2, and LA3.

Referring to FIG. 28, the display substrate 10*b* may include the first wavelength conversion pattern layer 340*b*, the second wavelength conversion pattern layer 350*b*, and the light transmission layer 330*b* having a rectangular shape, the first emission area LA1, the second emission area LA2, and the third emission area LA3 having a rectangular shape and surrounding them, and the light blocking area BA disposed in an area other than the emission areas. In some embodiments, the light blocking area BA may be formed of the bank pattern layer 370.

As shown in FIGS. 28 and 29, the widths of the first wavelength conversion pattern layer 340*b*, the second wavelength conversion pattern layer 350*b*, and the light transmission layer 330*b* in the first direction may be smaller than the widths of the emission areas LA1, LA2, and LA3.

In some embodiments, the separation space SA may be defined between the light blocking area BA and the first wavelength conversion pattern layer 340*b*, the second wavelength conversion pattern layer 350*b*, and the light transmission layer 330*b* with overlapping the emission areas. For example, the first wavelength conversion pattern layer 340*b*, the second wavelength conversion pattern layer 350*b*, and the light transmission layer 330*b* may be arranged to be spaced apart from the light blocking area BA, the space therebetween may be defined as "separation space SA," and the filler 70 may fill the separation space SA.

FIG. 29 is a schematic cross-sectional view of the display device 19 taken along line X11-X11' of FIG. 28.

As shown in FIG. 29, in the display device 19, the bank pattern layer 370, the first wavelength conversion pattern layer 340*b*, the second wavelength conversion pattern layer 350*b*, and the light transmission layer 330*b* may be disposed (e.g., directly disposed) on the thin film encapsulation layer 170.

Since structures below the thin film encapsulation layer 170 have been described in the display device 1, differences will be described below.

The bank pattern layers 370 may be disposed to overlap the non-emission area NLA and may be spaced apart from sides (e.g., opposite sides) of the wavelength conversion pattern layers 340*b* and 350*b* and the light transmission layer 330*b* in the first direction. The wavelength conversion pattern layers 340*b* and 350*b* and the light transmission layer 330*b* may overlap the emission area and may be positioned between the bank pattern layers 370 and may be spaced apart therefrom. The separation space SA may be defined between the bank pattern layer 370 and each of the wavelength conversion pattern layers 340*b* and 350*b* and the light transmission layer 330*b*.

In some embodiments, the wavelength conversion pattern layers 340*b* and 350*b* and the light transmission layer 330*b* may be manufactured by a photolithography process. In case that the wavelength conversion pattern layers 340 and 350 and the light transmission layer 330 are manufactured by a photolithography process, the arrangement shape thereof spaced apart from the bank pattern layer 370 may be readily manufactured. FIG. 26 illustrates the shapes of the wavelength conversion pattern layers 340 and 350 and the light transmission layer 330 as rectangles, but embodiments are not limited thereto. For example, it may include all shapes that are manufactured by a photolithography process, such as a trapezoid, a rounded rectangle, and a semicircle.

The capping layer 393 may be disposed on the bank pattern layer 370, the wavelength conversion pattern layers 340*b* and 350*b*, and the light transmission layer 330*b* to cover them.

In some embodiments, the capping layer 393 may cover the outer surface of the bank pattern layer 370 in the non-emission area NLA, and may cover the side surface of the bank pattern layer 370 and the outer surfaces of the first wavelength conversion pattern layer 340*b*, the second wavelength conversion pattern layer 350*b*, and the light transmission layer 330*b* in the emission area LA.

Hereinafter, the color conversion substrate 30*b* will be described.

As shown in FIG. 29, the light transmitting areas TA1, TA2, and TA3 and the light blocking area BA may be defined in the second base portion 310, and the color filters 231*b*, 233*b*, and 235*b* may be disposed on a surface of the second base portion 310 facing the display substrate 10*b*.

In some embodiments, the first color filter 231*b* may be disposed to overlap the first emission area LA1 or the first light transmitting area TA1, the second color filter 233*b* may be disposed to overlap the second emission area LA2 or the second light transmitting area TA2, and the third color filter 235*b* may be disposed to overlap the third emission area LA3 or the third light transmitting area TA3.

A low refractive layer 391 may be disposed to cover the light blocking pattern layer 250, the first color filter 231*b*, the second color filter 233*b*, and the third color filter 235*b* on a surface of the second base portion 310. In some embodiments, the low refractive layer 391 may be in contact with (e.g., in direct contact with) the first color filter 231*b*, the second color filter 233*b* and the third color filter 235*b*. Further, in some embodiments, the low refractive layer 391 may also be in contact with (e.g., in direct contact with) the light blocking pattern layer 250.

The low refractive capping layer 392 may be further disposed on a surface of the low refractive layer 391.

As shown in FIG. 9, in the case of the display device 1, the low refractive capping layer 392 may be in contact with (e.g., in direct contact with) the wavelength conversion pattern layers 340 and 350 and the light transmission layer 330, and the low refractive capping layer 392 may not be in direct contact with the bank pattern layer 370. However, as shown in FIG. 29, in the case of the display device 19, the low refractive capping layer 392 may not be in direct contact with the wavelength conversion pattern layers 340*b* and 350*b* and the light transmission layer 330*b*, and may not also be in direct contact with the bank pattern layer 370.

In some embodiments, the filler 70 may be disposed on a surface of the capping layer 393 covering the bank pattern layer 370, the wavelength conversion pattern layers 340*b* and 350*b*, and the light transmission layer 330*b* and facing the color conversion substrate 30*b* and a surface of the low refractive capping layer 392 facing the display substrate 10*b*. Further, the filler 70 may also be filled in the separation space SA between the side of the bank pattern layer 370 and the sides of the wavelength conversion pattern layer and the light transmission layer.

In some embodiments, a surface of the capping layer 393 in the separation space SA may be in contact with (e.g., in direct contact with) the thin film encapsulation layer 170, and another surface thereof opposite to the surface in contact with (e.g., in direct contact with) the thin film encapsulation layer 170 may be in contact with (e.g., in direct contact with) the filler 70.

In some embodiments, another surface of the low refractive capping layer 392 opposite to the surface thereof in contact with (e.g., in direct contact with) the low refractive layer 391 may be in contact with (e.g., in direct contact with) the filler 70.

In another example, the light transmission layer 330*b* of the display device 19 may or may not include the separation space SA as shown in FIG. 24. In another example, the width W5 of the light transmission layer 330*b* of FIG. 29 may be substantially equal to the widths of the third emission area LA3 and the third light emitting area TA3.

Other configurations are the same as those described above with reference to FIGS. 9 to 24, and thus, detailed descriptions thereof will be omitted for descriptive convenience.

In another example, the display device 19 may include the reflection layer 380 disposed on the side surface of the bank pattern layer 370 which is disposed to face the first wavelength conversion pattern layer 340*b*, the second wavelength conversion pattern layer 350*b*, and the light transmission layer 330*b*.

Other configurations are the same as those described above with reference to FIGS. 9 to 24, and thus, detailed descriptions thereof will be omitted for descriptive convenience.

In another example, the light transmission layer 330*b* of the display device 19, which includes the reflection layer 380 on the side surface of the bank pattern layer 370 disposed to face the first wavelength conversion pattern layer 340*b*, the second wavelength conversion pattern layer 350*b*, and the light transmission layer 330*b*, may or may not include the separation space SA as shown in FIG. 24. In another example, the width W5 of the light transmission layer 330*b* of FIG. 29 may be substantially equal to the widths of the third emission area LA3 and the third light emitting area TA3.

Other configurations are the same as those described above with reference to FIGS. 9 to 24, and thus, detailed descriptions thereof will be omitted for descriptive convenience.

In another example, the first wavelength conversion pattern layer 340*b*, the second wavelength conversion pattern layer 350*b*, and the light transmission layer 330*b* of the display device 19 may be arranged such that a side surfaces thereof may be in contact with (e.g., in direct contact with) the bank pattern layer 370, and another side surfaces thereof may be spaced apart from the bank pattern layer 370.

Other configurations are the same as those described above with reference to FIGS. 9 to 24, and thus, detailed descriptions thereof will be omitted for descriptive convenience.

In another example, the light transmission layer 330*b* of the display device 19, in which the first wavelength conversion pattern layer 340*b*, the second wavelength conversion pattern layer 350*b*, and the light transmission layer 330*b* are arranged such that a side surfaces thereof are in contact with (e.g., in direct contact with) the bank pattern layer 370 and another side surfaces thereof are spaced apart from the bank pattern layer 370, may or may not include the separation space SA as shown in FIG. 24. In another example, the width W5 of the light transmission layer 330*b* of FIG. 29 may be substantially equal to the widths of the third emission area LA3 and the third light emitting area TA3.

Other configurations are the same as those described above with reference to FIGS. 9 to 24, and thus, detailed descriptions thereof will be omitted for descriptive convenience.

In another example, the display device 19, in which the first wavelength conversion pattern layer 340*b*, the second wavelength conversion pattern layer 350*b*, and the light transmission layer 330*b* are arranged such that a side surfaces thereof may be in contact with (e.g., in direct contact with) the bank pattern layer 370 and another side surfaces thereof may be spaced apart from the bank pattern layer 370, may include the reflection layer 380 on the side surface of the bank pattern layer 370 disposed to face the first wavelength conversion pattern layer 340*b*, the second wavelength conversion pattern layer 350*b*, and the light transmission layer 330*b*.

Other configurations are the same as those described above with reference to FIGS. 9 to 24, and thus, detailed descriptions thereof will be omitted for descriptive convenience.

In another example, the light transmission layer 330*b* of the display device 19, in which the first wavelength conversion pattern layer 340*b*, the second wavelength conversion pattern layer 350*b*, and the light transmission layer 330*b* are arranged such that a side surfaces thereof are in contact with (e.g., in direct contact with) the bank pattern layer 370 and another side surfaces thereof are spaced apart from the bank pattern layer 370, and which includes the reflection layer 380 on the side surface of the bank pattern layer 370 disposed to face the first wavelength conversion pattern layer 340*b*, the second wavelength conversion pattern layer 350*b*, and the light transmission layer 330*b*, may not include the separation space SA as shown in FIG. 24. For example, in another example, the width W5 of the light transmission layer 330*b* of FIG. 29 may be substantially equal to the widths of the third emission area LA3 and the third light emitting area TA3.

Other configurations are the same as those described above with reference to FIGS. 9 to 24, and thus, detailed descriptions thereof will be omitted for descriptive convenience.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A display device comprising:

a first base portion including a first emission area and a non-emission area;

a first light emitting element disposed on the first base portion and overlapping the first emission area;

a thin film encapsulation layer disposed on the first light emitting element;

a filler disposed on the thin film encapsulation layer;

a second base portion disposed on the filler;

a first color filter disposed on a surface of the second base portion facing the first base portion and overlapping the first emission area;

a bank pattern layer disposed on the first color filter and overlapping the non-emission area; and a first wavelength conversion pattern layer disposed on the first color filter and overlapping the first emission area, wherein the bank pattern layer comprises a first portion and a second portion facing each other along a first direction, the first wavelength conversion pattern layer is disposed between the first portion and the second portion of the bank pattern layer, a side surface of the first wavelength conversion pattern layer and a side surface of the bank pattern layer are spaced apart from each other along the first direction with a separation space between the first wavelength conversion pattern layer and the bank pattern layer, and the filler is disposed in the separation space.

2. The display device of claim 1, wherein a height of the bank pattern layer measured with respect to the surface of the second base portion is greater than a height of the first wavelength conversion pattern layer measured with respect to the surface of the second base portion, a first width of the first wavelength conversion pattern layer measured along the first direction is smaller than a width of the first emission area measured along the first direction, and the first width of the first wavelength conversion pattern layer is smaller than a width of the first color filter measured along the first direction.

3. The display device of claim 1, further comprising:

a capping layer covering the first wavelength conversion pattern layer and the bank pattern layer, wherein the filler is disposed between the capping layer covering the side surface of the first wavelength conversion pattern layer and the capping layer covering the side surface of the bank pattern layer.

4. The display device of claim 3, wherein the second base portion comprises:

a low refractive layer disposed on the first color filter, and a low refractive capping layer disposed on the low refractive layer.

5. The display device of claim 4, wherein the first wavelength conversion pattern layer and the bank pattern layer are disposed directly on the low refractive capping layer, and the low refractive capping layer and the capping layer are in direct contact with each other in the separation space.

6. The display device of claim 1, wherein the separation space is disposed between the first portion of the bank pattern layer and the first wavelength conversion pattern layer and between the second portion of the bank pattern layer and the first wavelength conversion pattern layer.

7. The display device of claim 1, wherein the separation space between the first wavelength conversion pattern layer and the bank pattern layer overlaps the first emission area.

8. The display device of claim 1, wherein the first light emitting element comprises:

a red light emitting layer, a green light emitting layer overlapping the red light emitting layer, and a blue light emitting layer overlapping the red light emitting layer and the green light emitting layer, and the first wavelength conversion pattern layer comprises quantum dots.

9. The display device of claim 1, wherein the first base portion further comprises a second emission area and a third emission area, the display device further comprising:

a second light emitting element disposed on the first base portion and overlapping the second emission area and a third light emitting element overlapping the third emission area;

a second color filter disposed on the surface of the second base portion and overlapping the second emission area and a third color filter overlapping the third emission area;

a bank pattern layer disposed on the second color filter and the third color filter and overlapping the non-emission area;

a second wavelength conversion pattern layer disposed on the second color filter and overlapping the second emission area; and a light transmission layer disposed on the third color filter and overlapping the third emission area, the bank pattern layer comprises a third portion facing the second portion along the first direction and a fourth portion facing the third portion along the first direction, the second wavelength conversion pattern layer is disposed between the second portion and the third portion of the bank pattern layer, the light transmission layer is disposed between the third portion and the fourth portion of the bank pattern layer, and the filler is further disposed in a space between the second wavelength conversion pattern layer and the bank pattern layer.

10. The display device of claim 9, wherein a height of the bank pattern layer measured with respect to the surface of the second base portion is greater than heights of the second wavelength conversion pattern layer and the light transmission layer measured with respect to the surface of the second base portion, a second width of the second wavelength conversion pattern layer measured along the first direction is smaller than a width of the second emission area measured along the first direction, the second width of the second wavelength conversion pattern layer is smaller than a width of the second color filter measured along the first direction, and a third width of the light transmission layer measured along the first direction is substantially equal to or smaller than a width of the third emission area measured along the first direction.

11. The display device of claim 1, wherein the separation space between the bank pattern layer and the first wavelength conversion pattern layer entirely surrounds the first wavelength conversion pattern layer in plan view.

12. The display device of claim 1, wherein the first wavelength conversion pattern layer is spaced apart from one of the first portion of the bank pattern layer and the second portion of the bank pattern layer, and is in contact with another one of the first portion of the bank pattern layer and the second portion of the bank pattern layer.

13. The display device of claim 1, wherein an air layer in which the filler is not disposed is further disposed in the separation space.

14. The display device of claim 13, wherein a height of the bank pattern layer measured with respect to a surface of the thin film encapsulation layer is greater than a height of the first wavelength conversion pattern layer measured with respect to the surface of the thin film encapsulation layer, and a first width of the first wavelength conversion pattern layer measured along the first direction is smaller than a width of the first emission area measured along the first direction and a width of the first color filter measured along the first direction.

15. The display device of claim 1, further comprising:

a reflection layer disposed on the side surface of the bank pattern layer, wherein a part of the filler disposed in the separation space is disposed between the side surface of the first wavelength conversion pattern layer and the reflection layer.

16. A display device comprising:

a first base portion including a first emission area and a non-emission area;

a first light emitting element disposed on the first base portion and overlapping the first emission area;

a thin film encapsulation layer disposed on the first light emitting element;

a bank pattern layer disposed on the thin film encapsulation layer and overlapping the non-emission area;

a first wavelength conversion pattern layer disposed on the thin film encapsulation layer and overlapping the first emission area, a capping layer covering the first wavelength conversion pattern layer and the bank pattern layer;

a low refractive layer disposed on the capping layer; and a first color filter disposed on the low refractive layer and overlapping the first emission area, wherein the bank pattern layer comprises a first portion and a second portion facing each other along a first direction, the first wavelength conversion pattern layer is disposed between the first portion of the bank pattern layer and the second portion of the bank pattern layer, a side surface of the first wavelength conversion pattern layer and a side surface of the bank pattern layer are spaced apart from each other along the first direction with a separation space between the first wavelength conversion pattern layer and the bank pattern layer, and the low refractive layer is disposed in the separation space, wherein the low refractive index layer covers the side surface of the first wavelength conversion pattern layer and an upper surface of the first wavelength conversion pattern layer facing the first color filter.

17. The display device of claim 16, wherein the separation space overlaps the first emission area, and in the separation space, the capping layer is in direct contact with the thin film encapsulation layer and the low refractive layer.

18. A display device comprising:

a first base portion including a first emission area and a non-emission area;

a first light emitting element disposed on the first base portion and overlapping the first emission area;

a thin film encapsulation layer disposed on the first light emitting element;

a bank pattern layer disposed on the thin film encapsulation layer and overlapping the non-emission area;

a first wavelength conversion pattern layer disposed on the thin film encapsulation layer and overlapping the first emission area;

a second base portion disposed on the first wavelength conversion pattern layer;

a first color filter disposed on a surface of the second base portion facing the first base portion and overlapping the first emission area; and a filler disposed between the first color filter and the first wavelength conversion pattern layer, wherein the bank pattern layer and the first wavelength conversion pattern layer are spaced apart from each other with a separation space between the bank pattern layer and the first wavelength conversion pattern layer, and the filler is disposed in the separation space.

19. The display device of claim 18, further comprising:

a capping layer covering the first wavelength conversion pattern layer and the bank pattern layer, wherein the capping layer is in contact with the filler and the thin film encapsulation layer in the separation space.

20. The display device of claim 19, further comprising:

a low refractive layer disposed on the first color filter; and a low refractive capping layer disposed on the low refractive layer, wherein the filler is in contact with the low refractive capping layer and the capping layer.

* * * * *